(12) United States Patent
Yasunaga et al.

(10) Patent No.: US 9,613,883 B2
(45) Date of Patent: Apr. 4, 2017

(54) SEMICONDUCTOR DEVICE

(71) Applicant: ROHM CO., LTD., Kyoto-shi, Kyoto (JP)

(72) Inventors: Shoji Yasunaga, Kyoto (JE); Mamoru Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/722,745

(22) Filed: May 27, 2015

(65) Prior Publication Data

US 2015/0255369 A1 Sep. 10, 2015

Related U.S. Application Data

(63) Continuation of application No. 14/355,002, filed as application No. PCT/JP2012/076685 on Oct. 16, 2012, now Pat. No. 9,070,659.

(30) Foreign Application Priority Data

Oct. 31, 2011 (JP) ................... 2011-238575
Oct. 31, 2011 (JP) ................... 2011-238576
(Continued)

(51) Int. Cl.
*H01L 23/00* (2006.01)
*H01L 23/373* (2006.01)
(Continued)

(52) U.S. Cl.
CPC ...... *H01L 23/3736* (2013.01); *H01L 23/3107* (2013.01); *H01L 23/4334* (2013.01);
(Continued)

(58) Field of Classification Search
CPC ............. H01L 23/495; H01L 23/49503; H01L 23/49541; H01L 23/49575;
(Continued)

(56) References Cited

U.S. PATENT DOCUMENTS 7,671,382 B2 3/2010 Sudo et al.
8,659,147 B2 2/2014 Mitsui et al.
(Continued)

FOREIGN PATENT DOCUMENTS

JP 59-10242 1/1984
JP 10-209341 A 8/1998
(Continued)

OTHER PUBLICATIONS

Office Action issued in corresponding Japanese Patent Application, Jun. 28, 2016, and corresponding English translation.

*Primary Examiner* — Armando Rodriguez
(74) *Attorney, Agent, or Firm* — Hamre, Schumann, Mueller & Larson, P.C.

(57) ABSTRACT

[Object] A semiconductor device is configured to release heat from semiconductor chips more efficiently. [Means for Solution]A semiconductor device includes: a die pad 11 which has a die pad main surface 111 and a die pad rear surface 112; a semiconductor chip 41 mounted on the die pad main surface 111; a sealing resin portion 7 formed with a recess 75 for exposure of the die pad rear surface 11 and covering the die pad 11 and the semiconductor chip 41; and a heat releasing layer 6 disposed in the recess 75. The recess 75 has a recess groove 753 outside the die pad 11 in a direction in which the die pad rear surface 112 extends, and the recess groove 753 is closer to the die pad main surface 111 than to the die pad rear surface 112. The heat releasing layer 6 has a junction layer which is in contact with the die pad rear surface 112 and having part thereof filling the recess groove 753.

7 Claims, 60 Drawing Sheets

(30) Foreign Application Priority Data

| Oct. 31, 2011 | (JP) | ................................ | 2011-238577 |
| Oct. 31, 2011 | (JP) | ................................ | 2011-238578 |
| Oct. 31, 2011 | (JP) | ................................ | 2011-238579 |
| Oct. 10, 2012 | (JP) | ................................ | 2012-224920 |

(51) Int. Cl.
*H01L 23/31* (2006.01)
*H01L 23/433* (2006.01)
*H01L 23/495* (2006.01)
*H01L 21/56* (2006.01)
*H01L 23/367* (2006.01)

(52) U.S. Cl.
CPC .. *H01L 23/49503* (2013.01); *H01L 23/49513* (2013.01); *H01L 23/49541* (2013.01); *H01L 23/49551* (2013.01); *H01L 23/49568* (2013.01); *H01L 23/49575* (2013.01); *H01L 23/49582* (2013.01); *H01L 24/06* (2013.01); *H01L 24/14* (2013.01); *H01L 24/49* (2013.01); *H01L 24/81* (2013.01); *H01L 21/561* (2013.01); *H01L 23/367* (2013.01); *H01L 24/45* (2013.01); *H01L 2224/0401* (2013.01); *H01L 2224/0603* (2013.01); *H01L 2224/0612* (2013.01); *H01L 2224/06051* (2013.01); *H01L 2224/06505* (2013.01); *H01L 2224/145* (2013.01); *H01L 2224/1451* (2013.01); *H01L 2224/14104* (2013.01); *H01L 2224/45124* (2013.01); *H01L 2224/45144* (2013.01); *H01L 2224/48091* (2013.01); *H01L 2224/48137* (2013.01); *H01L 2224/48247* (2013.01); *H01L 2224/495* (2013.01); *H01L 2224/4912* (2013.01); *H01L 2224/73265* (2013.01); *H01L 2224/78313* (2013.01); *H01L 2224/85181* (2013.01); *H01L 2924/01013* (2013.01); *H01L 2924/01026* (2013.01); *H01L 2924/01028* (2013.01); *H01L 2924/01029* (2013.01); *H01L 2924/0132* (2013.01); *H01L 2924/01047* (2013.01); *H01L 2924/01079* (2013.01); *H01L 2924/12042* (2013.01); *H01L 2924/1304* (2013.01); *H01L 2924/13055* (2013.01); *H01L 2924/181* (2013.01); *H01L 2924/351* (2013.01)

(58) Field of Classification Search
CPC ........... H01L 23/49582; H01L 24/0614; H01L 24/45; H01L 24/49; H01L 24/81
See application file for complete search history.

(56) References Cited

U.S. PATENT DOCUMENTS

| 8,921,999 | B2 | 12/2014 | Kimura | |
| 2001/0052639 | A1 | 12/2001 | Jeon et al. | |
| 2005/0218489 | A1* | 10/2005 | Satou | H01L 23/49575 257/678 |
| 2009/0079051 | A1* | 3/2009 | Amano | H01L 23/49503 257/676 |
| 2013/0082284 | A1* | 4/2013 | Okumura | H02M 7/003 257/77 |
| 2014/0080260 | A1* | 3/2014 | Higashino | H01L 23/49838 438/118 |

FOREIGN PATENT DOCUMENTS

| JP | 2001-156253 A | 6/2001 |
| JP | 2004-165281 A | 6/2004 |
| JP | 2005-150595 | 6/2005 |
| JP | 2005-310987 A | 11/2005 |
| JP | 2007-173272 | 7/2007 |
| JP | 2008-28011 | 2/2008 |
| JP | 2009-105389 | 5/2009 |
| WO | WO 2009/150995 | 12/2009 |

* cited by examiner

FIG.1
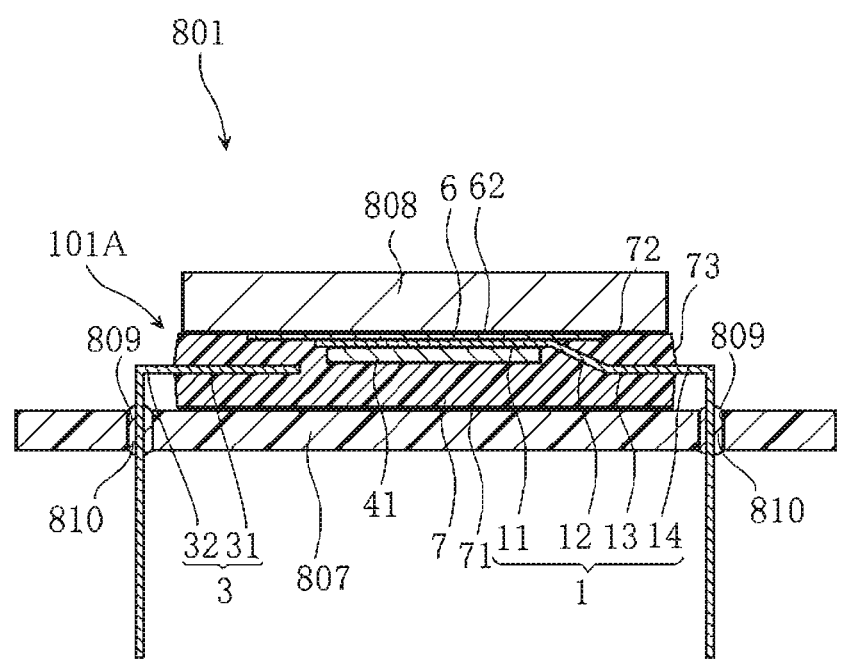
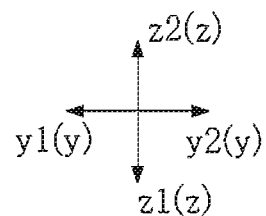

FIG.5
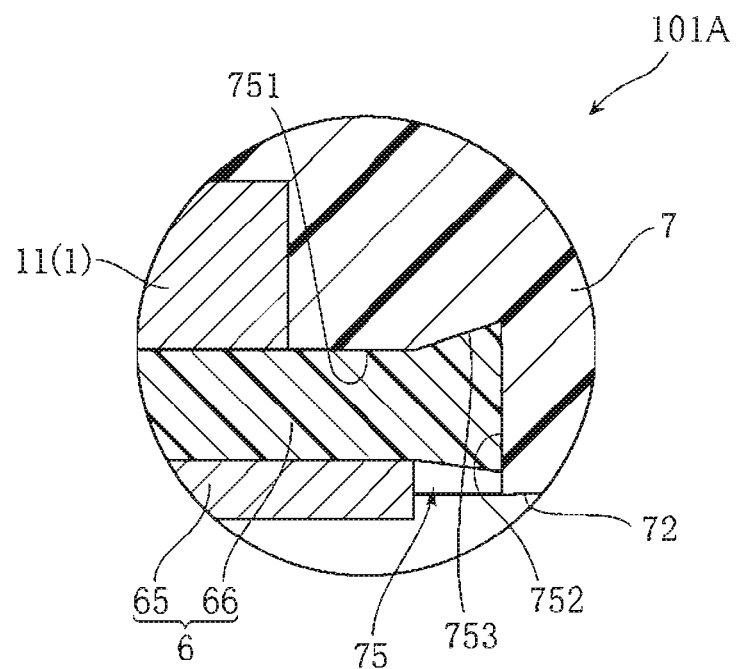
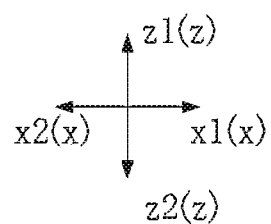

FIG.10
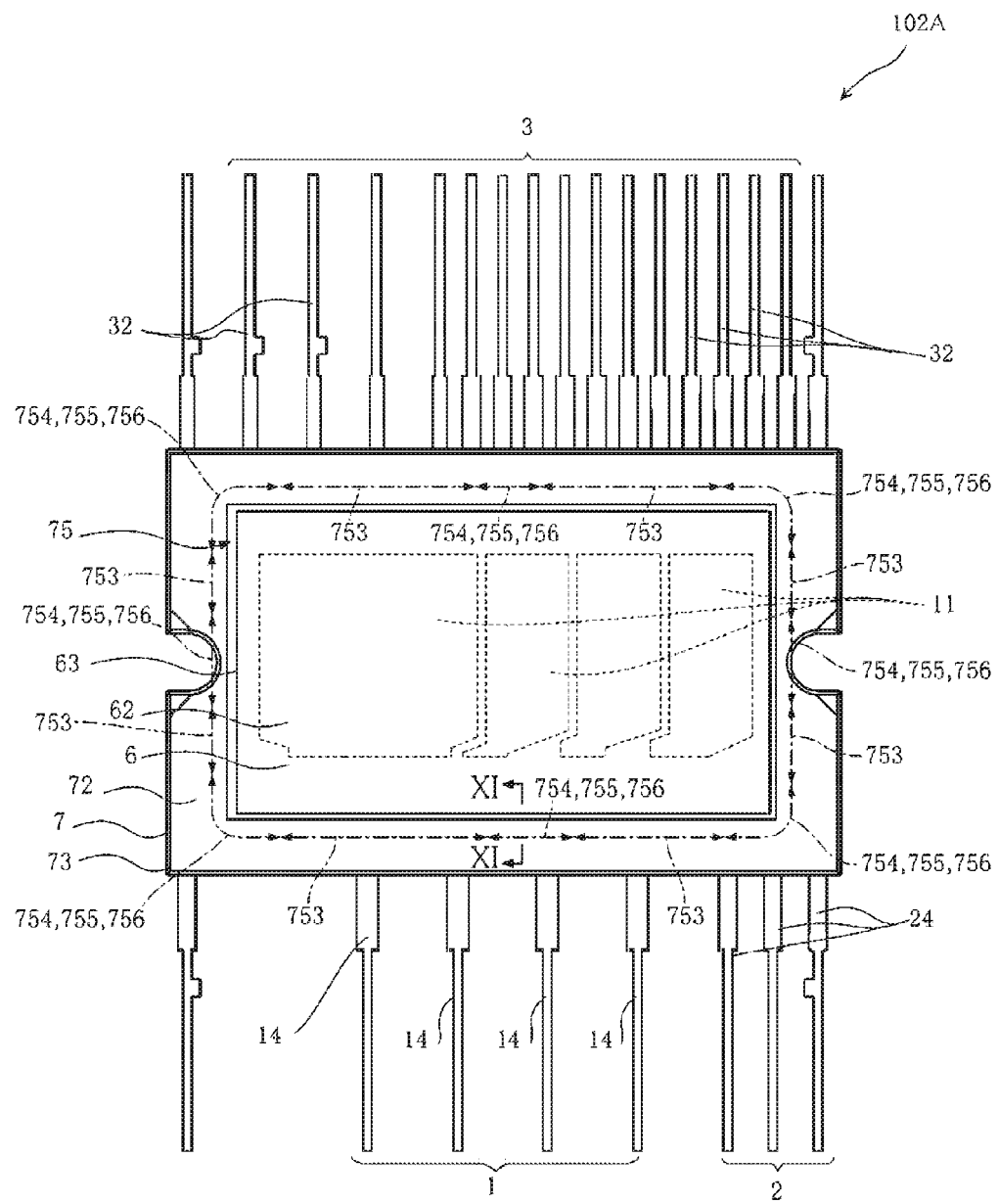
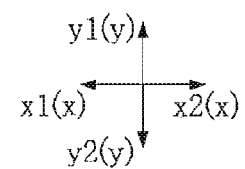

FIG.12
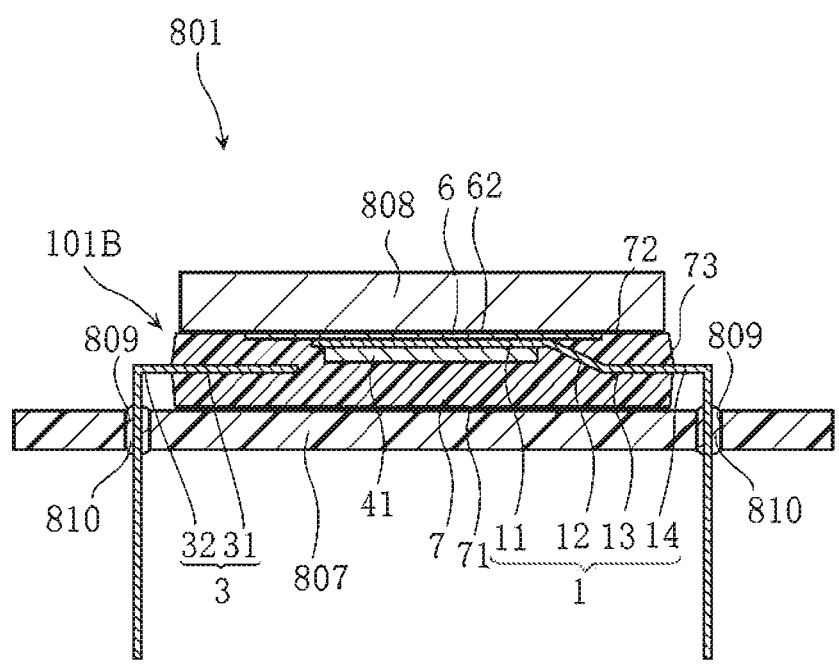
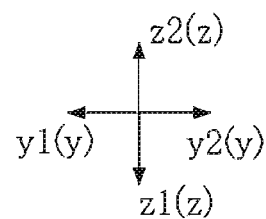

FIG.22
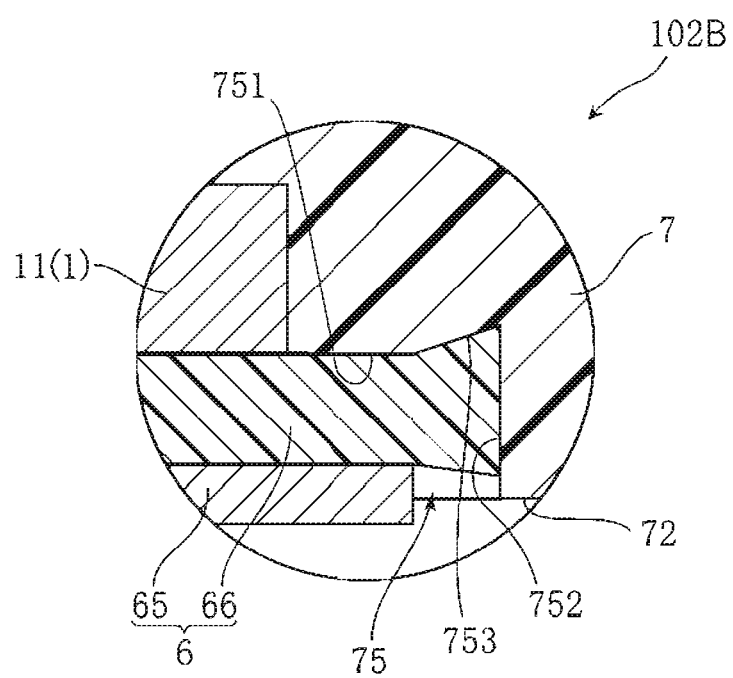
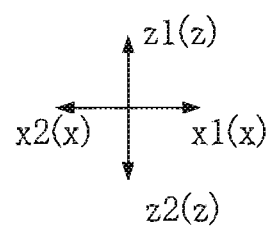

FIG.23
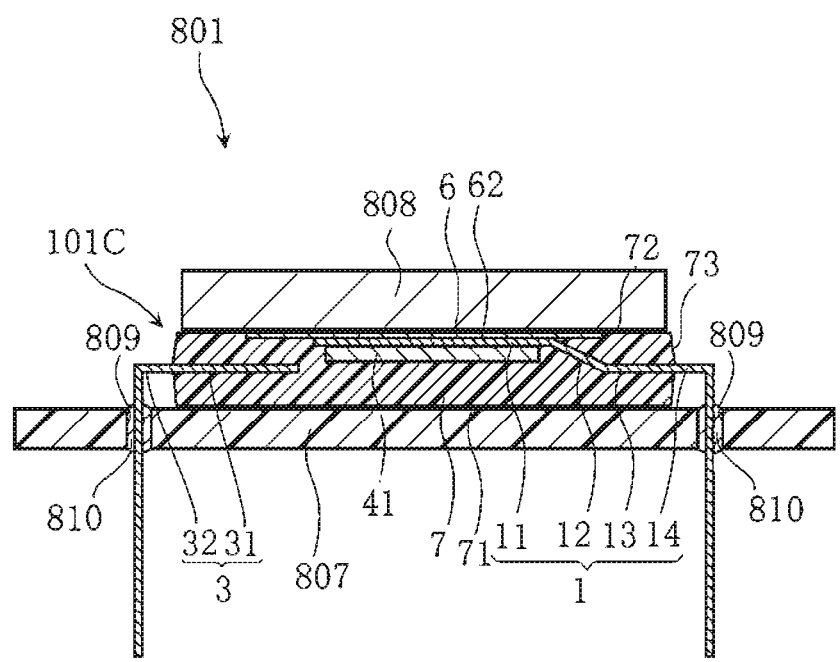
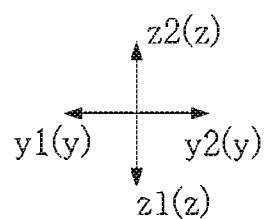

FIG.27
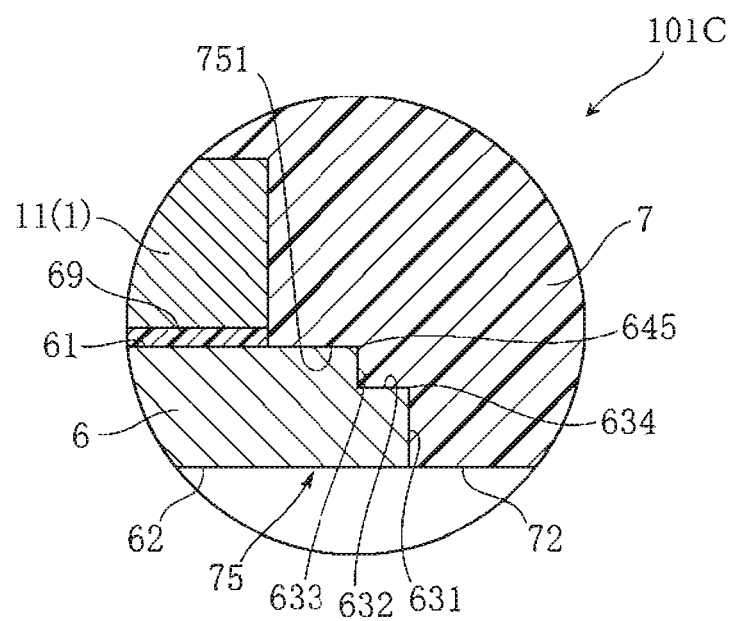
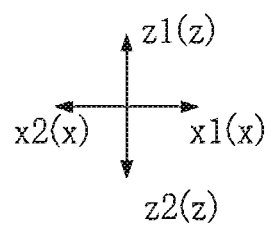

FIG.31
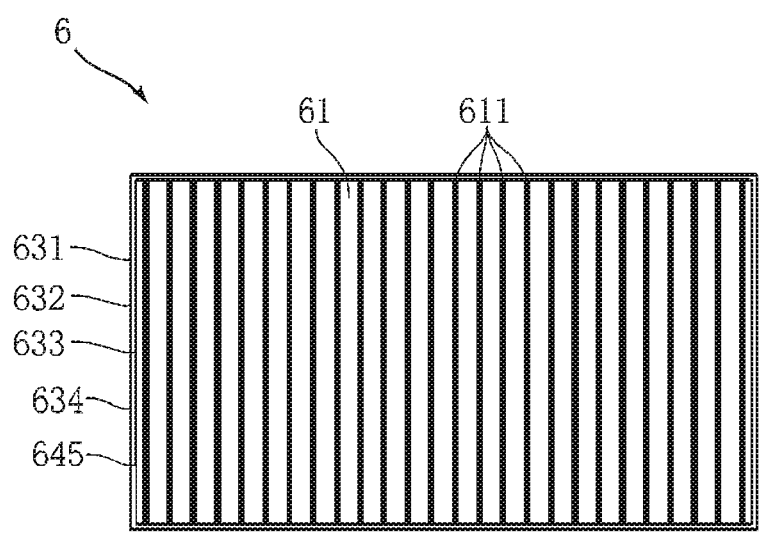
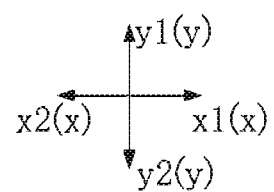

FIG.32
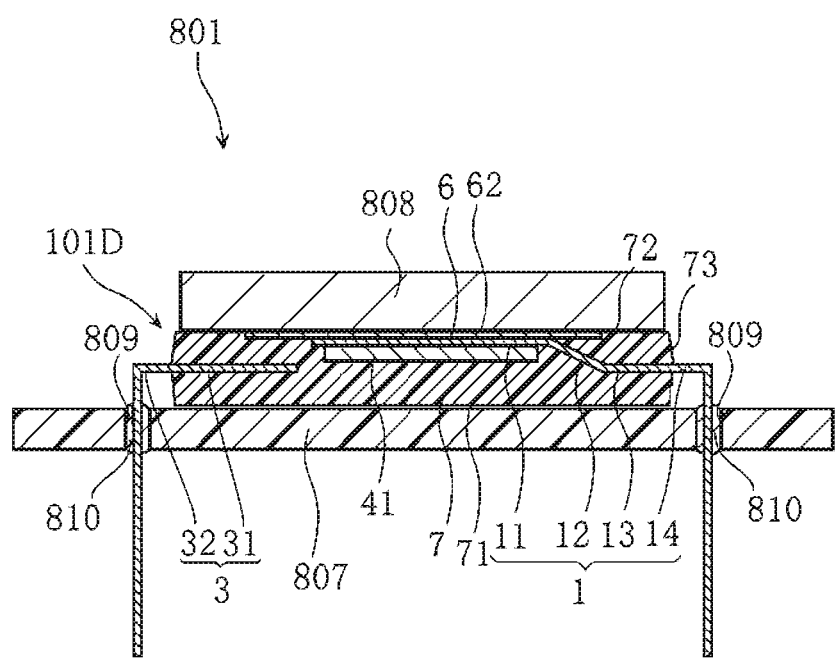
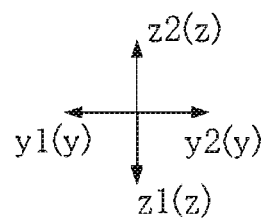

FIG.34
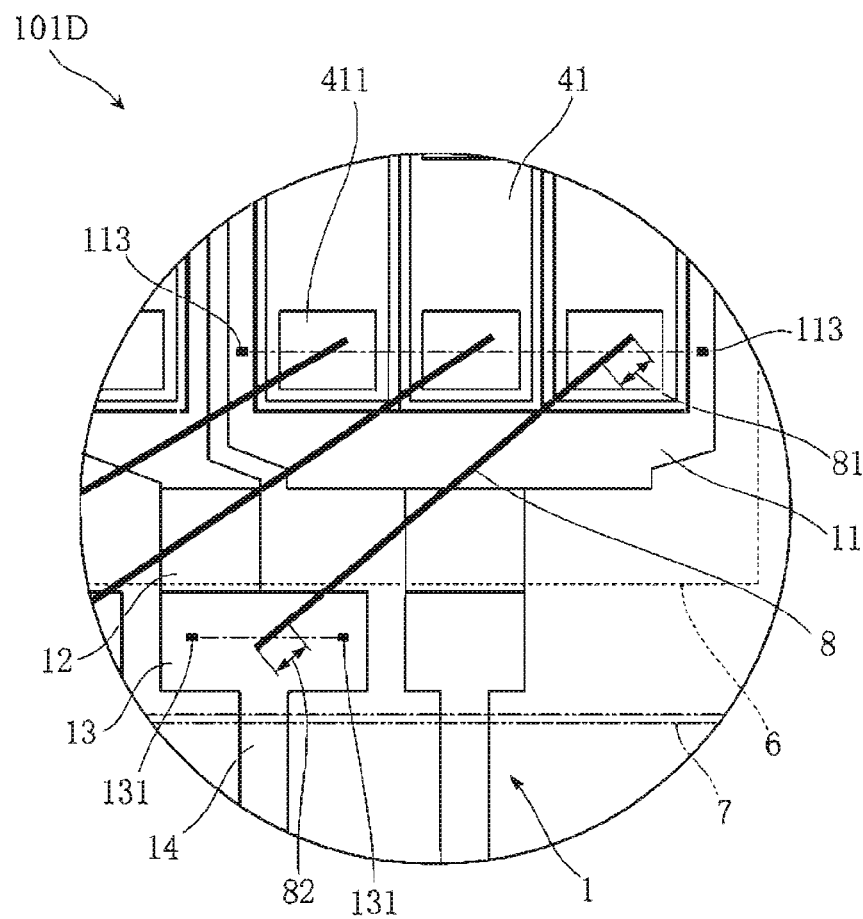
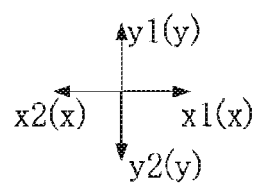

FIG.49
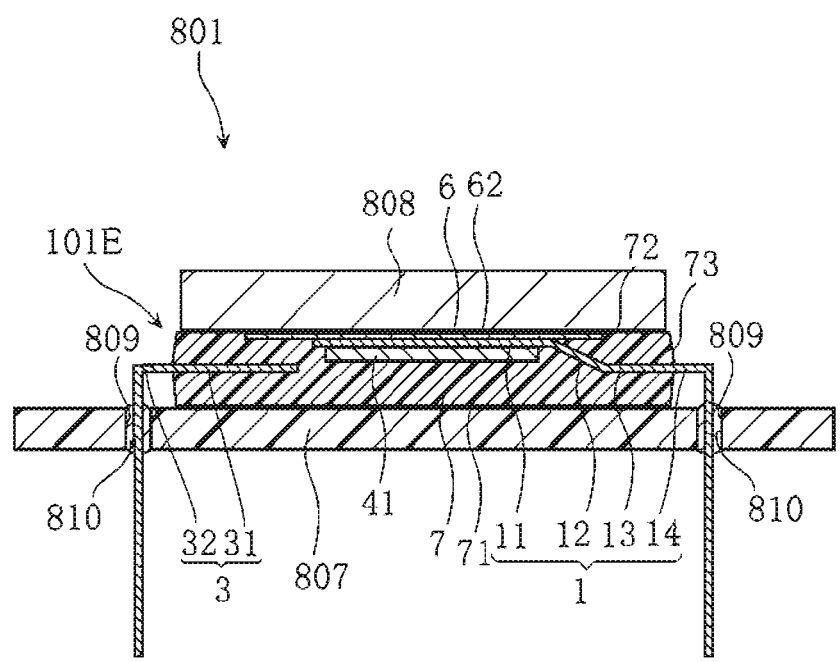
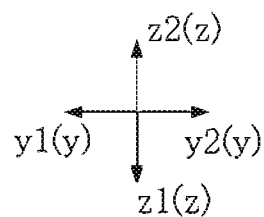

SEMICONDUCTOR DEVICE

This application is a Continuation of U.S. Ser. No. 14/355,002, filed Apr. 29, 2014, which is a National Stage Application of PCT/JP2012/076685, filed Oct. 16, 2012, which applications are incorporated herein by reference.

TECHNICAL FIELD

The present invention relates to semiconductor devices.

BACKGROUND ART

Conventionally, among various types of semiconductor devices, IPM (Intelligent Power Module) semiconductor devices are used in electric power source control. These semiconductor devices, often used to control a large amount of electrical power and tending to generate heat, include a plurality of semiconductor chips, a plurality of die pads, a metal layer serving as a heatsink, a junction layer and a sealing resin. Each of the semiconductor chips is disposed on one of the die pads. Each die pad is joined to the metal layer by the junction layer. The sealing resin covers the semiconductor chips, the die pads, the heatsink and the junction layer. A semiconductor device so called IPM is disclosed in Patent Document 1 for example.

Such a semiconductor device is mounted on a substrate (circuit substrate). Under this state where the semiconductor device is mounted on a substrate, the heatsink is faced to a relatively large heat releasing member outside of the semiconductor device. If, however, the junction layer has a portion extending out of the sealing resin, a gap may be made between the metal layer and the heat releasing member. This prevents efficient transfer of heat from the semiconductor chips to the heat releasing member.

The heat releasing layer and the sealing resin are made of different materials. Due to this, the outer edge of the heat releasing layer may come off the sealing resin. If this separation grows along the sealing resin, heat release from the semiconductor chips may be hindered and/or the semiconductor chips may be corroded.

When bonding aluminum wires, pressure and vibration are applied to the wires. The pressure and vibration are further applied to the die pads and the wire bonding regions. If the die pads and/or the wire bonding regions vibrate or deform, however, the bonding of the wires cannot be performed properly.

As noted above, a conventional semiconductor device may be mounted on a substrate (circuit substrate), and in the substrate-mounted state, the heatsink is faced to a relatively large heat releasing member outside of the semiconductor device. Also, a plurality of semiconductor chips are mounted on the die pads via solder paste, and in addition, thick and hard wires made of aluminum, for example, are used to provide electrical connection between each semiconductor chip with a lead so that a large amount of electric current can pass through.

In the above-noted semiconductor device, when a plurality of semiconductor chips are mounted, adjacent semiconductor chips may be unduly connected to each other via solder paste. Also, there can be a problem of so called solder erosion in which only part of the solder paste reaches an end of the die pad. Further, there is another problem that surface tension, for example, in the solder paste can move the semiconductor chips out of their predetermined positions. Such a shift of the semiconductor chips from their predetermined positions sometimes makes it difficult to bond them with hard wires. If the semiconductor chips are spaced from each other at an increased distance in order to avoid this problem, then there is another problem that the overall size of the semiconductor device is increased.

REFERENCE LIST

Patent Document

Patent Document 1: JP2009-105389A

SUMMARY OF THE INVENTION

Problems to be Solved by the Invention

The present invention has been proposed under the above-described circumstances, and it is therefore an object of the present invention to provide a semiconductor device configured to release heat from the semiconductor chips more efficiently.

Means for Solving the Problems

A first aspect of the present invention provides a semiconductor device which includes: a die pad including a main surface and a rear surface facing in opposite directions; a semiconductor chip mounted on the main surface of the die pad; a sealing resin portion formed with a recess for exposure of the rear surface of the die pad while covering the die pad and the semiconductor chip; and a heat releasing layer disposed in the recess. With this arrangement, the recess has a groove on an outer side than the die pad in a direction in which the rear surface extends, and the groove is closer to the main surface than to the rear surface. In addition, the heat releasing layer includes a junction layer which is in contact with the rear surface of the die pad and has a part thereof filling the groove.

According to a preferred embodiment of the present invention, the heat releasing layer includes a metal layer which is laminated on the junction layer to face away from the die pad.

According to a preferred embodiment of the present invention, the metal layer is made of Cu.

According to a preferred embodiment of the present invention, the junction layer is made of a resin.

According to a preferred embodiment of the present invention, the metal layer partially protrudes in its thickness direction, from the recess.

According to a preferred embodiment of the present invention, the groove is on an outer side with respect to the metal layer in the direction in which the rear surface extends.

According to a preferred embodiment of the present invention, the recess includes a bottom surface which has a region between the metal layer and the groove.

According to a preferred embodiment of the present invention, the groove is slanted in such a manner that as it goes away from the die pad in the direction in which the rear surface extends, it comes closer from the rear surface side to the main surface side in the thickness direction of the die pad.

According to a preferred embodiment of the present invention, the recess includes: a first side surface which is on an outer side than the die pad in the direction in which the rear surface extends, and is connected to the bottom surface; a support surface which is connected to the first side surface and faces in a direction in which the rear surface faces; and a second side surface which is connected to the support surface and is located between the die pad and the first side surface in the direction in which the rear surface extends. With the above-described arrangement, the metal layer overlaps the first side surface in a thickness direction of the die pad, and has an outer edge at least part thereof being between the first side surface and the second side surface in the direction in which the rear surface extends.

According to a preferred embodiment of the present invention, part of the junction layer is between the support surface and the metal layer.

A second aspect of the present invention provides a semiconductor device which includes: a plurality of die pads each including a main surface and a rear surface facing in opposite directions; a plurality of semiconductor chips each mounted on the main surface of one of the die pads; a sealing resin portion formed with a recess for common exposure of the rear surfaces of at least some of the die pads while covering all of the die pads and the semiconductor chips; and a heat releasing layer disposed in the recess. With this arrangement, the recess has a groove on an outer side than any of the die pads on the rear surface side, on a closer side to the main surface than to the rear surface. In addition, the heat releasing layer includes a junction layer which is in contact commonly with the rear surface of each die pad and has part thereof filling the groove.

A third aspect of the present invention provides a semiconductor device which includes: a die pad having a main surface and a rear surface facing in opposite directions; a semiconductor chip mounted on the main surface of the die pad; a sealing resin portion which is formed with a recess receding from a resin bottom surface, exposes the rear surface of the die pad yet covers the die pad and the semiconductor chip; and a heat releasing layer disposed in the recess. With this arrangement, the recess has: a first side surface which is positioned on an outer side than is the die pad in a direction in which the rear surface extends, and is connected to the resin bottom surface; a support surface which is connected to the first side surface and faces in a direction in which the rear surface faces; and a second side surface which is connected to the support surface and is between the die pad and the first side surface in the direction in which the rear surface extends. In addition, the heat releasing layer includes: a heat releasing layer which has an outer edge with at least part thereof located between the first side surface and the second side surface in the direction in which the rear surface extends, and overlaps the first side surface in a thickness direction of the die pad; and a junction layer between the heat releasing layer and the die pad.

According to a preferred embodiment of the present invention, the heat releasing layer is made of a metal.

According to a preferred embodiment of the present invention, the metal is Cu.

According to a preferred embodiment of the present invention, the junction layer is made of a resin.

According to a preferred embodiment of the present invention, part of the junction layer is between the support surface and the heat releasing layer.

According to a preferred embodiment of the present invention, the recess has a groove which is positioned on an outer side than is the die pad in the direction in which the rear surface extends, and has a region located on a side closer to the main surface than to the rear surface. In addition, the junction layer has its part filling the groove.

According to a preferred embodiment of the present invention, the heat releasing layer partially protrudes in its thickness direction, from the recess.

According to a preferred embodiment of the present invention, the groove is on an outer side with respect to the heat releasing layer in the direction in which the rear surface extends.

According to a preferred embodiment of the present invention, the recess includes a recess bottom surface which has a region between the heat releasing layer and the groove.

According to a preferred embodiment of the present invention, the recess is slanted in such a manner that as it goes away from the die pad in the direction in which the rear surface extends, it comes closer from the rear surface side to the main surface side in the thickness direction of the die pad.

A fourth aspect of the present invention provides a semiconductor device which includes: a plurality of die pads each including a main surface and a rear surface facing in opposite directions; a plurality of semiconductor chips each mounted on the main surface of one of the die pads; a sealing resin portion which is formed with a recess receding from a resin bottom surface, commonly exposes the rear surfaces of at least one or more of the die pads yet commonly covers the die pads and the semiconductor chips; and a heat releasing layer disposed in the recess. With this arrangement, the recess, on its side facing the rear surface, has: a first side surface which is on an outer side than is any of the die pads and is connected to the resin bottom surface; a support surface which is connected to the first side surface and faces in a direction in which the rear surface faces; and a second side surface which is connected to the support surface and is between the die pad and the first side surface in a direction in which the rear surface extends, whereas the heat releasing layer includes: a heat releasing layer which has an outer edge with at least part thereof being between the first side surface and the second side surface in the direction in which the rear surface extends, and overlaps the first side surface in a thickness direction of the die pad; and a junction layer positioned between the heat releasing layer and the die pad.

A fifth aspect of the present invention provides a semiconductor device which includes: a die pad having a die pad main surface and a die pad rear surface facing in opposite directions; a semiconductor chip mounted on the die pad main surface; a sealing resin portion which is formed with a recess receding from a bottom surface, exposes the die pad rear surface yet covers the die pad and the semiconductor chip; and a heat releasing layer which is disposed in the recess, has a heat releasing layer main surface facing the die pad rear surface and a heat releasing layer rear surface facing away from the heat releasing layer main surface, and is joined to the die pad. With this arrangement, the heat releasing layer has: a first side surface which is positioned on an outer side than is the die pad in a direction in which the die pad rear surface extends, and is connected to the heat releasing layer rear surface; an intermediate surface which is connected to the first side surface and faces in a direction in which the heat releasing layer main surface faces; and a second side surface which is connected to the intermediate surface and is between the die pad and the first side surface in a direction in which the die pad rear surface extends.

According to a preferred embodiment of the present invention, the heat releasing layer is made of a ceramic.

According to a preferred embodiment of the present invention, the first side surface, the intermediate surface, and the second side surface are in contact with the sealing resin portion.

According to a preferred embodiment of the present invention, the heat releasing layer rear surface of the heat releasing layer is flush with the bottom surface of the sealing resin portion.

According to a preferred embodiment of the present invention, the first side surface and the intermediate surface form a first angled region.

According to a preferred embodiment of the present invention, the intermediate surface and the second side surface form a second angled region.

According to a preferred embodiment of the present invention, at least one of the first angled region and the second angled region has a right angle.

According to a preferred embodiment of the present invention, the first side surface has a greater dimension in a thickness direction of the heat releasing layer than a dimension of the second side surface in the thickness direction of the heat releasing layer.

According to a preferred embodiment of the present invention, the heat releasing layer and the die pad are joined to each other by a junction layer.

According to a preferred embodiment of the present invention, the heat releasing layer main surface of the heat releasing layer is formed with a plurality of grooves extending in a direction perpendicular to a thickness direction of the heat releasing layer.

According to a preferred embodiment of the present invention, each of the grooves has a rectangular section.

According to a preferred embodiment of the present invention, one or more of the grooves are in contact with the junction layer.

According to a preferred embodiment of the present invention, one or more of the grooves are in contact with the sealing resin portion.

A sixth aspect of the present invention provides a semiconductor device which includes: a plurality of die pads each having a die pad main surface and a die pad rear surface facing in opposite directions; a plurality of semiconductor chips each mounted on one of the die pad main surfaces; a sealing resin portion which is formed with a recess receding from a bottom surface, commonly exposes the die pad rear surfaces yet commonly covers each die pad and each semiconductor chip; and a heat releasing layer which is disposed in the recess, has a heat releasing layer main surface facing the die pad rear surfaces and a heat releasing layer rear surface facing away from the heat releasing layer main surface, and is commonly joined to each die pad. With this arrangement, the heat releasing layer has: a first side surface which is positioned on an outer side than is the die pad in a direction in which the die pad rear surface extends, and is connected to the heat releasing layer rear surface; an intermediate surface which is connected to the first side surface and faces in a direction in which the heat releasing layer main surface faces; and a second side surface which is connected to the intermediate surface and is between the die pad and the first side surface in the direction in which the die pad rear surface extends.

A seventh aspect of the present invention provides a wire bonding method which includes a wire bonding step of bonding a wire while a pair of pressing pieces are pressed onto two places on a bonding object at a space from each other, onto a position in the bonding object between the pair of pressing pieces within a direction in which the pressing pieces are spaced from each other.

According to a preferred embodiment of the present invention, the wire is bonded to a place on the bonding object, across a straight line which connects the pair of pressing pieces, in the wire bonding step.

According to a preferred embodiment of the present invention, the bonding object includes a die pad of a metal plate and a semiconductor chip mounted on the die pad and having one or more electrodes. In the wire bonding step, the pair of pressing pieces are pressed onto places in the die pad sandwiching the semiconductor chip while the wire is bonded to the electrodes.

According to a preferred embodiment of the present invention, the semiconductor chip has a plurality of electrodes, and in the wire bonding step, the pair of pressing pieces are pressed onto places sandwiching the plurality of electrodes while a wire is bonded individually to each of the electrodes.

According to a preferred embodiment of the present invention, the bonding object includes a wire bonding portion made of a metal plate, and in the wire bonding step, the pair of pressing pieces are pressed onto the wire bonding portion while a wire is bonded to the wire bonding portion.

According to a preferred embodiment of the present invention, the bonding object includes: a die pad made of a metal plate; a semiconductor chip mounted on the die pad and having one or more electrodes; and a wire bonding portion spaced from the die pad. In the wire bonding step, the pair of pressing pieces are pressed onto places in the die pad sandwiching the semiconductor chip while a wire is bonded to the electrodes, and after this wire bonding step, an additional pair of pressing pieces are pressed onto the wire bonding portion and an additional wire bonding step is performed to the wire bonding portion.

According to a preferred embodiment of the present invention, the semiconductor chip has a plurality of electrodes, and in the wire bonding step, the pair of pressing pieces are pressed onto places sandwiching the plurality of electrodes while a wire is bonded individually to each of the electrodes.

According to a preferred embodiment of the present invention, the wire is made of aluminum.

According to a preferred embodiment of the present invention, pressure and vibration are applied to the wire in the wire bonding step.

An eighth aspect of the present invention provides a semiconductor device which includes: a die pad having a main surface and a rear surface facing in opposite directions; a semiconductor chip mounted on the main surface of the die pad and having one or more electrodes; and a sealing resin portion covering the die pad and the semiconductor chip. With this arrangement, the die pad is formed with a pair of press marks spaced from each other, and a wire has an end bonded to a place on the electrode between the pair of press marks within a direction in which the pair of press marks are spaced from each other.

According to a preferred embodiment of the present invention, the end of the wire is bonded to cross a straight line which connects the pair of pressing pieces with each other on the electrode.

According to a preferred embodiment of the present invention, the semiconductor device further includes a wire bonding portion spaced from the die pad. With this arrangement, the wire bonding portion is formed with an additional pair of press marks spaced from each other, and the wire has another end bonded to a place on the wire bonding portion between the additional pair of press marks within a direction in which the additional pair of press marks are spaced from each other.

According to a preferred embodiment of the present invention, said another end of the wire is bonded across a straight line which connects the additional pair of press marks with each other on the wire bonding portion.

A ninth aspect of the present invention provides a semiconductor device which includes: a die pad including a main surface and a rear surface facing in opposite directions; a semiconductor chip mounted on the main surface of the die pad and including one or more electrodes; leads each electrically connected to the semiconductor chip via a wire; and a sealing resin portion covering the die pad, the semiconductor chip and part of the leads. With this arrangement, the lead is formed with a pair of press marks on its surface to sandwich a bonding place where the wire has its end bonded.

According to a preferred embodiment of the present invention, the leads formed with the press marks have a wider region than the leads not formed with press marks.

According to a preferred embodiment of the present invention, the wire includes those of different thicknesses, and the press marks are formed only near the bonding places of the wires of a greater thickness.

According to a preferred embodiment of the present invention, the semiconductor device includes a plurality of the semiconductor chips. With this arrangement, the thick wire is used only for electrical connection between one or more of the semiconductor chips and the leads.

According to a preferred embodiment of the present invention, the die pad surface sandwiching the semiconductor chip is formed with a pair of press marks spaced from each other so as to sandwich the semiconductor chip.

According to a preferred embodiment of the present invention, the semiconductor device includes a plurality of the semiconductor chips including an output transistor and a controlling semiconductor chip therefor. With this arrangement, the press marks spaced from each other on the lead are formed to sandwich a place where the lead is bonded to the output transistor.

A tenth aspect of the present invention provides a method for making a semiconductor device, where the method includes: an application step of applying an electrically conductive joining paste to a main surface of a die pad; a placement step of placing a semiconductor chip, which is larger than an area covered by the electrically conductive joining paste as viewed in a direction in which the main surface faces, by causing a rear surface of the semiconductor chip to contact with the electrically conductive joining paste in a manner such that the area covered by the electrically conductive joining paste is contained by the rear surface as viewed in the direction in which the main surface faces; and a joining step of softening and then hardening the electrically conductive joining paste thereby forming an electrically conductive joining material.

According to a preferred embodiment of the present invention, the electrically conductive joining paste is provided by a solder paste.

According to a preferred embodiment of the present invention, the main surface is covered by a mask which has openings, and the openings are filled with the electrically conductive joining paste in the application step.

According to a preferred embodiment of the present invention, the rear surface of the semiconductor chip has a higher wettability to the electrically conductive joining paste than the main surface of the die pad.

According to a preferred embodiment of the present invention, the rear surface of the semiconductor chip is made of Ag, Au, Ni or an alloy containing one of these metals whereas the main surface of the die pad is made of Cu, an FeNi alloy or Fe.

An eleventh aspect of the present invention provides a semiconductor device which includes: a die pad having a main surface; a semiconductor chip having a rear surface; and an electrically conductive joining material between the main surface of the die pad and the rear surface of the semiconductor chip, providing a junction between the die pad and the semiconductor chip. With this arrangement, the rear surface of the semiconductor chip and the electrically conductive joining material share a larger junction area between the two than do the main surface of the die pad and the electrically conductive joining material.

According to a preferred embodiment of the present invention, the electrically conductive joining material is provided by a solder.

According to a preferred embodiment of the present invention, the rear surface of the semiconductor chip has a higher wettability to the electrically conductive joining paste than the main surface of the die pad.

According to a preferred embodiment of the present invention, the rear surface of the semiconductor chip is made of Ag, Au, Ni or an alloy containing one of these metals, whereas the main surface of the die pad is made of Cu, an FeNi alloy or Fe.

A twelfth aspect of the present invention provides a semiconductor device which includes: die pads each having a main surface and a rear surface facing in opposite directions; a plurality of semiconductor chips each mounted on the main surface of one of the die pads; and an electrically conductive joining material between the main surface of each die pad and a rear surface of each semiconductor chip, providing a junction between the die pad and the semiconductor chip. With this arrangement, the rear surface of each semiconductor chip shares with its corresponding electrically conductive joining material a larger junction area between the two than does the main surface of said die pad share with said electrically conductive joining material formed for said semiconductor chip.

According to a preferred embodiment of the present invention, the semiconductor chip includes a plurality of output transistors and a controlling semiconductor chip therefor, the above-described relationship between two junction areas being true in the plurality of output transistors.

According to a preferred embodiment of the present invention, the semiconductor device further includes: a plurality of leads each for an output from one of the output transistors; and a plurality of wires each connecting one of the output transistors with a corresponding one of the leads; the wire being made of aluminum.

Other characteristics and advantages of the present invention will become clearer from the following detailed description to be made with reference to the attached drawings.

BRIEF DESCRIPTION OF THE DRAWINGS

FIG. 1 is a sectional view showing a packaging structure of a semiconductor device according to Embodiment 1A of the present invention.

FIG. 5 is an enlarged sectional view of a primary portion taken from FIG. 4.

FIG. 10 is a bottom view of a semiconductor device according to Embodiment 2A of the present invention, before leads are bent

FIG. 12 is a sectional view showing a packaging structure of a semiconductor device according to Embodiment 1B of the present invention.

FIG. 22 is an enlarged sectional view taken in lines XXII-XXII in FIG. 21.

FIG. 23 is a sectional view showing a packaging structure of a semiconductor device according to Embodiment 1C of the present invention.

FIG. 27 is an enlarged sectional view of a primary portion taken from FIG. 26.

FIG. 31 is a plan view showing a heat releasing layer of the semiconductor device in FIG. 30.

FIG. 32 is a sectional view showing a packaging structure of a semiconductor device according to Embodiment 1D of the present invention.

FIG. 34 is a plan view of a primary portion in the semiconductor device according to Embodiment 1D of the present invention.

FIG. 49 is a sectional view showing a packaging structure of a semiconductor device according to Embodiment 1E of the present invention.

MODE FOR CARRYING OUT THE INVENTION

Preferred embodiments of the present invention will be described below with reference to the drawings.

FIG. 1 is a sectional view showing a packaging structure when use is made of a semiconductor device according to Embodiment 1A of the present invention.

A semiconductor device packaging structure 801 shown in FIG. 1 includes a semiconductor device 101A, a substrate 807 and a heat releasing member 808.

The substrate 807 is a member on which a plurality of electric components are mounted. The substrate 807 is made of an insulating material. The substrate 807 is formed with an unillustrated wiring pattern. The substrate 807 is formed with a plurality of holes 809. The heat releasing member 808 is made of a material which has a relatively high heat conductivity like a metal such as aluminum. The heat releasing member 808 is fixed to the substrate 807 by an unillustrated supporting member. The semiconductor device 101A is mounted on the substrate 807. In the present embodiment, the semiconductor device 101A is a so called IPM (Intelligent Power Module). The semiconductor device 101A is used for such an application as electric power source control in an air conditioner, a motor controller, etc.

Figure 2:
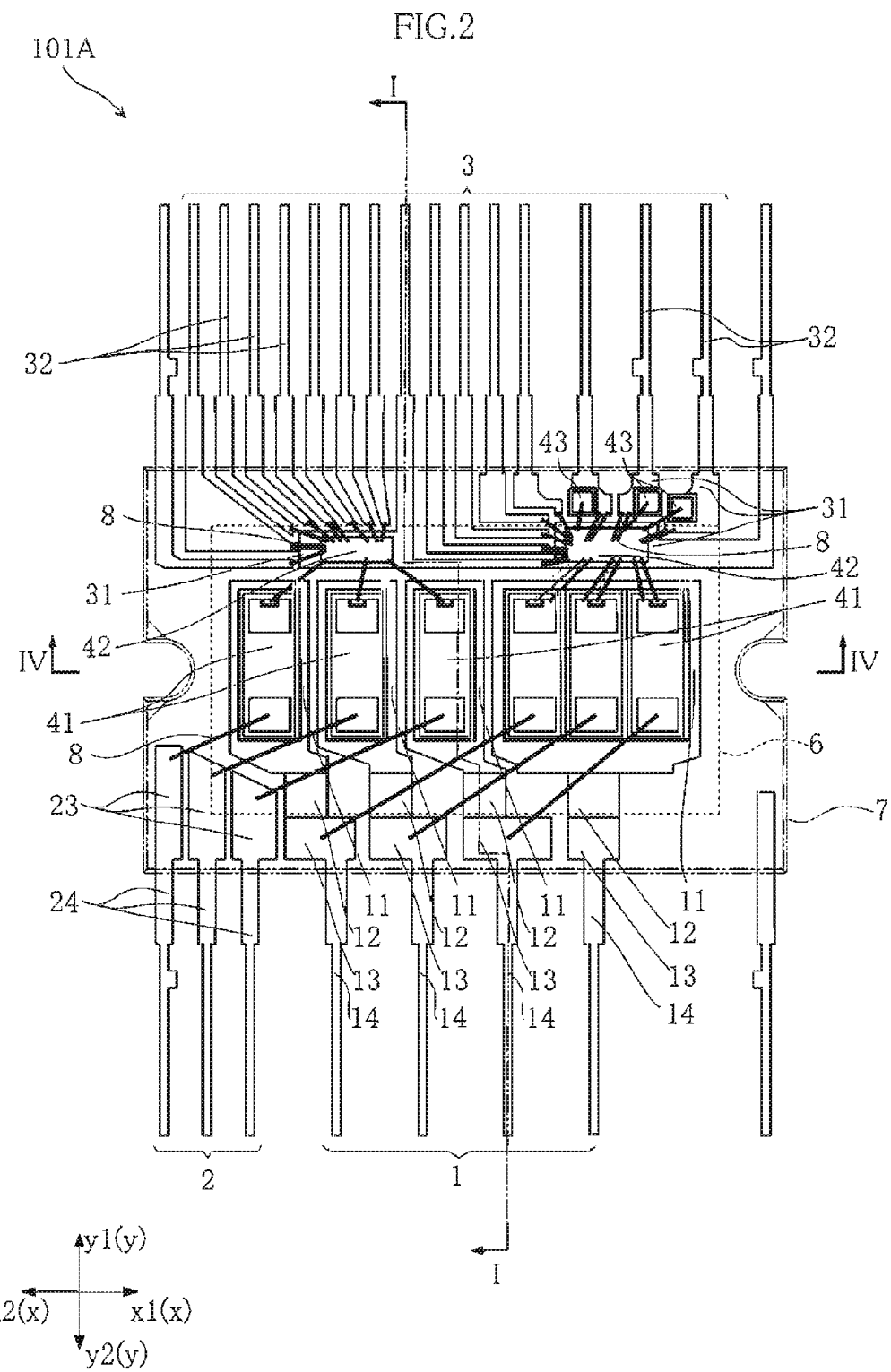
FIG. 2 is a plan view (partially unillustrated) of the semiconductor device according to Embodiment 1A of the present invention, before leads are bent.
Figure 3:
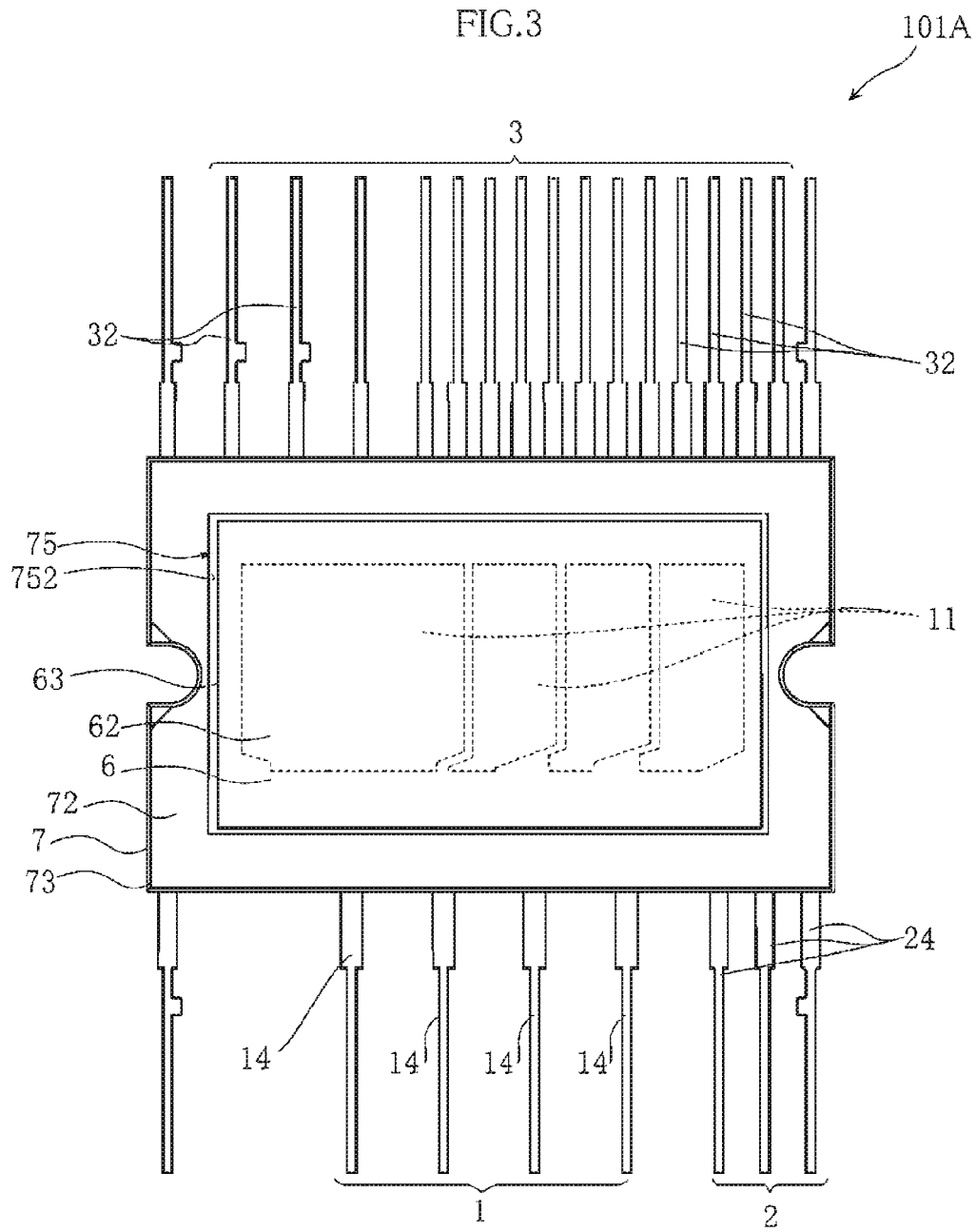
FIG. 3 is a bottom view of the semiconductor device according to Embodiment 1A of the present invention, before leads are bent.
Figure 4:
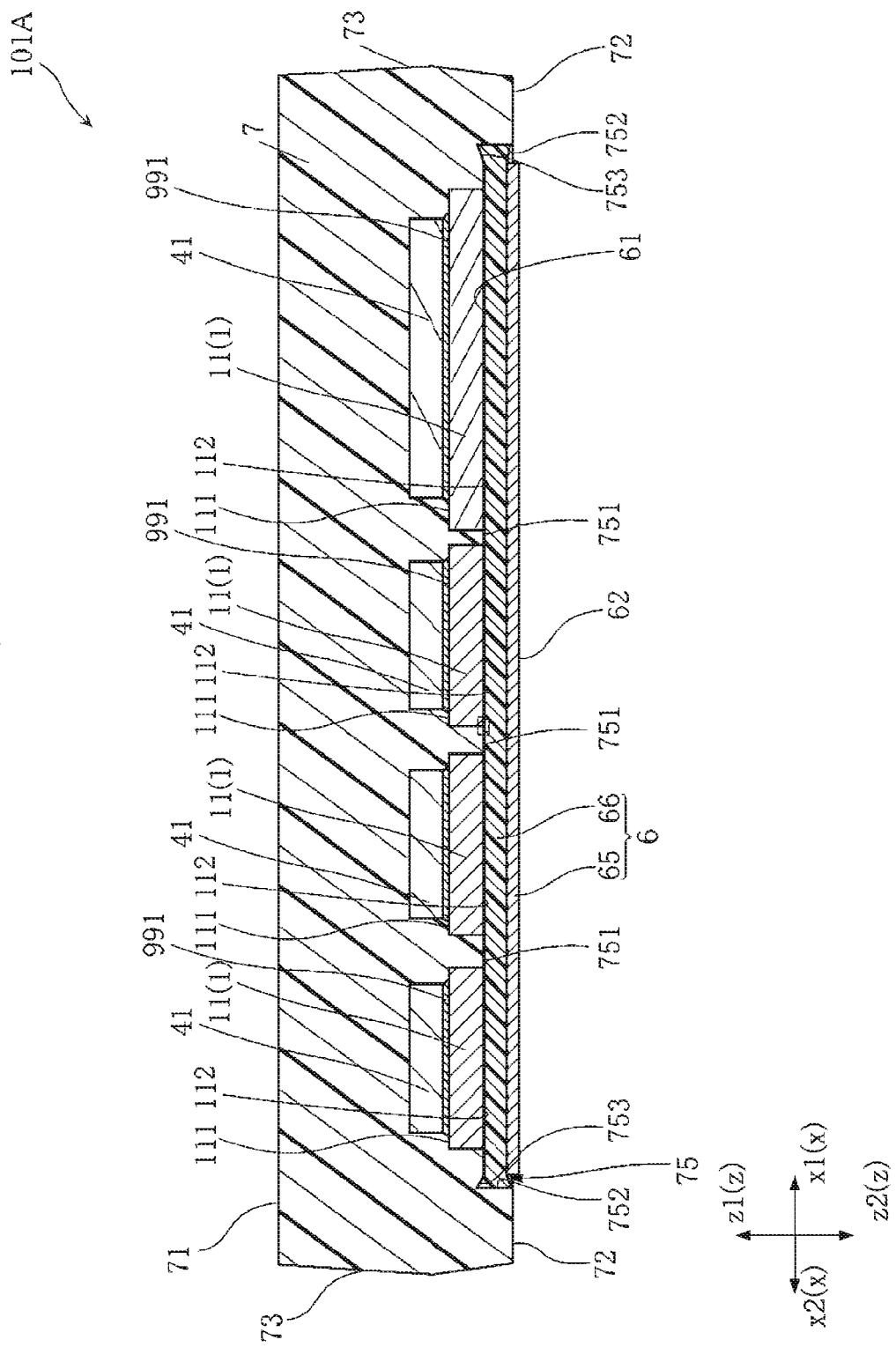
FIG. 4 is a sectional view taken in lines IV-IV in FIG. 2.

FIG. 2 is a plan view (partially unillustrated) of the semiconductor device according to Embodiment 1A of the present invention, in a state before leads are bent. FIG. 3 is a bottom view of the semiconductor device according to Embodiment 1A of the present invention, in a state before the leads are bent. FIG. 4 is a sectional view taken in lines IV-IV in FIG. 2. FIG. 5 is an enlarged sectional view of a primary portion taken from FIG. 4. FIG. 1 represents a section taken in lines I-I in FIG. 2. In FIG. 4, each component is illustrated schematically for easier comprehension.

The semiconductor device 101A shown in these drawings includes a plurality of first electrode portions 1, second electrode portions 2 and third electrode portions 3; a plurality of the semiconductor chips 41, 42; passive component chips 43; a heat releasing layer 6; a sealing resin portion 7 and wires 8. FIG. 2 shows the heat releasing layer 6 in broken lines and the sealing resin portion 7 in imaginary lines.

The sealing resin portion 7 covers the first electrode portions 1, the second electrode portions 2, the third electrode portions 3, the semiconductor chips 41, 42, and the passive component chips 43. The sealing resin portion 7 is made of a black epoxy resin for example. As shown in FIGS. 3 and 4, the sealing resin portion 7 has a resin main surface 71, a resin bottom surface 72 and a resin side surface 73.

The resin main surface 71 is a flat surface which faces in a direction z1 and extends along an xy plane. The resin bottom surface 72 is a flat surface which faces in a direction z2 that is opposite to the direction z1 and extends along an xy plane. The resin side surface 73 surrounds the semiconductor chips 41, 42 and the passive component chips 43 in xy-plane view. The resin side surface 73 is connected to the resin main surface 71 and the resin bottom surface 72.

As clearly shown in FIG. 4, the sealing resin portion 7 is formed with a recess 75. The recess 75 recedes from the resin bottom surface 72. The recess 75 has a recess bottom surface 751, a recess side surface 152, and a recess groove 753. The recess bottom surface 751 extends along an xy plane. The recess side surface 752 is connected to the resin bottom surface 72. The recess side surface 752 extends substantially in a direction z.

In the preset embodiment, the recess groove 753 is between the recess bottom surface 751 and the recess side surface 752, and is configured in a rectangular-annular pattern along the outer edge of the recess 75 as viewed in the z direction. As shown in FIG. 5, the recess groove 753 recedes from the recess bottom surface 751 in a z1 direction. In the present embodiment, the recess groove 753 is disposed on an outside of a metal layer 65 as viewed in the z direction. In addition, the recess groove 753 is slanted in such a manner that as it goes away from the recess bottom surface 751 in the x direction, it also goes away from the surface 751 in the z1 direction. The recess groove 753 has a maximum depth of approximately 50 μm for example.

As shown in FIG. 2, the semiconductor chips 41, 42 and the passive component chips 43 are rectangular in plan view. The semiconductor chip 41 is a power chip such as an IGBT, MOS, and diode. The semiconductor chip 42 is an LSI chip such as a control IC. The passive component chips 43 are, for example, resisters, capacitors or other passive components.

The first electrode portions 1, the second electrode portions 2 and the third electrode portions 3 in FIG. 2 through 4 are all made of an electrically conductive material. An example of such an electrically conductive material is copper. The electrode portion shown in a bottom right region in FIG. 2 is grounded.

Each of the plurality (four, in the present embodiment) of the first electrode portions 1 includes a die pad 11 (see FIG. 1, FIG. 2, FIG. 4), a connecting region 12 (see FIG. 1, FIG. 2), a wire bonding region 13 (see FIG. 1, FIG. 2) and a lead 14 (see FIG. 1 through FIG. 3). The first electrode portions 1 are spaced from each other in the direction x.

Each die pad 11 is a flat plate extending along and parallel to an xy plane. The semiconductor chip 41 is disposed on the die pad 11. As shown in FIG. 4, a junction layer 991 is between the die pad 11 and the semiconductor chip 41. The junction layer 991 is made of an electrically conductive material. The electrically conductive material is provided by solder or silver paste, for example. Solder has a relatively high thermal conductivity. Use of solder as the junction layer 991 enables efficient heat conduction from the semiconductor chip 41 to the die pad 11. Each of the die pads 11 is exposed from the recess bottom surface 751.

Each die pad 11 has a die pad main surface 111 and a die pad rear surface 112. The die pad main surface 111 faces in the direction z1 whereas the die pad rear surface 112 faces in the direction z2. In other words, the die pad main surface 111 and the die pad rear surface 112 are arranged to face away from each other, i.e., face in the mutually opposite directions. The semiconductor chip 41 is disposed on the die pad main surface 111. The junction layer 991 is between the die pad main surface 111 and the semiconductor chip 41. The die pad rear surface 112 is located at the same position as the recess bottom surface 751 in a thickness direction (the direction z) of the die pad 11. However, the die pad rear surface 112 may be closer to an opening of the recess 75 than is the recess bottom surface 751.

As shown in FIG. 2, each connecting region 12 is disposed between the die pad 11 and the wire bonding region 13, and connected to the die pad 11 and to the wire bonding region 13. As shown in FIG. 1, the connecting region 12 extends along a plane which is inclined with respect to an xy plane. The connecting region 12 is inclined with respect to an xy plane in such a manner that it goes farther in the direction z1 as it is further away from the die pad 11.

Each wire bonding region 13 shown in FIG. 1 and FIG. 2 extends along an xy plane. In the direction z, each wire bonding region 13 is on a side more toward the direction z1 than is the die pad 11. A wire 8 is bonded to one of the wire bonding regions 13 and to one of the semiconductor chips 41. Thus, electrical conductivity is established between said one of the wire bonding regions 13 and said one of the semiconductor chips 41. The leads 14 are connected to the wire bonding regions 13. Each lead 14 extends along the direction y. The lead 14 has a portion extending out of the resin side surface 73 of the sealing resin portion 7. In the present embodiment, the leads 14 are for insertion mounting. As shown in FIG. 1, when mounting the semiconductor device 101A on the substrate 807, the leads 14 are bent and inserted through the holes 809. For fixing the leads 14 in the substrate 807, the holes 809 are filled with solder layers 810.

As shown in FIG. 2, each of the plurality (three, in the present embodiment) of the second electrode portions 2 includes a wire bonding region 23 and a lead 24. The second electrode portions 2 are spaced from each other in the direction x.

Each wire bonding region 23 extends along an xy plane. In the direction z, each wire bonding region 23 is on a side more toward the direction z1 than is the die pad 11. A wire 8 is bonded to one of the wire bonding regions 23 and to one of the semiconductor chips 41. Thus, electrical conductivity is established between said one of the wire bonding regions 23 and said one of the semiconductor chips 41. The leads 24 are connected to the wire bonding regions 23. Each lead 24 extends along the direction y. The lead 24 has a portion extending out of the resin side surface 73 of the sealing resin portion 7. In the present embodiment, the leads 24 are for insertion mounting. Though not illustrated, when mounting the semiconductor device 101A on the substrate 807, the leads 24 are bent and inserted through the holes 809 like the leads 14.

The third electrode portions 3 shown in FIG. 1, FIG. 2 includes a plurality of control die pads 31 and a plurality of leads 32. The control die pads 31 and the leads 32 are respectively disposed at the same positions in the direction z. On each control die pad 31, the semiconductor chip 42 or the passive component chips 43 is disposed. A junction layer (not illustrated) is formed between the control die pad 31 and the semiconductor chip 42, and between the control die pads 31 and the passive component chips 43. The control die pads 31 need not have its rear surface faced to the heat releasing layer 6 or exposed.

Each lead 32 has a portion extending out of the resin side surface 73 of the sealing resin portion 7. In the present embodiment, the leads 32 are for insertion mounting. As shown in FIG. 1, when mounting the semiconductor device 101A on the substrate 807, the leads 32 are bent and inserted through the holes 809. As has been described in relation with the leads 14, the holes 809 are filled with solder layers 810 for fixing the leads 32 in the substrate 809. A wire 8 is bonded to one of the leads 32 and to one of the semiconductor chips 42. Thus, electrical conductivity is established between said one of the leads 32 and said one of the semiconductor chips 42. Also, a wire 8 is bonded to one of the semiconductor chip 42 and to one of the passive component chips 43.

As shown in FIG. 4, the heat releasing layer 6 is in the recess 75 in the sealing resin portion 7. The heat releasing layer 6 is surrounded by the recess side surface 752. In the present embodiment, the heat releasing layer 6 is a flat plate extending along and parallel to an xy plane. In the present embodiment, the heat releasing layer 6 is constituted by the metal layer 65 and the junction layer 66. The metal layer 65 is on a z2 side of the junction layer 66, and is made of Cu, aluminum or ceramics, for example, having a thickness of approximately 105 μm. The junction layer 66 is on a z1 side of the metal layer 65 and joins the metal layer 65 to the die pad rear surfaces 112 of the respective die pads 11. The junction layer 66 is made of an insulating resin for example, and has a thickness of approximately 250 μm for example. The resin becomes soft when it receives pressure and vibration in a manufacturing step of the semiconductor device 101A. The junction layer 66 is in direct contact with all of the die pads 11 on which the semiconductor chips 41 are mounted. The metal layer 65 may have a region protruding slightly beyond the resin bottom surface 72. As shown in FIG. 5, a part of the junction layer 66 fills the recess groove 753. The heat releasing layer 66 is in contact with the recess side surface 752.

The heat releasing layer 6 is for quickly releasing heat which was generated in the semiconductor chip 41 to outside of the semiconductor device 101A. In order to quickly release the heat generated by the semiconductor chip 41 to outside of the semiconductor device 101A, the heat releasing layer 6 should be made of a material of a large thermal conductivity. While a larger thermal conductivity is preferred, there can be a potential problem that the metal layer 65 will come off if the heat releasing layer's thermal expansion coefficient differs greatly from that of the sealing resin portion 7. Preferably, therefore, the heat releasing layer 6 is of a material which has a larger thermal conductivity than that of a material which constitutes the sealing resin portion 7, and a similar thermal expansion coefficient to that of the material which constitutes the sealing resin portion 7. The heat releasing layer 6 is faced directly to all of the die pads 11. As shown in FIG. 3, the heat releasing layer 6 covers all of the die pads 11 entirely in xy plane view (i.e., as viewed in the thickness direction of the heat releasing layer 6).

As shown in FIG. 3 and FIG. 4, the heat releasing layer 6 has a heat releasing layer main surface 61 and a heat releasing layer rear surface 62. The heat releasing layer main surface 61 faces in the direction z1. The heat releasing layer main surface 61 covers the die pad rear surfaces 112 and the recess bottom surfaces 751 of all of the die pads 11 in xy-plane view. The heat releasing layer main surface 61 is in direct contact with the die pad rear surface 112 and the recess bottom surface 751. The heat releasing layer rear surface 62 faces in the direction z2 which is a direction opposite to the direction in which the heat releasing layer main surface 61 faces. The heat releasing layer rear surface 62 is not covered by the sealing resin portion 7 and is exposed from the sealing resin portion 7.

Next, a method of making the semiconductor device 101A will be described. Drawings for describing the method will use the same reference symbols as those used thus far in identifying those described thus far.

Figure 6:
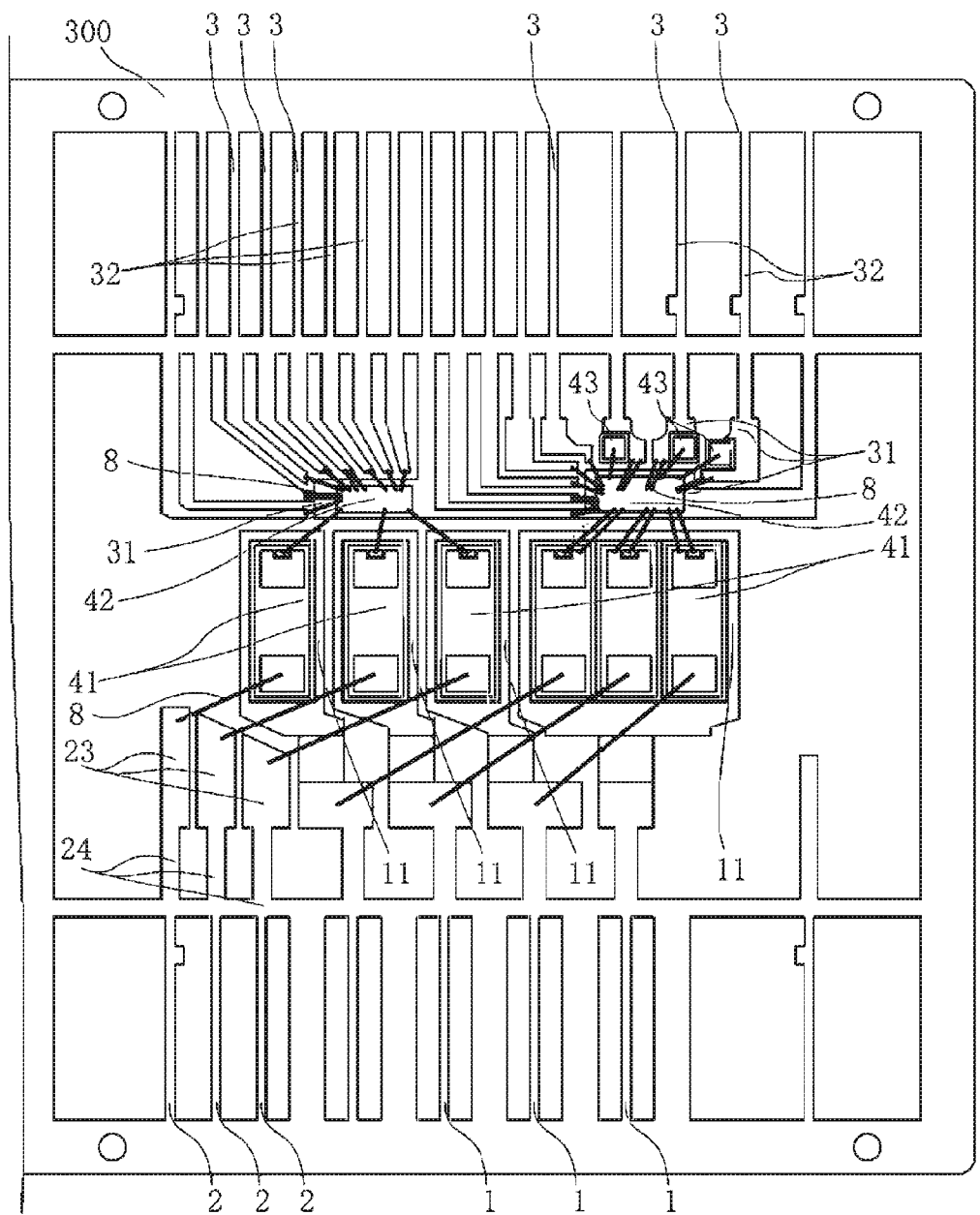
FIG. 6 is a plan view showing a manufacturing step of the semiconductor device according to Embodiment 1A of the present invention.

First, as shown in FIG. 6, a lead frame 300 which includes a plurality of die pads 11, 31; and a plurality of semiconductor chips 41, 42 and passive component chips 43 is prepared. Next, as shown in the drawing, each of the semiconductor chips 41 is disposed on one of the die pads 11 via the junction layer (not illustrated). Likewise, each of the semiconductor chip 42 and the passive component chips 43 is disposed on one of the control die pads 31 via the junction layer (not illustrated). Next, as shown in the drawing, a wire 8 is bonded to each of the semiconductor chips 41, 42 and other components.

Figure 7:
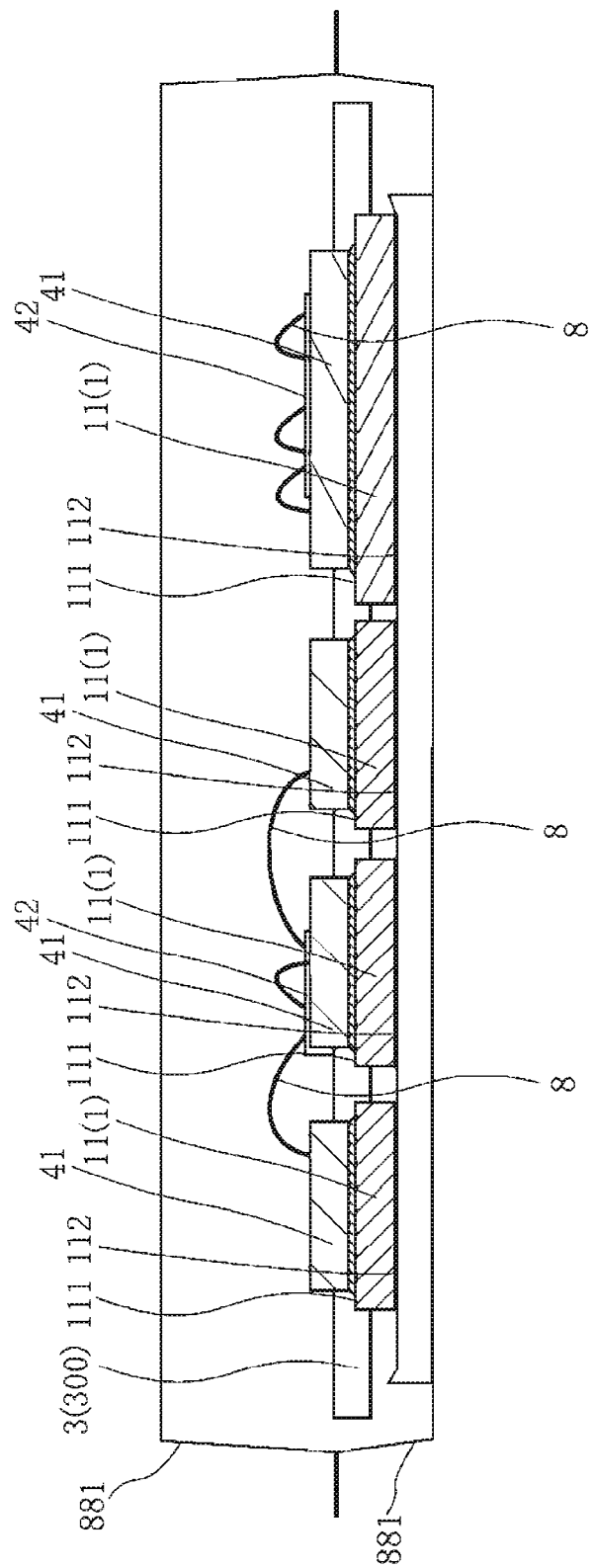
FIG. 7 is a sectional view showing a step which follows the one in FIG. 6.
Figure 8:
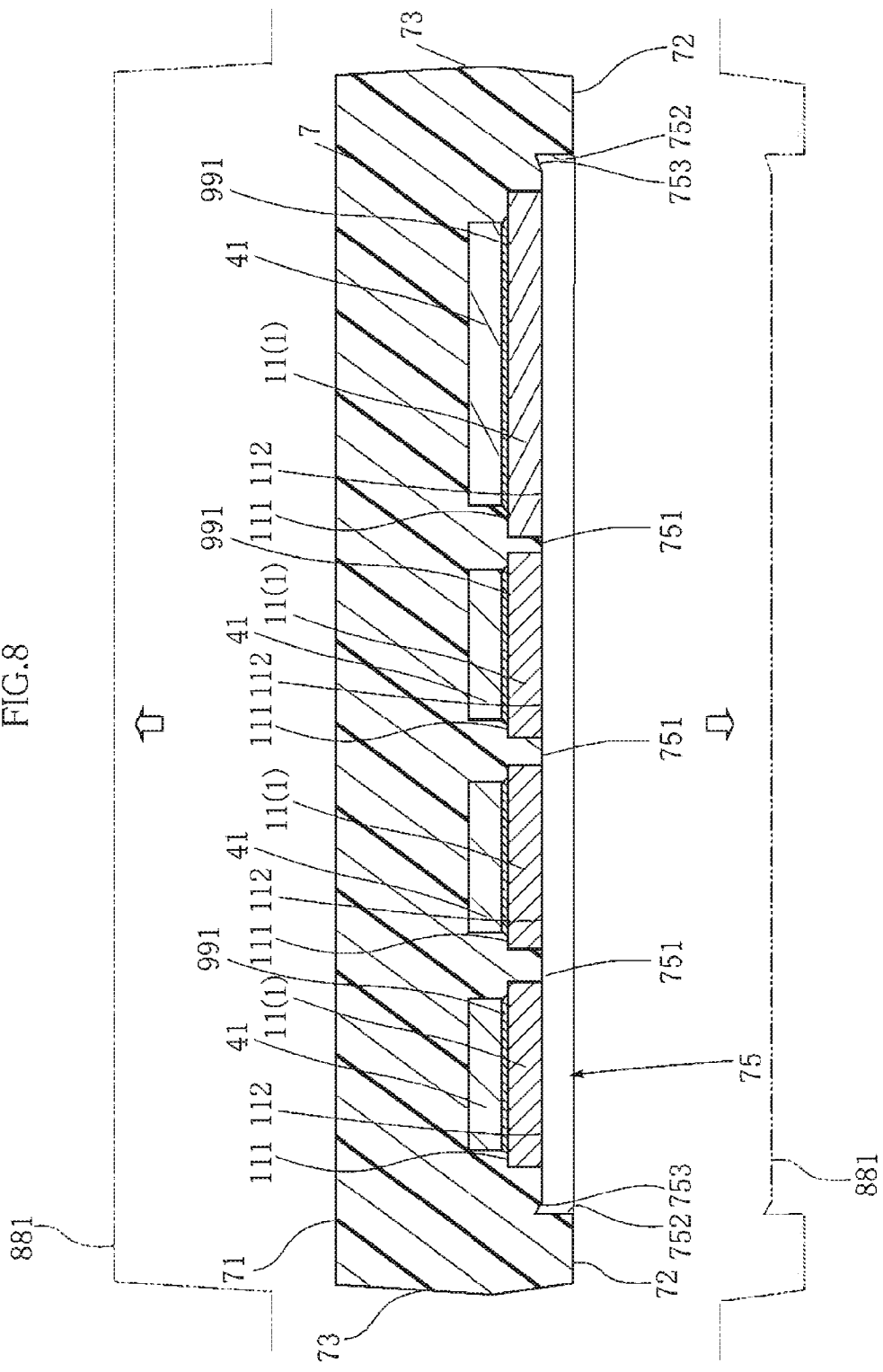
FIG. 8 is a sectional view showing a step which follows the one in FIG. 7.

Next, as shown in FIG. 7 and FIG. 8, a sealing resin portion 7 is formed. As shown in FIG. 7, the formation of the sealing resin portion 7 is performed by means of a molding method using a metal mold 881. As shown in the drawing, the die pads 11 and other components are pressed by the metal mold 881. Next, a resin material is injected into the metal mold 881, and then the resin material is allowed to set. Once the resin material is set, the metal mold 881 is taken away from the die pads 11 and other components as shown in FIG. 8. Thus, the sealing resin portion 7 is formed. In the steps of forming the sealing resin portion 7, a recess 75 is formed in the sealing resin portion 7 for exposure of the die pads 11.

Figure 9:
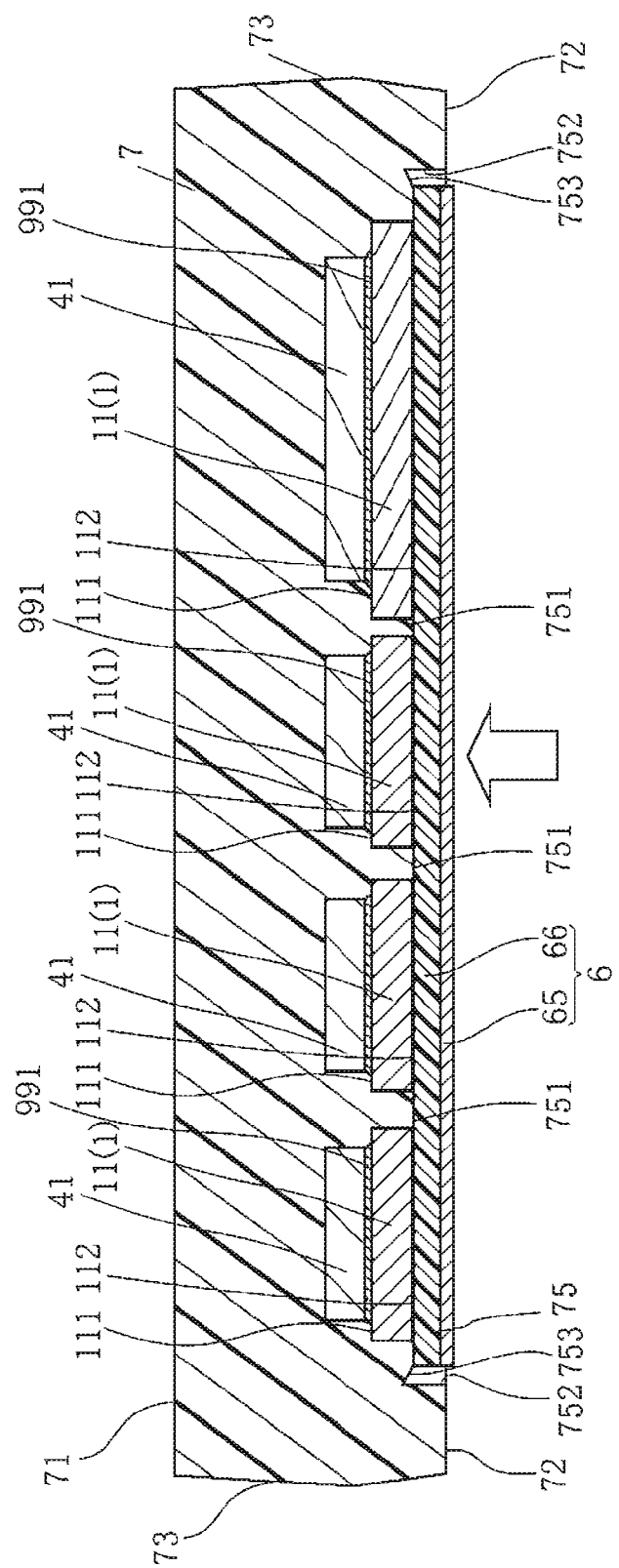
FIG. 9 is a sectional view showing a step which follows the one in FIG. 8.

Next, as shown in FIG. 9, a heat releasing layer 6 is fitted into the recess 75 of the sealing resin portion 7. Then, pressure and vibration are applied to the heat releasing layer 6. The heat releasing layer 6 may be heated, in addition. The pressure, vibration and heat soften the junction layer 66 of the heat releasing layer 6. The softened junction layer 66 moves within the recess 75, with part thereof filling the recess groove 753. Also, the junction layer 66 becomes in contact with the recess side surface 752.

Next, the lead frame 300 shown in FIG. 6 is appropriately cut to complete the manufacture of the semiconductor devices 101A which is illustrated in FIG. 2, etc.

Next, functions of the present embodiment will be described.

According to the semiconductor device 101A, part of the junction layer 66 fills the recess groove 753. To the extent the groove is filled, it is possible to prevent the junction layer 66 from flowing over the recess 75 in the manufacturing step of the semiconductor device 101A. Therefore, it is possible to prevent the junction layer 66 from overflowing to outside of the metal layer 65, and hence to prevent a gap from being made between the heat releasing layer 6 and the heat releasing member 808. Thus, it is possible to efficiently release heat which comes from the semiconductor chips 41, 42.

By disposing the recess groove 753 on an outer side of the metal layer 65, it becomes possible to prevent an unintended gap from being made between the metal layer 65 and the recess groove 753. Eliminating the gap facilitates heat release while making it less likely that the metal layer 65 will come off.

By shaping the recess groove 753 into a taper, it becomes possible to reduce the area of the recess groove 753 which overlaps the metal layer 65 as viewed in the z direction even if there is some misalignment in the x direction or in the y direction when positioning the metal layer 65. This is preferable in eliminating the gap described above.

Figure 11:
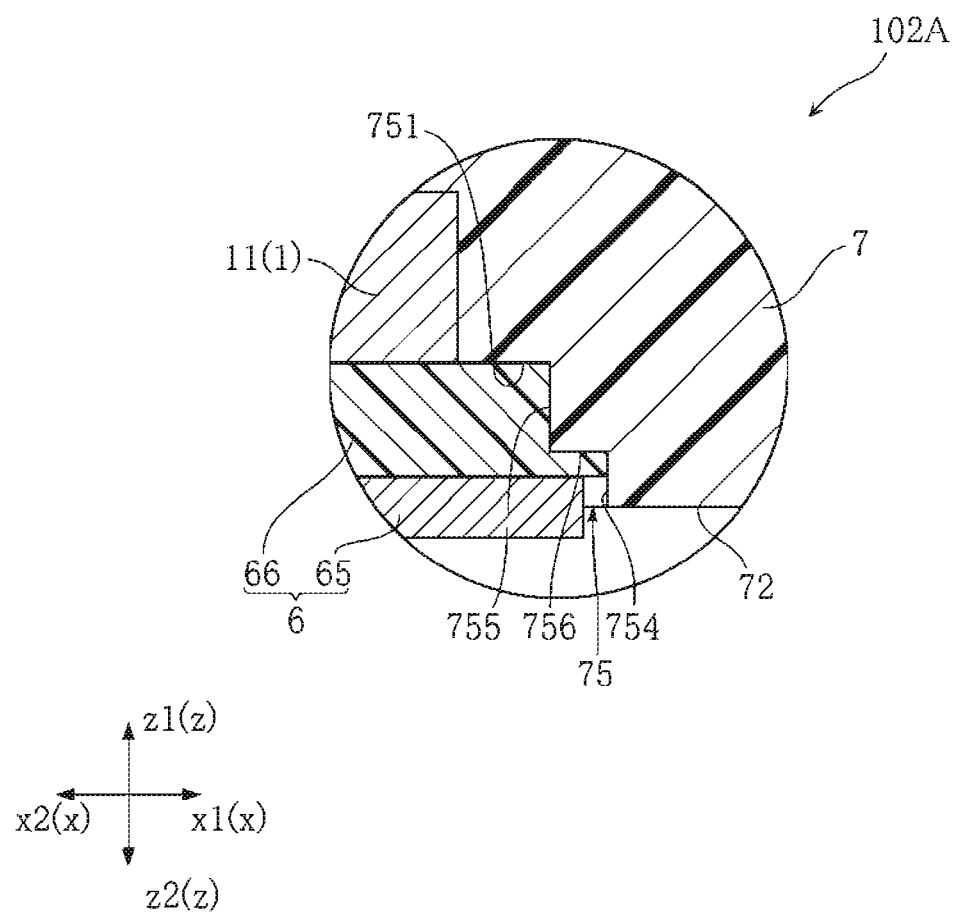
FIG. 11 is an enlarged sectional view taken in lines XI-XI in FIG. 10.

FIG. 10 and FIG. 11 show a semiconductor device according to Embodiment 2A of the present invention. In these figures, elements identical with or similar to those in the previous embodiment described above are indicated by the same reference symbols as in the previous embodiment. A semiconductor device 102A according to the present embodiment differs from the semiconductor device 101A in terms of the recess 75.

In the present embodiment, the recess 75 has a plurality of recess grooves 753 and further, a plurality of the recess first side surfaces 754, the recess second side surfaces 755, and recess support surfaces 756. As shown in FIG. 10, the recess grooves 753, and the recess first side surfaces 754, the recess second side surfaces 755 and the recess support surfaces 756 are disposed alternatingly along an outer edge of the recess 75. The recess first side surfaces 754, the recess second side surfaces 755 and the recess support surfaces 756 are disposed at four corner regions of the recess 75.

As shown in FIG. 11, the recess first side surface 754 is connected to the resin bottom surface 72 and is substantially in a direction z. The recess first side surface 754 is on an outside of the die pad 11 as viewed in the z direction. The recess second side surface 755 is connected to the recess bottom surface 751 and is substantially in the direction z. The recess second side surface 755 is between the die pad 11 and the recess first side surface 754 as viewed in the z direction. The recess support surface 756 connects the recess first side surface 754 and the recess second side surface 755 with each other and faces substantially a direction z2.

In the present embodiment, a region surrounded by the recess second side surfaces 755 is filled with the junction layer 66. Also, part of the junction layer 66 is between the metal layer 65 and the recess support surfaces 756.

The semiconductor device 102A provides the advantages provided by the semiconductor device 101A and in addition, an advantage that the metal layer 65 is supported at least indirectly by the recess support surfaces 756. Therefore, it is possible to prevent such a problem that the metal layer 65 will become unduly slanted with respect to the resin bottom surface 72 or become receded. Thus, it is possible to reduce cases where a gap will be made between the metal layer 65 and the heat releasing member 808 which is tightly fitted thereto, and to increase heat release from the semiconductor chips 41, 42.

By providing the junction layer 66 between the metal layer 65 and the recess support surfaces 756, it becomes possible to reliably fix the metal layer 65 to the sealing resin portion 7. If the junction layer 66 has any end regions not covered by the metal layer 65, such a region can be a place where the metal layer 65 will start to come off. Such a likelihood is low according to the present embodiment.

The present invention is not limited to the Embodiments described above. The present invention may be varied in many ways in any specific details. For example, as far as the metal layer is exposed from the sealing resin rear surface, the semiconductor device may not necessarily be of an insertion mounting type but may have terminals for surface mounting. Also, the invention is applicable not only to IPM devices mentioned earlier but also to a semiconductor device which includes only one semiconductor chip and an island but has a metal layer exposed from a rear surface of a sealing resin.

FIG. 12 is a sectional view showing a packaging structure when use is made of a semiconductor device according to Embodiment 1B of the present invention.

A semiconductor device packaging structure 801 shown in FIG. 12 includes a semiconductor device 101B, a substrate 807 and a heat releasing member 808.

The substrate 807 is capable of having a plurality of electric components mounted thereon. The substrate 807 is made of an insulating material. The substrate 807 is formed with an unillustrated wiring pattern. The substrate 807 is formed with a plurality of holes 809. The heat releasing member 808 is made of a material which has a relatively high heat conductivity like a metal such as aluminum. The heat releasing member 808 is fixed to the substrate 807 by an unillustrated supporting member. The semiconductor device 101B is mounted on the substrate 807. In the present embodiment, the semiconductor device 101B is a so called IPM (Intelligent Power Module) product. The semiconductor device 101B is used for such an application as electric power source control in an air conditioner, a motor controller, etc.

Figure 13:
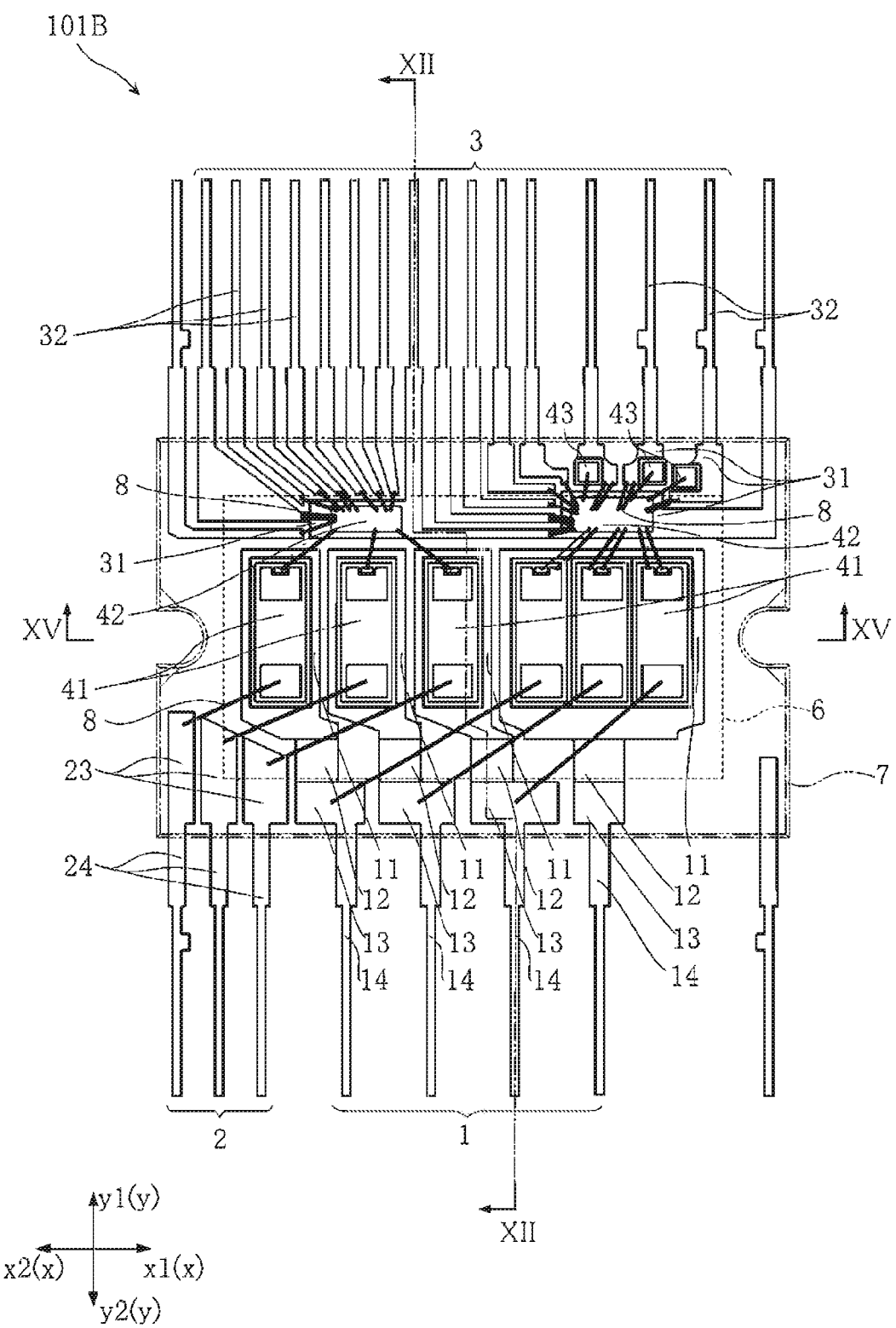
FIG. 13 is a plan view (partially unillustrated) of a semiconductor device according to Embodiment 1B of the present invention, before leads are bent.
Figure 14:
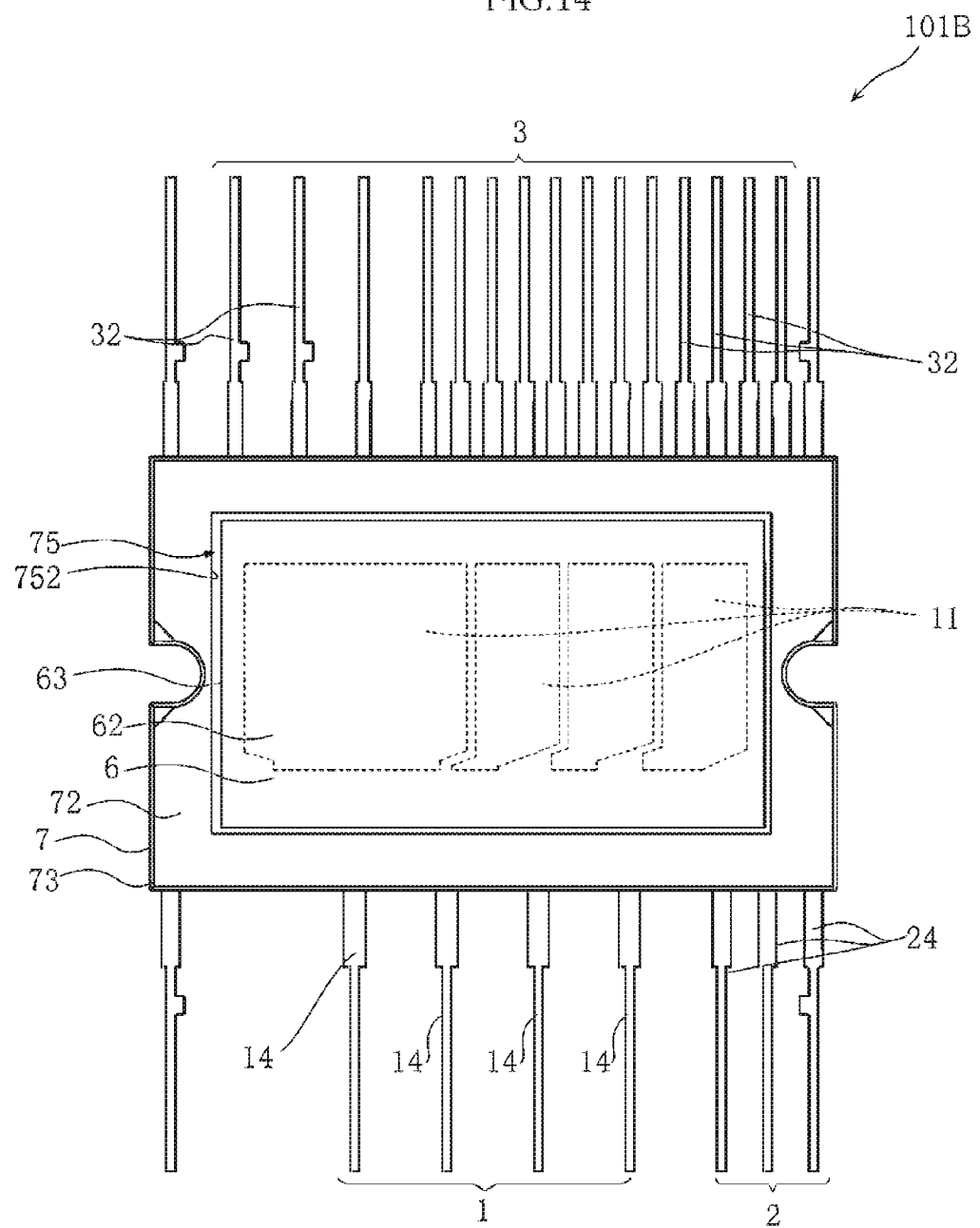
FIG. 14 is a bottom view of a semiconductor device according to Embodiment 1B of the present invention, before the leads are bent.
Figure 15:
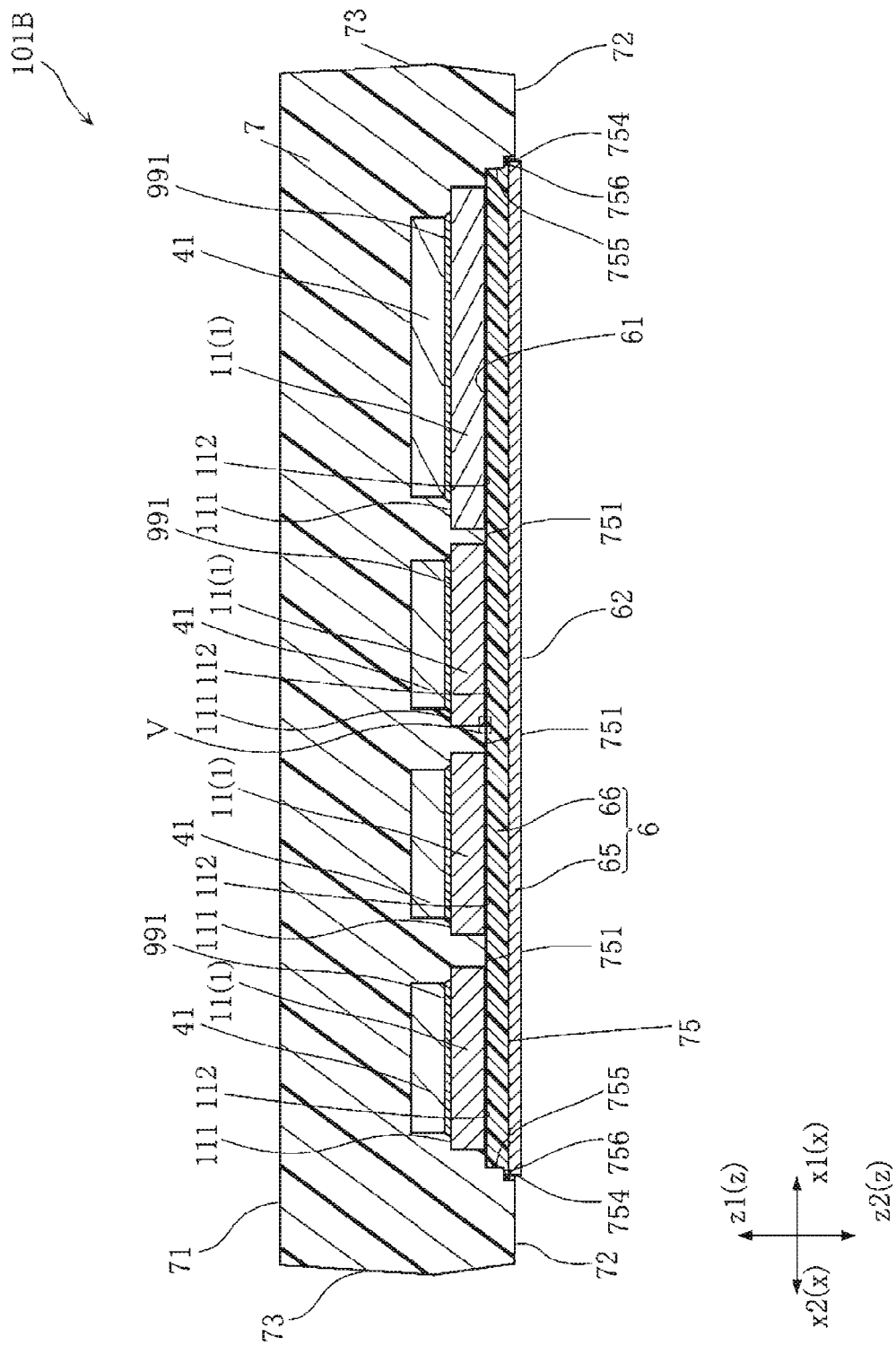
FIG. 15 is a sectional view taken in lines XV-XV in FIG. 13.
Figure 16:
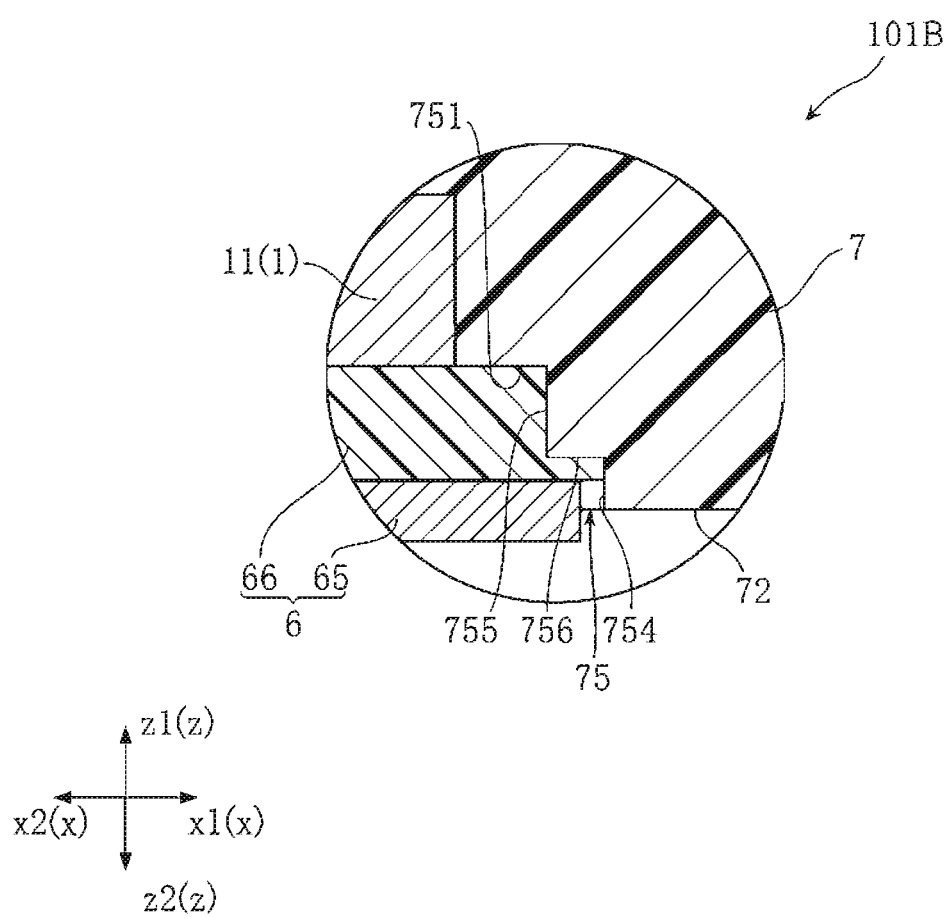
FIG. 16 is an enlarged sectional view of a primary portion taken from FIG. 15.

FIG. 13 is a plan view (partially unillustrated) of the semiconductor device according to Embodiment 1B of the present invention, before leads are bent. FIG. 14 is a bottom view of the semiconductor device according to Embodiment 1B of the present invention, before the leads are bent. FIG. 15 is a sectional view taken in lines XV-XV in FIG. 13. FIG. 16 is an enlarged sectional view of a primary portion taken from FIG. 15. FIG. 12 represents a section taken in lines XII-XII in FIG. 13. In FIG. 15, each component is illustrated schematically for easier comprehension.

The semiconductor device 101B shown in these drawings includes a plurality of first electrode portions 1, second electrode portions 2 and third electrode portions 3; a plurality of semiconductor chips 41, 42; passive component chips 43; a heat releasing layer 6; a sealing resin portion 7 and wires 8. FIG. 13 shows the heat releasing layer 6 in broken lines and the sealing resin portion 7 in imaginary lines.

The sealing resin portion 7 covers the plurality of the first electrode portions 1, the second electrode portions 2, and the third electrode portions 3; the semiconductor chips 41, 42; and the passive component chips 43. The sealing resin portion 7 is made of a black epoxy resin for example. As shown in FIG. 14 and FIG. 15, the sealing resin portion 7 has a resin main surface 71, a resin bottom surface 72 and a resin side surface 73.

The resin main surface 71 is a flat surface which faces in a direction z1 and extends along an xy plane. The resin bottom surface 72 is a flat surface which faces in a direction z2 that is opposite to the direction z1 and extends along an xy plane. The resin side surface 73 surrounds the semiconductor chips 41, 42 and the passive component chips 43 in xy-plane view. The resin side surface 73 is connected to the resin main surface 71 and the resin bottom surface 72.

As clearly shown in FIG. 15, the sealing resin portion 7 is formed with a recess 75. The recess 75 recedes from the resin bottom surface 72. The recess 75 has a recess bottom surface 751, a recess first side surface 754, a recess second side surface 755 and a recess support surface 756. The recess bottom surface 751 extends along an xy plane. The recess side surface 752 is connected to the resin bottom surface 72.

As shown in FIG. 16, the recess first side surface 754 is connected to the resin bottom surface 72 and is substantially in a direction z. The recess first side surface 754 is on an outside of the die pad 11 as viewed in the z direction. The recess second side surface 755 is connected to the recess bottom surface 751 and is substantially in the direction z. The recess second side surface 755 is between the die pad 11 and the recess first side surfaces 754 as viewed in the z direction. The recess support surface 756 connects the recess first side surfaces 754 and the recess second side surfaces 755 with each other and faces substantially a direction z2.

As shown in FIG. 13, the semiconductor chips 41, 42 and the passive component chips 43 are rectangular in plan view. The semiconductor chip 41 is a power chip such as an IGBT, MOS, and diode. The semiconductor chip 42 is an LSI chip such as a control IC. The passive component chips 43 are, for example, resisters, capacitors or other passive components.

The first electrode portions 1, the second electrode portions 2 and the third electrode portions 3 in FIG. 13 are all made of an electrically conductive material. An example of such an electrically conductive material is copper. The electrode portion shown in a bottom right region in FIG. 13 is grounded.

Each of the plurality (four, in the present embodiment) of the first electrode portions 1 includes a die pad 11 (see FIG. 12, FIG. 13 and FIG. 15), a connecting region 12 (see FIG. 12 and FIG. 13), a wire bonding region 13 (see FIG. 12 and FIG. 13) and a lead 14 (see FIG. 12 through FIG. 14). The first electrode portions 1 are spaced from each other in the direction x.

Each die pad 11 is a flat plate extending along and parallel to an xy plane. The semiconductor chip 41 is disposed on the die pad 11. As shown in FIG. 15, a junction layer 991 is between the die pad 11 and the semiconductor chip 41. The junction layer 991 is made of an electrically conductive material. The electrically conductive material is provided by solder or silver paste, for example. Solder has a relatively large thermal conductivity. Use of solder as the junction layer 991 enables efficient heat conduction from the semiconductor chip 41 to the die pad 11. Each of the die pads 11 is exposed from the recess bottom surface 751.

Each die pad 11 has a die pad main surface 111 and a die pad rear surface 112. The die pad main surface 111 faces in the direction z1 whereas the die pad rear surface 112 faces in the direction z2. In other words, the die pad main surface 111 and the die pad rear surface 112 are arranged to face in the mutually opposite directions. The semiconductor chip 41 is disposed on the die pad main surface 111. A junction layer 991 is between the die pad main surface 111 and the semiconductor chip 41. The die pad rear surface 112 is located at the same position as the recess bottom surface 751 in a thickness direction (the direction z) of the die pad 11. However, the die pad rear surface 112 may be closer to an opening of the recess 75 than is the recess bottom surface 751.

As shown in FIG. 13, each connecting region 12 is disposed between the die pad 11 and the wire bonding region 13, and connected to the die pad 11 and to the wire bonding region 13. As shown in FIG. 12, the connecting region 12 extends along a plane which is inclined with respect to an xy plane. The connecting region 12 is inclined with respect to an xy plane in such a manner that it goes farther in the direction z1 as it is further away from the die pad 11.

Each wire bonding region 13 shown in FIG. 12 and FIG. 13 extends along an xy plane. In the direction z, each wire bonding region 13 is on a side more toward the direction z1 than is the die pad 11. A wire 8 is bonded to one of the wire bonding regions 13 and to one of the semiconductor chips 41. Thus, electrical conductivity is established between said one of the wire bonding regions 13 and said one of the semiconductor chips 41. The leads 14 are connected to the wire bonding regions 13. Each lead 14 extends along the direction y. The lead 14 has a portion extending out of the resin side surface 73 of the sealing resin portion 7. In the present embodiment, the leads 14 are for insertion mounting. As shown in FIG. 12, when mounting the semiconductor device 101B on the substrate 807, the leads 14 are bent and inserted through the holes 809. For fixing the leads 14 in the substrate 807, the holes 809 are filled with solder layers 810.

As shown in FIG. 13, each of the plurality (three, in the present embodiment) of the second electrode portions 2 includes a wire bonding region 23 and a lead 24. The second electrode portions 2 are spaced from each other in the direction x.

Each wire bonding region 23 extends along an xy plane. In the direction z, each wire bonding region 23 is on a side more toward the direction z1 than is the die pad 11. A wire 8 is bonded to one of the wire bonding regions 23 and to one of the semiconductor chips 41. Thus, electrical conductivity is established between said one of the wire bonding regions 23 and said one of the semiconductor chips 41. The leads 24 are connected to the wire bonding regions 23. Each lead 24 extends along the direction y. The lead 24 has a portion extending out of the resin side surface 73 of the sealing resin portion 7. In the present embodiment, the leads 24 are for insertion mounting. Though not illustrated, when mounting the semiconductor device 101B on the substrate 807, the leads 24 are bent and inserted through the holes 809 like the leads 14.

The third electrode portions 3 shown in FIG. 12, FIG. 13 includes a plurality of control die pads 31 and a plurality of leads 32. The control die pads 31 and the leads 32 are respectively disposed at the same positions in the direction 2.

On each control die pad 31, the semiconductor chip 42 or the passive component chips 43 is disposed. A junction layer (not illustrated) is formed between the control die pad 31 and the semiconductor chip 42, and between the control die pads 31 and the passive component chips 43. The control die pads 31 need not have its rear surface faced to the heat releasing layer 6 or exposed.

Each lead 32 has a portion extending out of the resin side surface 73 of the sealing resin portion 7. In the present embodiment, the leads 32 are for insertion mounting. As shown in FIG. 12, when mounting the semiconductor device 101B on the substrate 807, the leads 32 are bent and inserted through the holes 809. As has been described in relation with the leads 14, the holes 809 are filled with solder layers 810 for fixing the leads 32 in the substrate 809. A wire 8 is bonded to one of the leads 32 and to one of the semiconductor chips 42. Thus, electrical conductivity is established between said one of the leads 32 and said one of the semiconductor chips 42. Also, a wire 8 is bonded to one of the semiconductor chip 42 and to one of the passive component chips 43.

As shown in FIG. 15, the heat releasing layer 6 is in the recess 75 in the sealing resin portion 7. The heat releasing layer 6 is surrounded by the recess first side surface 754 and the recess second side surface 755. In the present embodiment, the heat releasing layer 6 is a flat plate extending along and parallel to an xy plane. In the present embodiment, the heat releasing layer 6 is constituted by the metal layer 65 and the junction layer 66. The metal layer 65 is on a side toward the z2 direction, and is made of Cu, aluminum or ceramics, for example, having a thickness of approximately 105 μm. The metal layer 65 represents an example of the heat releasing layer so termed in the present invention. The junction layer 66 is on a side toward the z1 direction with respect to the metal layer 65 and joins the metal layer 65 to the die pad rear surfaces 112 of the die pads 11. The junction layer 66 is made of an insulating resin for example, and has a thickness of approximately 250 μm for example. The resin becomes soft when it receives pressure and vibration in a manufacturing step of the semiconductor device 101B. The junction layer 66 is in direct contact with all of the die pads 11 on which the semiconductor chips 41 are mounted. The metal layer 65 may have a region slightly out of the resin bottom surface 72. As shown in FIG. 16, part of the junction layer 66 fills a region surrounded by the recess second side surface 755. Also, in the present embodiment, part of the junction layer 66 is between the recess support surfaces 756 and the metal layer 65.

The heat releasing layer 6 is for quickly releasing heat which was generated in the semiconductor chip 41 to outside of the semiconductor device 101B. In order to quickly release the heat generated by the semiconductor chip 41 to outside of the semiconductor device 101B, the heat releasing layer 6 should be made of a material of a large thermal conductivity. While a larger thermal conductivity is preferred, there can be a potential problem that the metal layer 65 will peel off, if the heat releasing layer's thermal expansion coefficient differs greatly from that of the sealing resin portion 7. Preferably, therefore, the heat releasing layer 6 is of a material which has a larger thermal conductivity than that of a material which constitutes the sealing resin portion 7, and a similar thermal expansion coefficient to that of the material which constitutes the sealing resin portion 7. The heat releasing layer 6 is faced directly to all of the die pads 11. As shown in FIG. 14, the heat releasing layer 6 covers all of the die pads 11 entirely in xy plane view (i.e., as viewed in the thickness direction of the heat releasing layer 6).

As shown in FIG. 14 and FIG. 15, the heat releasing layer 6 has a heat releasing layer main surface 61 and a heat releasing layer rear surface 62. The heat releasing layer main surface 61 faces in the direction z1. The heat releasing layer main surface 61 covers the die pad rear surfaces 112 and the recess bottom surfaces 751 of all of the die pads 11 in xy-plane view. The heat releasing layer main surface 61 is in direct contact with the die pad rear surface 112 and the recess bottom surface 751. The heat releasing layer rear surface 62 faces in the direction z2 which is a direction opposite to the direction in which the heat releasing layer main surface 61 faces. The heat releasing layer rear surface 62 is not covered by the sealing resin portion 7 and is exposed from the sealing resin portion 7.

Next, a method of making the semiconductor device 101B will be described. Drawings for describing the method will use the same reference symbols as those used thus far in identifying those described thus far.

Figure 17:
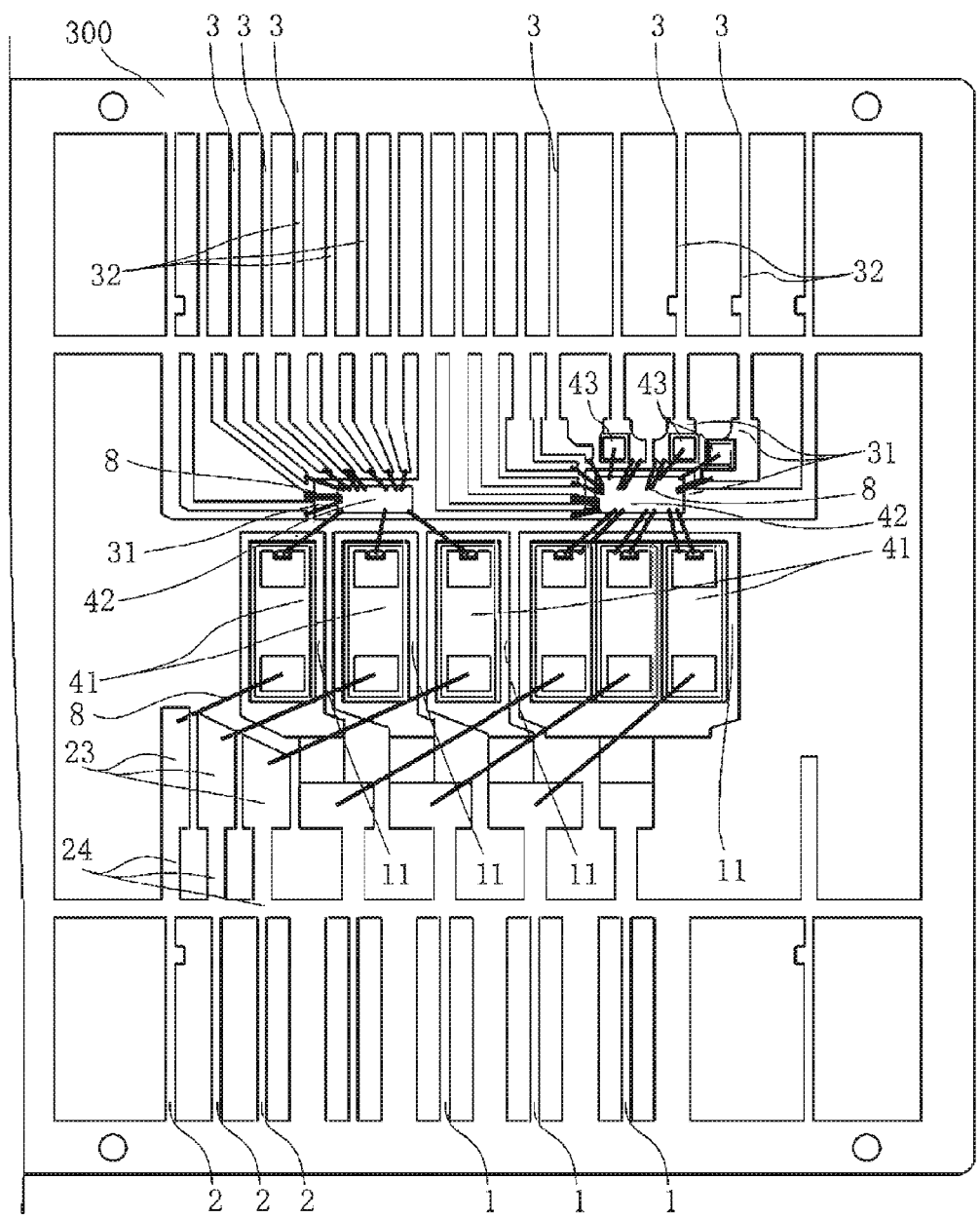
FIG. 17 is a plan view showing a manufacturing step of the semiconductor device according to Embodiment 1B of the present invention.

First, as shown in FIG. 17, a lead frame 300 which includes a plurality of die pads 11, 31; and a plurality of semiconductor chips 41, 42 and passive component chips 43 is prepared. Next, as shown in the drawing, each of the semiconductor chips 41 is disposed on one of the die pads 11 via the junction layer (not illustrated). Likewise, each of the semiconductor chip 42 and the passive component chips 43 is disposed on one of the control die pads 31 via the junction layer (not illustrated). Next, as shown in the drawing, a wire 8 is bonded to each of the semiconductor chips 41, 42 and other components.

Figure 18:
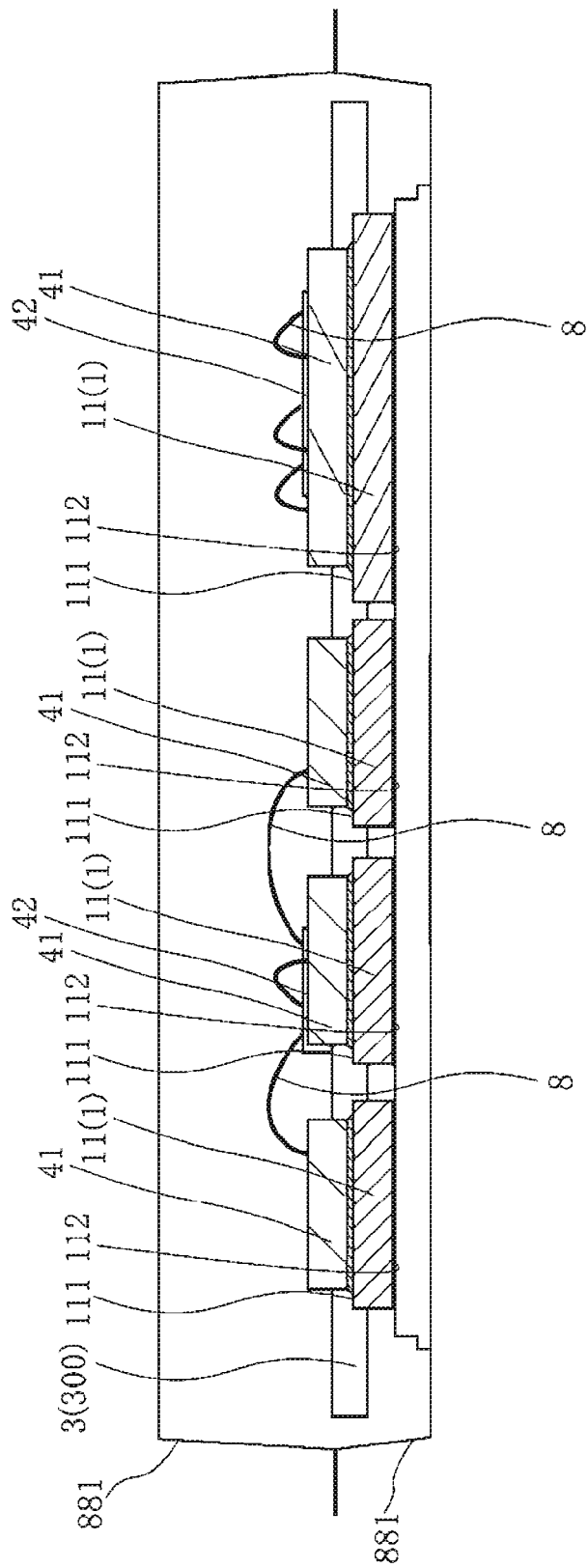
FIG. 18 is a sectional view showing a step which follows the one in FIG. 17.
Figure 19:
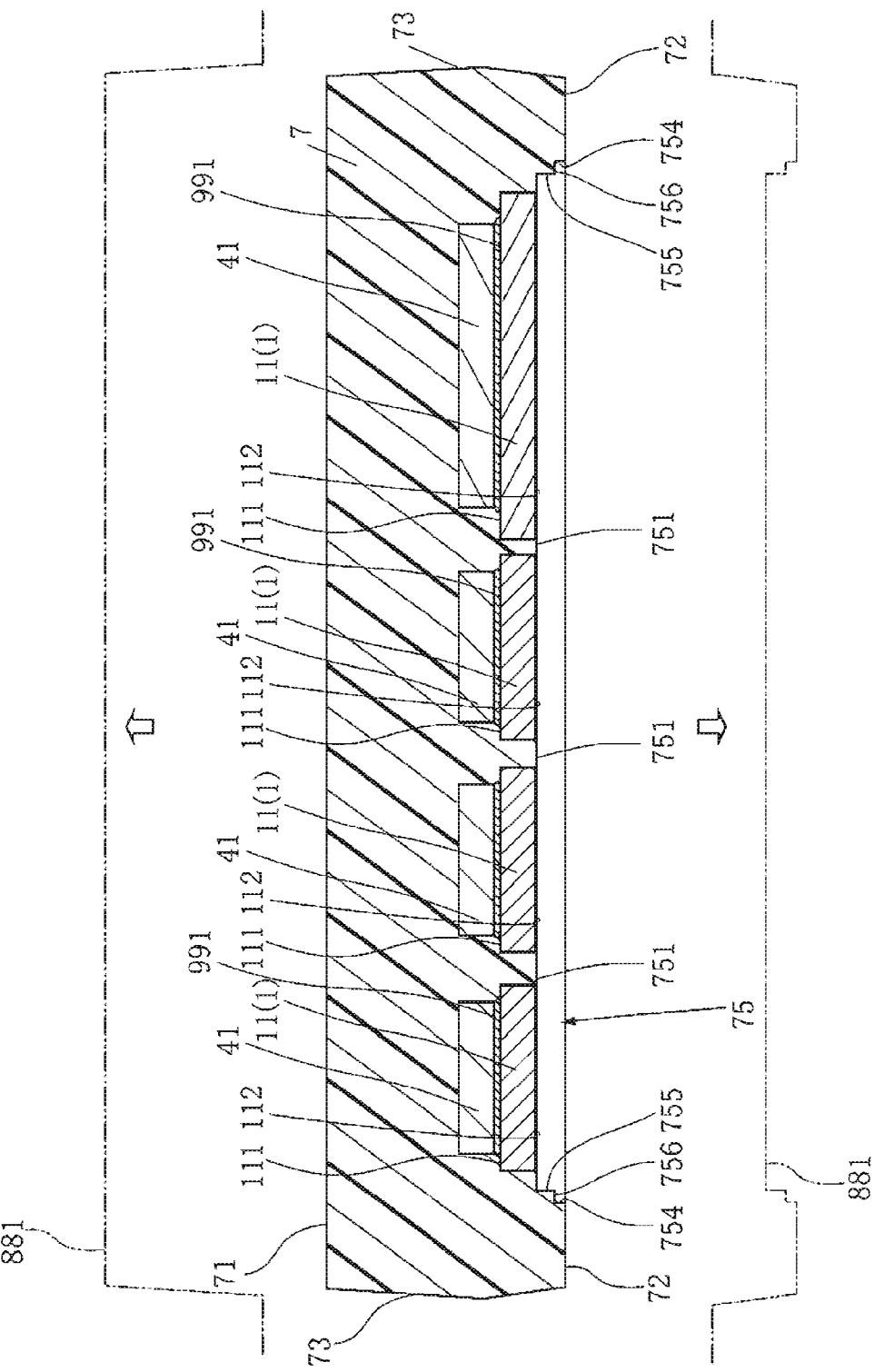
FIG. 19 is a sectional view showing a step which follows the one in FIG. 18.

Next, as shown in FIG. 18 and FIG. 19, a sealing resin portion 7 is formed. As shown in FIG. 18, the formation of the sealing resin portion 7 is performed by means of a molding method using a metal mold 881. As shown in the drawing, the die pads 11 and other components are held inside the metal mold 881. Next, a resin material is injected into the metal mold 881, and then the resin material is allowed to set. Once the resin material is set, the metal mold 881 is taken away from the die pads 11 and other components as shown in FIG. 19. Thus, the sealing resin portion 7 is formed. In the steps of forming the sealing resin portion 7, a recess 75 is formed in the sealing resin portion 7 for exposure of the die pads 11.

Figure 20:
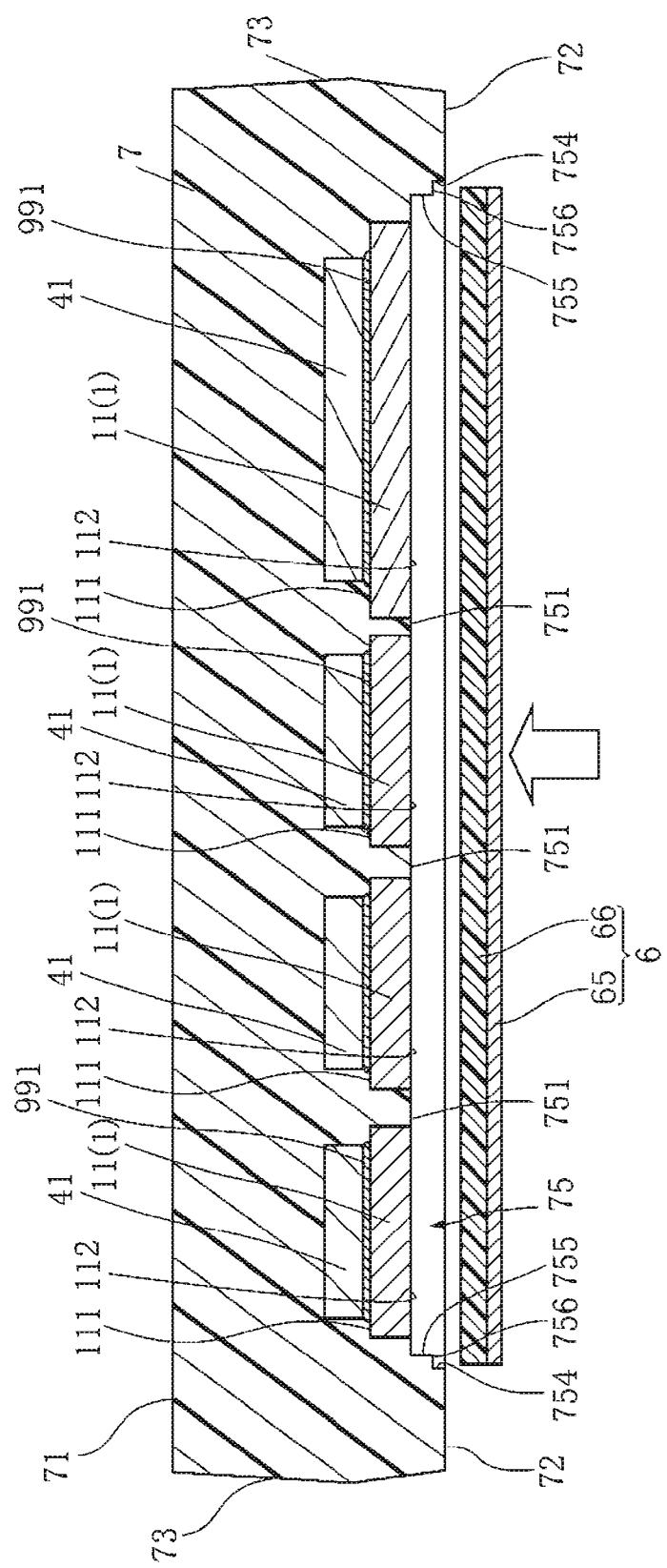
FIG. 20 is a sectional view showing a step which follows the one in FIG. 19.

Next, as shown in FIG. 20, a heat releasing layer 6 is fitted into the recess 75 of the sealing resin portion 7. Then, pressure and vibration are applied to the heat releasing layer 6. The heat releasing layer 6 may be heated, in addition. The pressure, vibration and heat soften the junction layer 66 of the heat releasing layer 6. The softened junction layer 66 moves within the recess 75, with part thereof filling a region surrounded by the recess second side surfaces 755. Also, part of the junction layer 66 moves into a space between the recess support surface 756 and the metal layer 65.

Next, the lead frame 300 shown in FIG. 17 is appropriately cut to complete the manufacture of the semiconductor devices 101B which is illustrated in FIG. 13, etc.

Next, functions of the present embodiment will be described.

According to the semiconductor device 101B, the metal layer 65 is supported at least indirectly by the recess support surfaces 756. Therefore, it is possible to prevent such a problem that the metal layer 65 will become unduly slanted with respect to the resin bottom surface 72 or become receded. Therefore, it is possible to reduce cases where the junction layer 66 overflows to outside of the metal layer 65 to cause a gap to be made between the metal layer 65 and the heat releasing member 808. Thus, it is possible to increase heat release from the semiconductor chips 41, 42, and to decrease separation of the metal layer.

By providing the junction layer 66 between the metal layer 65 and the recess support surfaces 756, it becomes possible to reliably fix the metal layer 65 to the sealing resin portion 7. If the junction layer 66 has any end regions not covered by the metal layer 65, such a region can be a place where the metal layer 65 will start to come off. Such a likelihood is low according to the present embodiment.

Figure 21:
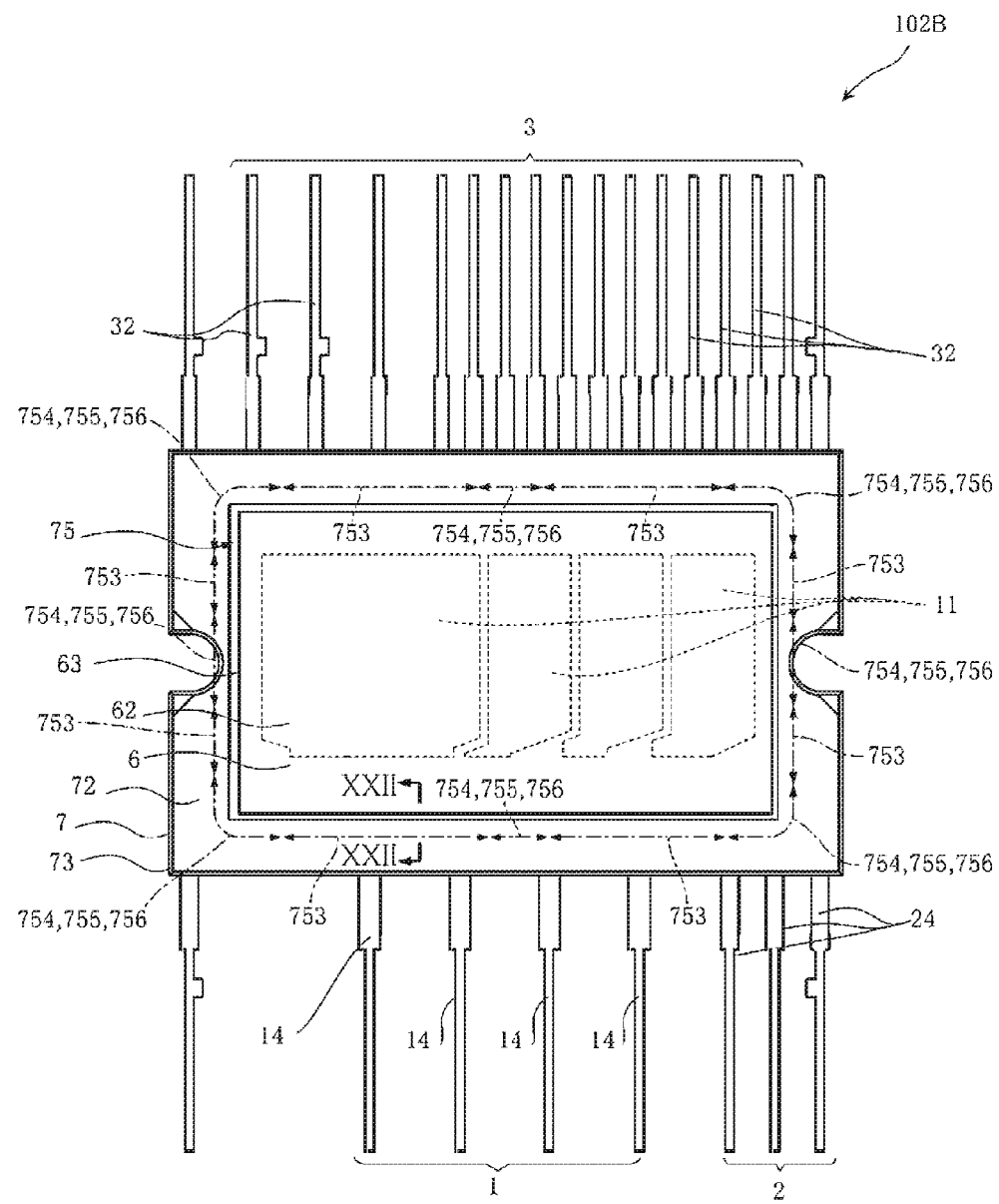
FIG. 21 is a bottom view of a semiconductor device according to Embodiment 2B of the present invention, before leads are bent.

FIG. 21 and FIG. 22 show a semiconductor device according to Embodiment 2B of the present invention. In these figures, elements identical with or similar to those in the previous embodiment described above are indicated by the same reference symbols as in the previous embodiment. A semiconductor device 102B according to the present embodiment differs from the semiconductor device 101B in terms of the recess 75.

In the present embodiment, the recess 75 has a plurality of recess first side surfaces 754, recess second side surfaces 755, and recess support surfaces 756, and further, a plurality of recess side surfaces 752 and recess grooves 753. As shown in FIG. 21, the recess grooves 753, and the recess first side surfaces 754, the recess second side surfaces 755 and the recess support surfaces 756 are disposed alternatingly along an outer edge of the recess 75. The recess first side surfaces 754, the recess second side surfaces 755 and the recess support surfaces 756 are disposed at four corner regions of the recess 75.

As shown in FIG. 22, the recess groove 753 is between the recess bottom surface 751 and the recess side surface 752, and in the present embodiment, is disposed in a rectangular-annular pattern along an outer edge of the recess 75 as viewed in the z direction. As shown in FIG. 22, the recess groove 753 recedes from the recess bottom surface 751 in a z1 direction. In the present embodiment, the recess groove 753 is slanted in such a manner that as it goes away from the recess bottom surface 751 in the x direction, it also goes away from the surface 751 in the z1 direction. The recess groove 753 has a maximum depth of approximately 50 μm for example.

In the present embodiment, part of the junction layer 66 fills the recess groove 753. Also, the heat releasing layer 66 is in contact with the recess side surface 752.

According to the semiconductor device 102B, in addition to those advantages provided by the semiconductor device 101B, part of the junction layer 66 fills the recess groove 753. To the extent the groove is filled, it is possible to prevent the junction layer 66 from flowing over the recess 75 in the manufacturing step of the semiconductor device 101B. Therefore, it is possible to prevent a gap from being made between the heat releasing layer 6 and the heat releasing member 808 which is tightly fitted thereto, and efficiently release heat which comes from the semiconductor chips 41, 42.

By disposing the recess groove 753 on an outer side of the metal layer 65, it becomes possible to prevent an unintended gap from being made between the metal layer 65 and the recess groove 753. Eliminating the gap is suitable for increasing heat release.

By shaping the recess groove 753 into a taper, it becomes possible to reduce the area of the recess groove 753 which overlaps the metal layer 65 as viewed in the z direction even if there is some misalignment in the x direction or in the y direction when positioning the metal layer 65. This preferable in eliminating the gap described above.

The present invention is not limited to the Embodiments described above. The present invention may be varied in many ways in any specific details. For example, as far as the metal layer is exposed from the sealing resin rear surface, the semiconductor device may not necessarily be of an insertion mounting type but may have terminals for surface mounting. Also, the invention is applicable not only to IPM devices mentioned earlier but also to a semiconductor device which includes only one semiconductor chip and an island, but has a metal layer exposed from a rear surface of a sealing resin.

(Appendix 1) A semiconductor device comprising: a die pad having a main surface and a rear surface facing in opposite directions; a semiconductor chip mounted on the main surface of the die pad; a sealing resin portion which is formed with a recess receding from a resin bottom surface, exposes the rear surface of the die pad yet covers the die pad and the semiconductor chip; and a heat releasing layer disposed in the recess; wherein the recess has: a first side surface which is positioned on an outer side than is the die pad in a direction in which the rear surface extends, and is connected to the resin bottom surface; a support surface which is connected to the first side surface and faces in a direction in which the rear surface faces; and a second side surface which is connected to the support surface and is between the die pad and the first side surface in the direction in which the rear surface extends whereas the heat releasing layer includes: a heat releasing layer which has an outer edge with at least part thereof located between the first side surface and the second side surface in the direction in which the rear surface extends, and overlaps the first side surface in a thickness direction of the die pad; and a junction layer between the heat releasing layer and the die pad. (Appendix 2) The semiconductor device according to Appendix 1, wherein the heat releasing layer is made of a metal. (Appendix 3) The semiconductor device according to Appendix 2, wherein the metal is provided by Cu. (Appendix 4) The semiconductor device according to Appendix 2 or 3, wherein the junction layer is made of a resin. (Appendix 5) The semiconductor device according to Appendix 4, wherein part of the junction layer is between the support surface and the heat releasing layer. (Appendix 6) The semiconductor device according to one of Appendices 1 through 5, wherein the recess has a groove which is positioned on an outer side than is the die pad in the direction in which the rear surface extends, and has a region located on a side closer to the main surface than to the rear surface whereas the junction layer has its part filling the groove. (Appendix 7) The semiconductor device according to Appendix 6, wherein the heat releasing layer partially protrudes in its thickness direction, from the recess. (Appendix 8) The semiconductor device according to Appendix 6 or 7, wherein the groove is on an outer side with respect to the heat releasing layer in the direction in which the rear surface extends. (Appendix 9) The semiconductor device according to Appendix 8, wherein the recess includes a recess bottom surface which has a region between the heat releasing layer and the groove. (Appendix 10) The semiconductor device according to one of Appendices 6 through 9, wherein the groove is slanted in such a manner that as it goes away from the die pad in the direction in which the rear surface extends, it comes closer from the rear surface side to the main surface side in the thickness direction of the die pad. (Appendix 11) A semiconductor device comprising: a plurality of die pads each having a main surface and a rear surface facing in opposite directions; a plurality of semiconductor chips each mounted on the main surface of one of the die pads; a sealing resin portion which is formed with a recess receding from a resin bottom surface, commonly exposes the rear surfaces of at least one or more of the die pads yet commonly covers the die pads and the semiconductor chips; and a heat releasing layer disposed in the recess; wherein the recess, on its side facing the rear surface, has: a first side surface which is on an outer side than is any of the die pads and is connected to the resin bottom surface; a support surface which is connected to the first side surface and faces in a direction in which the rear surface faces; and a second side surface which is connected to the support surface and is between the die pad and the first side surface in a direction in which the rear surface extends whereas the heat releasing layer includes: a heat releasing layer which has an outer edge with at least part thereof being between the first side surface and the second side surface in the direction in which the rear surface extends, and overlaps the first side surface in a thickness direction of the die pad; and a junction layer positioned between the heat releasing layer and the die pad.

FIG. 23 is a sectional view showing a packaging structure when use is made of a semiconductor device according to Embodiment 1C of the present invention.

A semiconductor device packaging structure 801 shown in FIG. 23 includes a semiconductor device 101C, a substrate 807 and a heat releasing member 808.

The substrate 807 is capable of having a plurality of electric components mounted thereon. The substrate 807 is made of an insulating material. The substrate 807 is formed with an unillustrated wiring pattern. The substrate 807 is formed with a plurality of holes 809. The heat releasing member 808 is made of a material which has a relatively high heat conductivity like a metal such as aluminum. The heat releasing member 808 is fixed to the substrate 807 by an unillustrated supporting member. The semiconductor device 101C is mounted on the substrate 807. In the present embodiment, the semiconductor device 101C is a so called IPM (Intelligent Power Module) product. The semiconductor device 101C is used for such an application as electric power source control in an air conditioner, a motor controller, etc.

Figure 24:
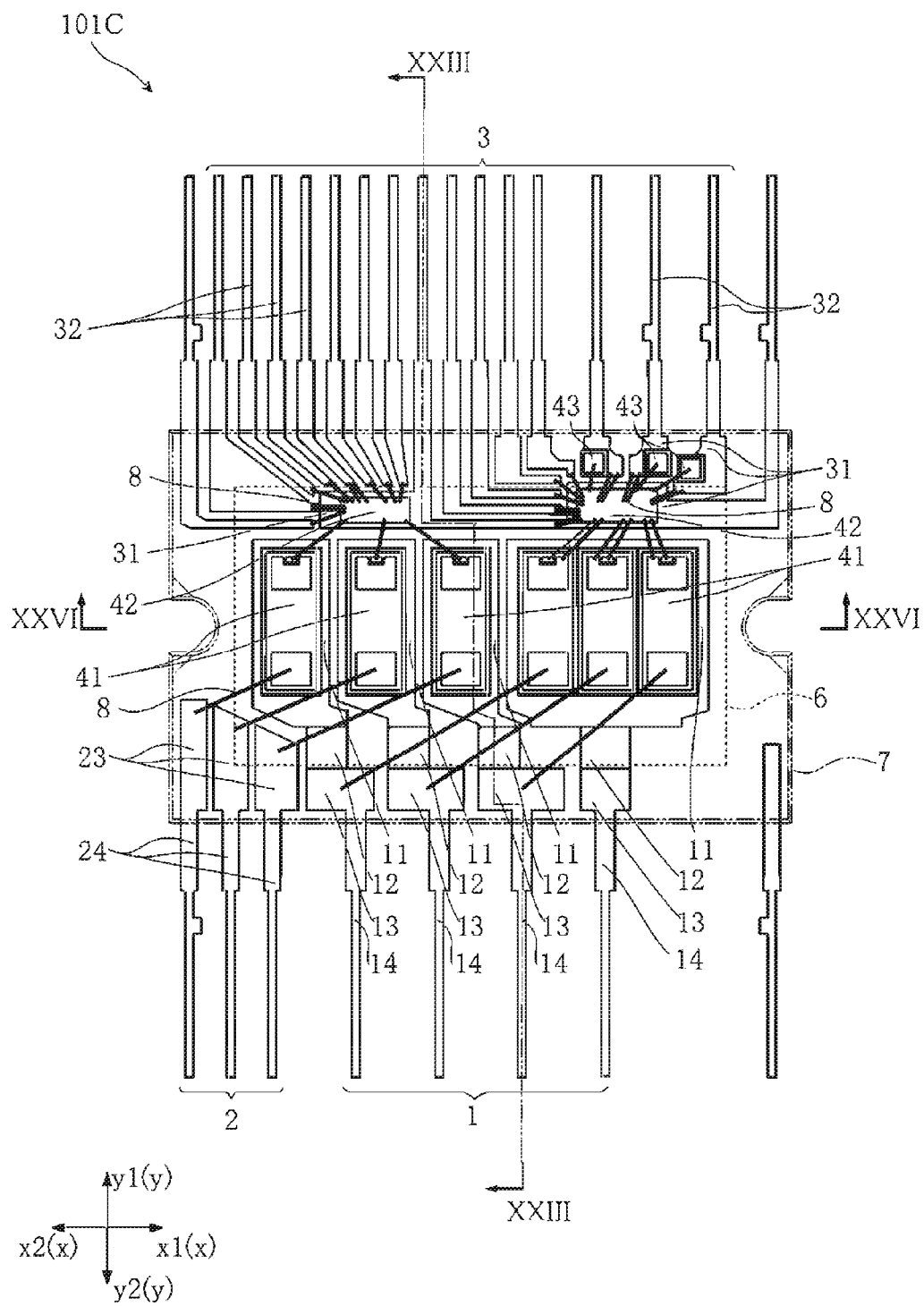
FIG. 24 is a plan view (partially unillustrated) of a semiconductor device according to Embodiment 1C of the present invention, before leads are bent.
Figure 25:
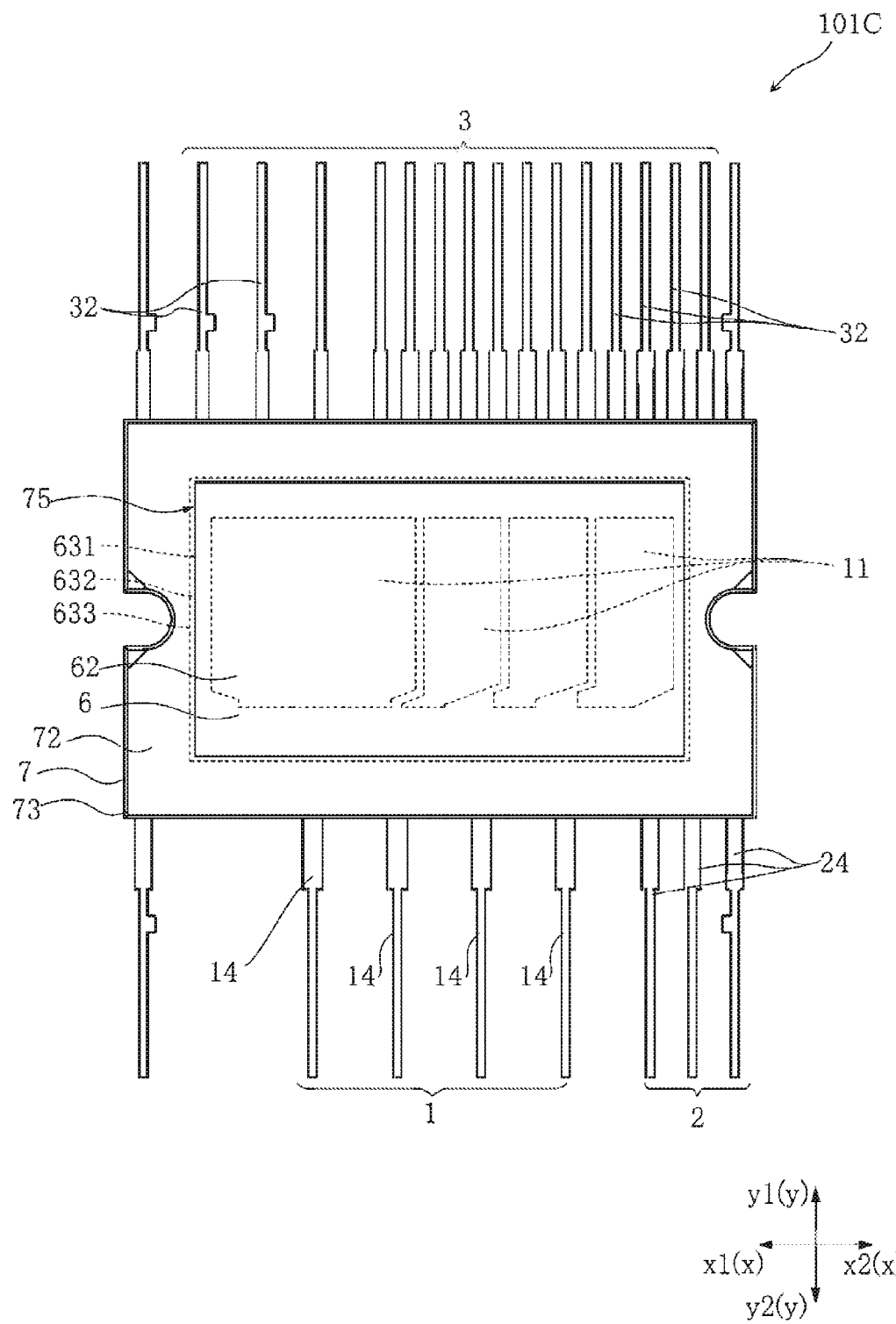
FIG. 25 is a bottom view of a semiconductor device according to Embodiment 1C of the present invention, before the leads are bent.
Figure 26:
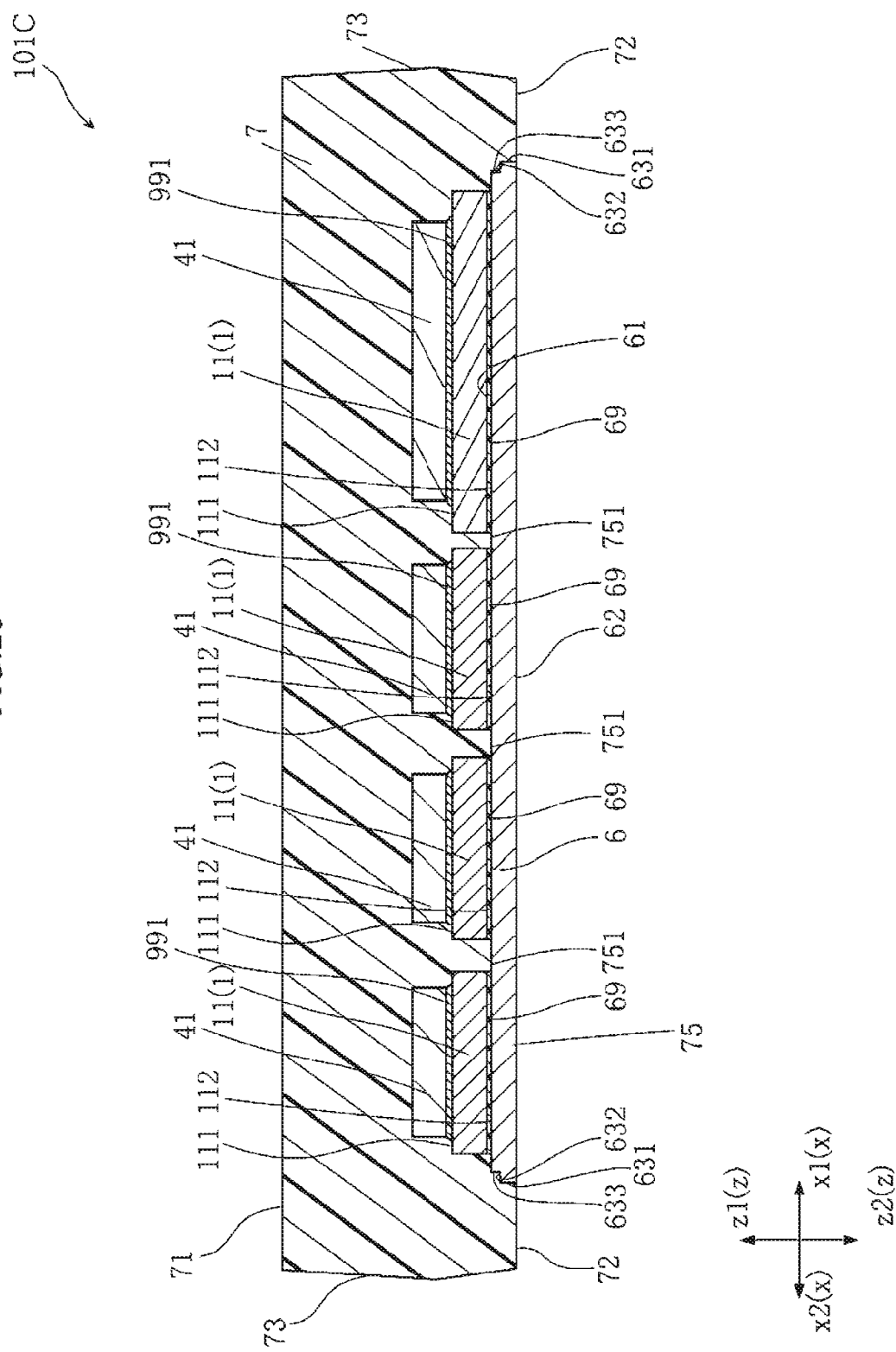
FIG. 26 is a sectional view taken in lines XXVI-XXVI in FIG. 24.

FIG. 24 is a plan view (partially unillustrated) of the semiconductor device according to Embodiment 1C of the present invention, before leads are bent. FIG. 25 is a bottom view of the semiconductor device according to Embodiment 1C of the present invention, before the leads are bent. FIG. 26 is a sectional view taken in lines IIVI-IIVI in FIG. 24. FIG. 27 is an enlarged sectional view of a primary portion taken from FIG. 26. FIG. 23 represents a section taken in lines XXIII-XXIII in FIG. 24. In FIG. 26, each component is illustrated schematically for easier comprehension.

The semiconductor device 101C shown in these drawings includes a plurality of first electrode portions 1, second electrode portions 2 and third electrode portions 3; a plurality of semiconductor chips 41, 42; passive component chips 43; a heat releasing layer 6; a sealing resin portion 7 and wires 8. FIG. 24 shows the heat releasing layer 6 in broken lines and the sealing resin portion 7 in imaginary lines.

The sealing resin portion 7 covers the plurality of the first electrode portions 1, the second electrode portions 2, and the third electrode portions 3; the semiconductor chips 41, 42; and the passive component chips 43. The sealing resin portion 7 is made of a black epoxy resin for example. As shown in FIG. 25 and FIG. 26, the sealing resin portion 7 has a resin main surface 71, a resin bottom surface 72 and a resin side surface 73.

The resin main surface 71 is a flat surface which faces in a direction z1 and extends along an xy plane. The resin bottom surface 72 is a flat surface which faces in a direction z2 that is opposite to the direction z1 and extends along xy plane. The resin side surface 73 surrounds the semiconductor chips 41, 42 and the passive component chips 43 in xy-plane view. The resin side surface 73 is connected to the resin main surface 71 and the resin bottom surface 72.

As clearly shown in FIG. 26, the sealing resin portion 7 is formed with a recess 75. The recess 75 recedes from the resin bottom surface 72. The recess 75 has a recess bottom surface 751. The recess bottom surface 751 extends along an xy plane.

As shown in FIG. 24, the semiconductor chips 41, 42 and the passive component chips 43 are rectangular in plan view. The semiconductor chip 41 is a power chip such as an IGBT, MOS, and diode. The semiconductor chip 42 is an LSI chip such as a control IC. The passive component chips 43 are, for example, resisters, capacitors or other passive components.

The first electrode portions 1, the second electrode portions 2 and the third electrode portions 3 in FIG. 24 are all made of an electrically conductive material. An example of such an electrically conductive material is copper. The electrode portion shown in a bottom right region in FIG. 24 is grounded.

Each of the plurality (four, in the present embodiment) of the first electrode portions 1 includes a die pad 11 (see FIG. 23, FIG. 24 and FIG. 26), a connecting region 12 (see FIG. 23 and FIG. 24), a wire bonding region 13 (see FIG. 23 and FIG. 24) and a lead 14 (see FIG. 23 through FIG. 25). The first electrode portions 1 are spaced from each other in the direction x.

Each die pad 11 is a flat plate extending along and parallel to an xy plane. The semiconductor chip 41 is disposed on the die pad 11. As shown in FIG. 26, a junction layer 991 is between the die pad 11 and the semiconductor chip 41. The junction layer 991 is made of an electrically conductive material. The electrically conductive material is provided by solder or silver paste, for example. Solder has a relatively large thermal conductivity. Use of solder as the junction layer 991 enables efficient heat conduction from the semiconductor chip 41 to the die pad 11. Each of the die pads 11 is exposed from the recess bottom surface 751.

Each die pad 11 has a die pad main surface 111 and a die pad rear surface 112. The die pad main surface 111 faces in the direction z1 whereas the die pad rear surface 112 faces in the direction z2. In other words, the die pad main surface 111 and the die pad rear surface 112 are arranged to face in the mutually opposite directions. The semiconductor chip 41 is disposed on the die pad main surface 111. A junction layer 991 is between the die pad main surface 111 and the semiconductor chip 41. The die pad rear surface 112 is located at the same position as the recess bottom surface 751 in a thickness direction (the direction z) of the die pad 11. However, the die pad rear surface 112 may be closer to an opening of the recess 75 than is the recess bottom surface 751.

As shown in FIG. 24, each connecting region 12 is disposed between the die pad 11 and the wire bonding region 13, and connected to the die pad 11 and to the wire bonding region 13. As shown in FIG. 23, the connecting region 12 extends along a plane which is inclined with respect to an xy plane. The connecting region 12 is inclined with respect to an xy plane in such a manner that it goes farther in the direction z1 as it is further away from the die pad 11.

Each wire bonding region 13 shown in FIG. 23 and FIG. 24 extends along an xy plane. In the direction z, each wire bonding region 13 is on a side more toward the direction z1 than is the die pad 11. A wire 8 is bonded to one of the wire bonding regions 13 and to one of the semiconductor chips 41. Thus, electrical conductivity is established between said one of the wire bonding regions 13 and said one of the semiconductor chips 41. The leads 14 are connected to the wire bonding regions 13. Each lead 14 extends along the direction y. The lead 14 has a portion extending out of the resin side surface 73 of the sealing resin portion 7. In the present embodiment, the leads 14 are for insertion mounting. As shown in FIG. 23, when mounting the semiconductor device 101C on the substrate 807, the leads 14 are bent and inserted through the holes 809. For fixing the leads 14 in the substrate 807, the holes 809 are filled with solder layers 810.

As shown in FIG. 24, each of the plurality (three, in the present embodiment) of the second electrode portions 2 includes a wire bonding region 23 and a lead 24. The second electrode portions 2 are spaced from each other in the direction x.

Each wire bonding region 23 extends along an xy plane. In the direction z, each wire bonding region 23 is on a side more toward the direction z1 than is the die pad 11. A wire 8 is bonded to one of the wire bonding regions 23 and to one of the semiconductor chips 41. Thus, electrical conductivity is established between said one of the wire bonding regions 23 and said one of the semiconductor chips 41. The leads 24 are connected to the wire bonding regions 23. Each lead 24 extends along the direction y. The lead 24 has a portion extending out of the resin side surface 73 of the sealing resin portion 7. In the present embodiment, the leads 24 are for insertion mounting. Though not illustrated, when mounting the semiconductor device 101C on the substrate 807, the leads 24 are bent and inserted through the holes 809 like the leads 14.

The third electrode portions 3 shown in FIG. 23, FIG. 24 includes a plurality of control die pads 31 and a plurality of leads 32. The control die pads 31 and the leads 32 are respectively disposed at the same positions in the direction z. On each control die pad 31, the semiconductor chip 42 or the passive component chips 43 is disposed. A junction layer (not illustrated) is formed between the control die pad 31 and the semiconductor chip 42, and between the control die pads 31 and the passive component chips 43. The control die pads 31 need not have its rear surface faced to the heat releasing layer 6 or exposed.

Each lead 32 has a portion extending out of the resin side surface 73 of the sealing resin portion 7. In the present embodiment, the leads 32 are for insertion mounting. As shown in FIG. 23, when mounting the semiconductor device 101B on the substrate 807, the leads 32 are bent and inserted through the holes 809. As has been described in relation with the leads 14, the holes 809 are filled with solder layers 810 for fixing the leads 32 in the substrate 809. A wire 8 is bonded to one of the leads 32 and to one of the semiconductor chips 42. Thus, electrical conductivity is established between said one of the leads 32 and said one of the semiconductor chips 42. Also, a wire 8 is bonded to one of the semiconductor chip 42 and to one of the passive component chips 43. It should be noted here that wires used for the controlling semiconductor chip 42 or the passive component chips 43 are often provided by fine wires made of aluminum or gold which are finer and softer than the wire 8.

As shown in FIG. 26, the heat releasing layer 6 is in the recess 75 in the sealing resin portion 7. In the present embodiment, the heat releasing layer 6 is a flat plate extending along and parallel to an xy plane. In the present embodiment, the heat releasing layer 6 is made of ceramics, Cu or aluminum. The heat releasing layer 6 has a heat releasing layer main surface 61, a heat releasing layer rear surface 62, a first side surface 631, an intermediate surface 632, and a second side surface 633.

The heat releasing layer main surface 61 faces in the direction z1. The heat releasing layer main surface 61 covers the die pad rear surfaces 112 and the recess bottom surfaces 751 of all of the die pads 11 in xy-plane view. The heat releasing layer rear surface 62 faces in the direction z2 which is a direction opposite to the direction in which the heat releasing layer main surface 61 faces. The heat releasing layer rear surface 62 is not covered by the sealing resin portion 7 and is exposed from the sealing resin portion 7. The heat releasing layer main surface 61 of the heat releasing layer 6 is joined to the die pad rear surface 112 of a plurality of the die pads 11 by the junction layer 69. The junction layer 69 is made of a resin for example.

As shown in FIG. 26 and FIG. 27, the first side surface 631 is connected to the heat releasing layer rear surface 62 and extends substantially in a direction z. The first side surface 631 is on an outside of the die pad 11 as viewed in the z direction. The second side surface 633 is connected to heat releasing layer main surface 61 and extends substantially in the direction z. The second side surface 633 is between the die pad 11 and the first side surface 754 as viewed in the z direction. The intermediate surface 632 connects the first side surface 631 and the second side surface 633 with each other and faces substantially a direction z2. In order to make sure that the present invention provides its intended function, it is preferable that a dimension of the first side surface 631 in the direction z is greater than a dimension of the second side surface 633 in the direction z.

All of the first side surface 631, the intermediate surface 632 and the second side surface 633 are in contact with the sealing resin portion 7. Also, the heat releasing layer rear surface 62 is flush with the resin bottom surface 72 of the sealing resin portion 7. Also, as shown in FIG. 27, the first side surface 631 and the intermediate surface 632 constitute a first angled region 634. The intermediate surface 632 and the second side surface 633 constitute a second angled region 645. In the present embodiment, both the first angled region 634 and the second angled region 645 have a square angle. However, they may be chamfered.

The heat releasing layer 6 is for quickly releasing heat which was generated in the semiconductor chip 41 to outside of the semiconductor device 101C. In order to achieve this goal, it is preferable that the heat releasing layer 6 is made of a material which has as large thermal conductivity as possible; however, if the heat releasing layer's thermal expansion coefficient differs greatly from that of the sealing resin portion 7, there can be a potential problem that the metal layer 6 will peel off. Preferably, therefore, the heat releasing layer 6 is of a material which has a larger thermal conductivity than that of a material which constitutes the sealing resin portion 7, and a similar thermal expansion coefficient to that of the material which constitutes the sealing resin portion 7. The heat releasing layer 6 is faced directly to all of the die pads 11. As shown in FIG. 25, the heat releasing layer 6 covers all of the die pads 11 entirely in xy plane view (i.e., as viewed in the thickness direction of the heat releasing layer 6).

Next, a method of making the semiconductor device 101C will be described. Drawings for describing the method will use the same reference symbols as those used thus far in identifying those described thus far.

Figure 28:
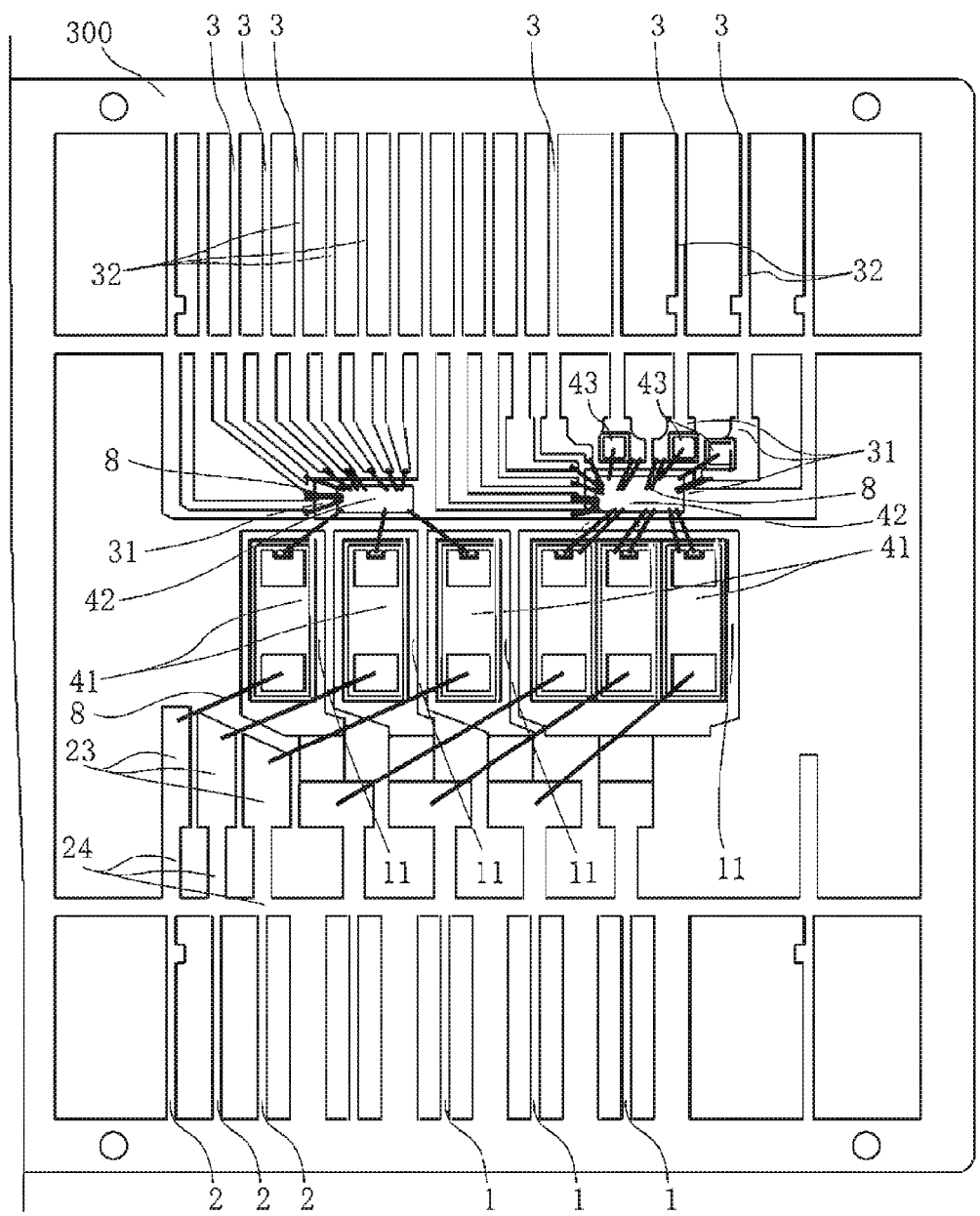
FIG. 28 is a plan view showing a manufacturing step of the semiconductor device according to Embodiment 1C of the present invention.

First, as shown in FIG. 28, a lead frame 300 which includes a plurality of die pads 11, 31; and a plurality of semiconductor chips 41, 42 and passive component chips 43 is prepared. Next, as shown in the drawing, each of the semiconductor chips 41 is disposed on one of the die pads 11 via the junction layer (not illustrated). Likewise, each of the semiconductor chip 42 and the passive component chips 43 is disposed on one of the control die pads 31 via the junction layer (not illustrated). Next, as shown in the drawing, a wire 8 is bonded to each of the semiconductor chips 41, 42 and other components.

Figure 29:
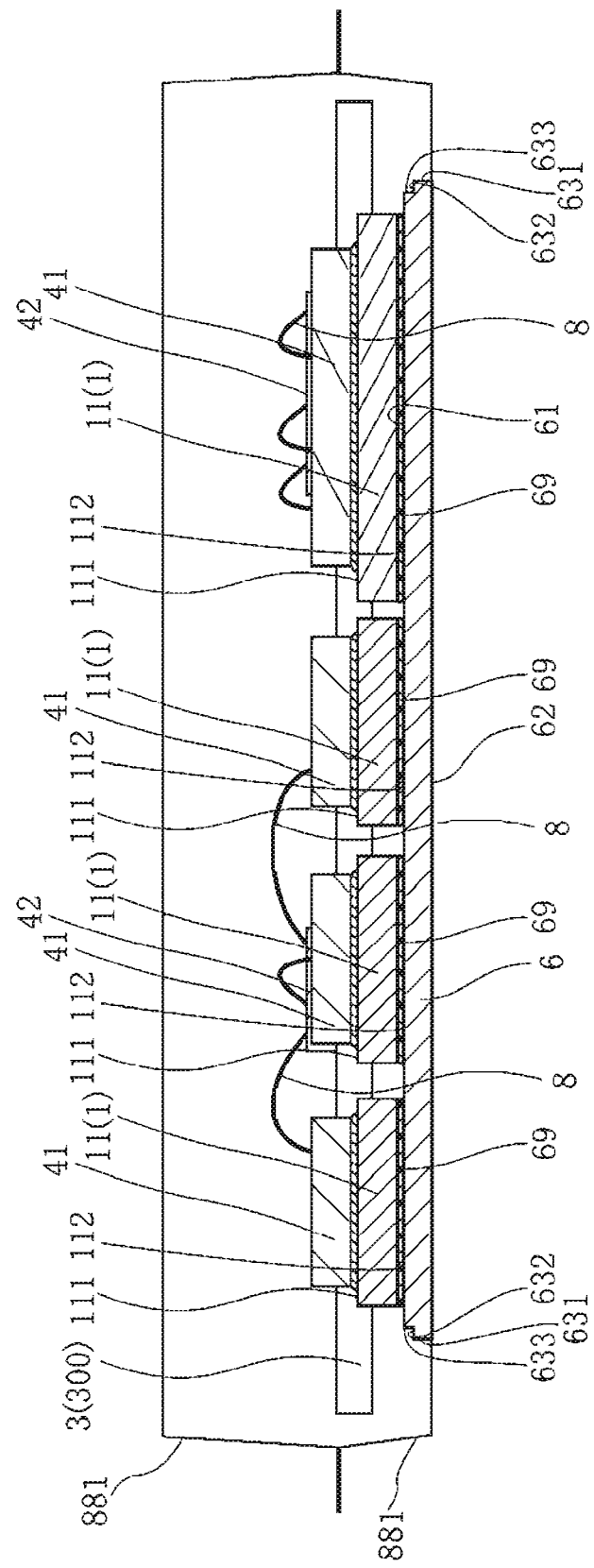
FIG. 29 is a sectional view showing a step which follows the one in FIG. 28.

Next, as shown in FIG. 29, a sealing resin portion 7 is formed. Before the formation of the sealing resin portion 7, the heat releasing layer 6 is joined to the die pads 11 by the junction layer 69. The heat releasing layer 6 is formed, for example, by preparing a flat plate-shaped material of ceramic and making a groove of a certain width in the material plate using a dicing blade. Next, using a narrower blade than the previous one, the material plate is divided in a manner such that the above-mentioned groove is split along its center. By these steps, the heat releasing layer 6 having the first side surface 631, the intermediate surface 632 and the second side surface 633 is obtained.

The formation of the sealing resin portion 7 is performed by means of a molding method using a metal mold 881. As shown in FIG. 29, the heat releasing layer 6 and other components are pressed by the metal mold 881. Next, a resin material is injected into the metal mold 881, and then the resin material is allowed to set. Once the resin material sets, a sealing resin portion 7 is complete.

Next, the lead frame 300 shown in FIG. 28 is appropriately cut to complete the manufacture of the semiconductor device 101C which is illustrated in FIG. 24, etc.

Next, functions of the present embodiment will be described.

According to the semiconductor device 101C, even if there occurs a separation between the heat releasing layer 6 and the resin bottom surface 72, the growth of the separation will be limited within the first side surface 631 and will not continue into the intermediate surface 632 or further. Therefore, even if a separation has occurred, at least the second side surface 633 can play its part in providing a junction between the heat releasing layer 6 and the sealing resin portion 7. Therefore, it is possible to reduce such a case that a gap becomes excessively big between the heat releasing layer 6 and the sealing resin portion 7, to reach the heat releasing layer main surface 61.

The square-angled first angled region 634 is suitable in blocking the growth of separation. Further, by forming the square-angled second angled region 645 at a deeper position than the first angled region 634, it becomes possible to block the growth of a gap more reliably.

The first side surface 631 has a dimension (depth) in the direction z which is greater than a dimension (depth) in the direction z of the second side surface 633. This contributes in controlling a separation not to easily reach the intermediate surface 632, adding an advantage to preventing the separation from growing.

Figure 30:
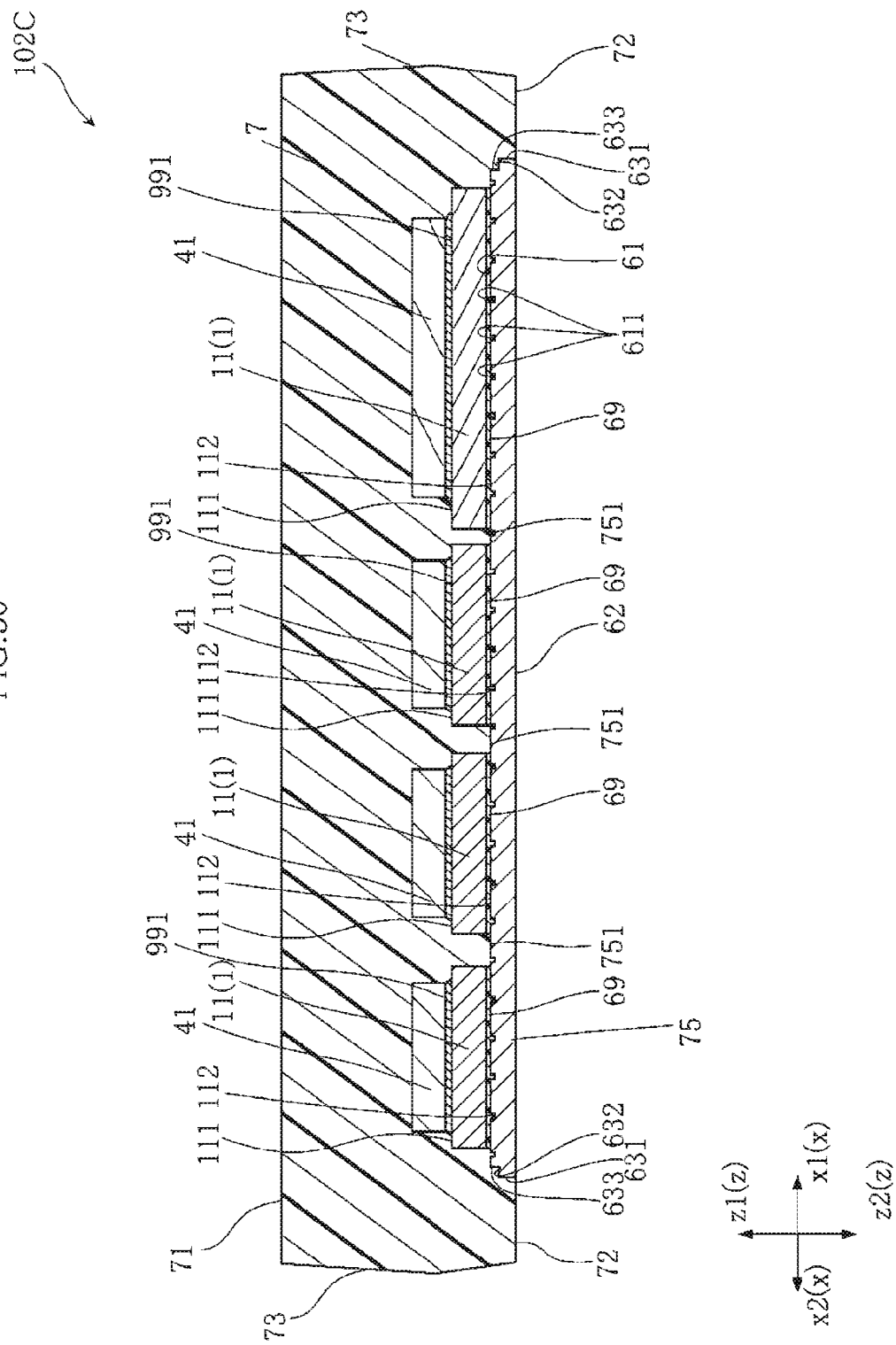
FIG. 30 is a sectional view showing a semiconductor device according to Embodiment 2C of the present invention.

FIG. 30 and FIG. 31 show a semiconductor device according to Embodiment 2C of the present invention. In these figures, elements identical with or similar to those in the previous embodiment are indicated by the same reference codes as in the previous embodiment. A semiconductor device 102C according to the present embodiment differs from the semiconductor device 101C in terms of the heat releasing layer 6.

In the present embodiment, the heat releasing layer 6 has a plurality of grooves 611. The grooves 611 are formed in the heat releasing layer main surface 61. The grooves 611 extend in the y direction, and are disposed at an equal space to each other. Each groove 611 has a rectangular section. Some of the grooves 611 are filled with part of the junction layer 69. Also, some of the grooves 611 are filled with part of the sealing resin portion 7.

The grooves 611 are formed in the above-noted step of forming the heat releasing layer 6. Specifically, before dividing the material plate, a plurality of mutually parallel grooves are formed in the material plate by using mutually parallel blades or by laser. These grooves are to be the grooves 611 in the heat releasing layer 6.

The semiconductor device 102C provides functions which are provided by the semiconductor device 101C. Also, the grooves 611 are formed in addition, and so the grooves 611 are filled with part of the junction layer 69 and part of the sealing resin portion 7. This will provide a so called anchoring effect, i.e., improved bonding strength between the heat releasing layer 6 and the junction layer 69 and improved bonding strength between the heat releasing layer 6 and the sealing resin portion 7. The grooves 611 which have a rectangular section works suitably for increasing the anchoring effect.

The present invention is not limited to the Embodiments described above. The present invention may be varied in many ways in any specific details. For example, as far as the heat releasing layer is exposed from the sealing resin rear surface, the semiconductor device may not necessarily be of an insertion mounting type but may have terminals for surface mounting. Also, the invention is applicable not only to IPM devices mentioned earlier but also to a semiconductor device which includes only one semiconductor chip and an island, but has a heat releasing layer exposed from a rear surface of a sealing resin.

(Appendix 1) A semiconductor device comprising: a die pad having a die pad main surface and a die pad rear surface facing in opposite directions; a semiconductor chip mounted on the die pad main surface; a sealing resin portion which is formed with a recess receding from a bottom surface, exposes the die pad rear surface yet covers the die pad and the semiconductor chip; and a heat releasing layer which is disposed in the recess, has a heat releasing layer main surface facing the die pad rear surface and a heat releasing layer rear surface facing away from the heat releasing layer main surface, and is joined to the die pad; wherein the heat releasing layer has: a first side surface which is positioned on an outer side than is the die pad in a direction in which the die pad rear surface extends, and is connected to the heat releasing layer rear surface; an intermediate surface which is connected to the first side surface and faces in a direction in which the heat releasing layer main surface faces; and a second side surface which is connected to the intermediate surface and is between the die pad and the first side surface in a direction in which the die pad rear surface extends. (Appendix 2) The semiconductor device according to Appendix 1, wherein the heat releasing layer is made of a ceramic. (Appendix 3) The semiconductor device according to Appendix 1 or 2, wherein the first side surface, the intermediate surface and the second side surface are in contact with the sealing resin portion. (Appendix 4) The semiconductor device according to Appendix 3, wherein the heat releasing layer rear surface of the heat releasing layer is flush with the bottom surface of the sealing resin portion. (Appendix 5) The semiconductor device according to one of Appendices 1 through 4, wherein the first side surface and the intermediate surface form a first angled region. (Appendix 6) The semiconductor device according to one of Appendices 1 through 5, wherein the intermediate surface and the second side surface form a second angled region. (Appendix 7) The semiconductor device according to Appendix 6, wherein at least one of the first angled region and the second angled region has a right angle. (Appendix 8) The semiconductor device according to one of Appendices 1 through 7, wherein the first side surface has a greater dimension in a thickness direction of the heat releasing layer than a dimension of the second side surface in the thickness direction of the heat releasing layer. (Appendix 9) The semiconductor device according to one of Appendices 1 through 8, wherein the heat releasing layer and the die pad are joined to each other by a junction layer. (Appendix 10) The semiconductor device according to Appendix 9, wherein the heat releasing layer main surface of the heat releasing layer is formed with a plurality of grooves extending in a direction perpendicular to a thickness direction of the heat releasing layer. (Appendix 11) The semiconductor device according to Appendix 10, wherein each of the grooves has a rectangular section. (Appendix 12) The semiconductor device according to Appendix 10 or 11, wherein one or more of the grooves are in contact with the junction layer. (Appendix 13) The semiconductor device according to one of Appendices 10 through 12, wherein some of the grooves are in contact with the sealing resin portion. (Appendix 14) A semiconductor device comprising: a plurality of die pads each having a die pad main surface and a die pad rear surface facing in opposite directions; a plurality of semiconductor chips each mounted on one of the die pad main surfaces; a sealing resin portion which is formed with a recess receding from a bottom surface, commonly exposes the die pad rear surfaces yet commonly covers each die pad and each semiconductor chip and; and a heat releasing layer which is disposed in the recess, has a heat releasing layer main surface facing the die pad rear surfaces and a heat releasing layer rear surface facing away from the heat releasing layer main surface, and is commonly joined with each die pad; wherein the heat releasing layer has: a first side surface which is positioned on an outer side than is the die pad in a direction in which the die pad rear surface extends, and is connected to the heat releasing layer rear surface; an intermediate surface which is connected to the first side surface and faces in a direction in which the heat releasing layer main surface faces; and a second side surface which is connected to the intermediate surface and is between the die pad and the first side surface in the direction in which the die pad rear surface extends.

FIG. 32 is a sectional view showing a packaging structure when use is made of a semiconductor device according to Embodiment 1D of the present invention.

A semiconductor device packaging structure 801 shown in FIG. 32 includes a semiconductor device 101D, a substrate 807 and a heat releasing member 808.

The substrate 807 is capable of having a plurality of electric components mounted thereon. The substrate 807 is made of an insulating material. The substrate 807 is formed with an unillustrated wiring pattern. The substrate 807 is formed with a plurality of holes 809. The heat releasing member 808 is made of a material which has a relatively high heat conductivity like a metal such as aluminum. The heat releasing member 808 is fixed to the substrate 807 by an unillustrated supporting member. The semiconductor device 101D is mounted on the substrate 807. In the present embodiment, the semiconductor device 101D is a so called IPM (Intelligent Power Module) product. The semiconductor device 101D is used for such an application as electric power source control in an air conditioner, a motor controller, etc.

Figure 33:
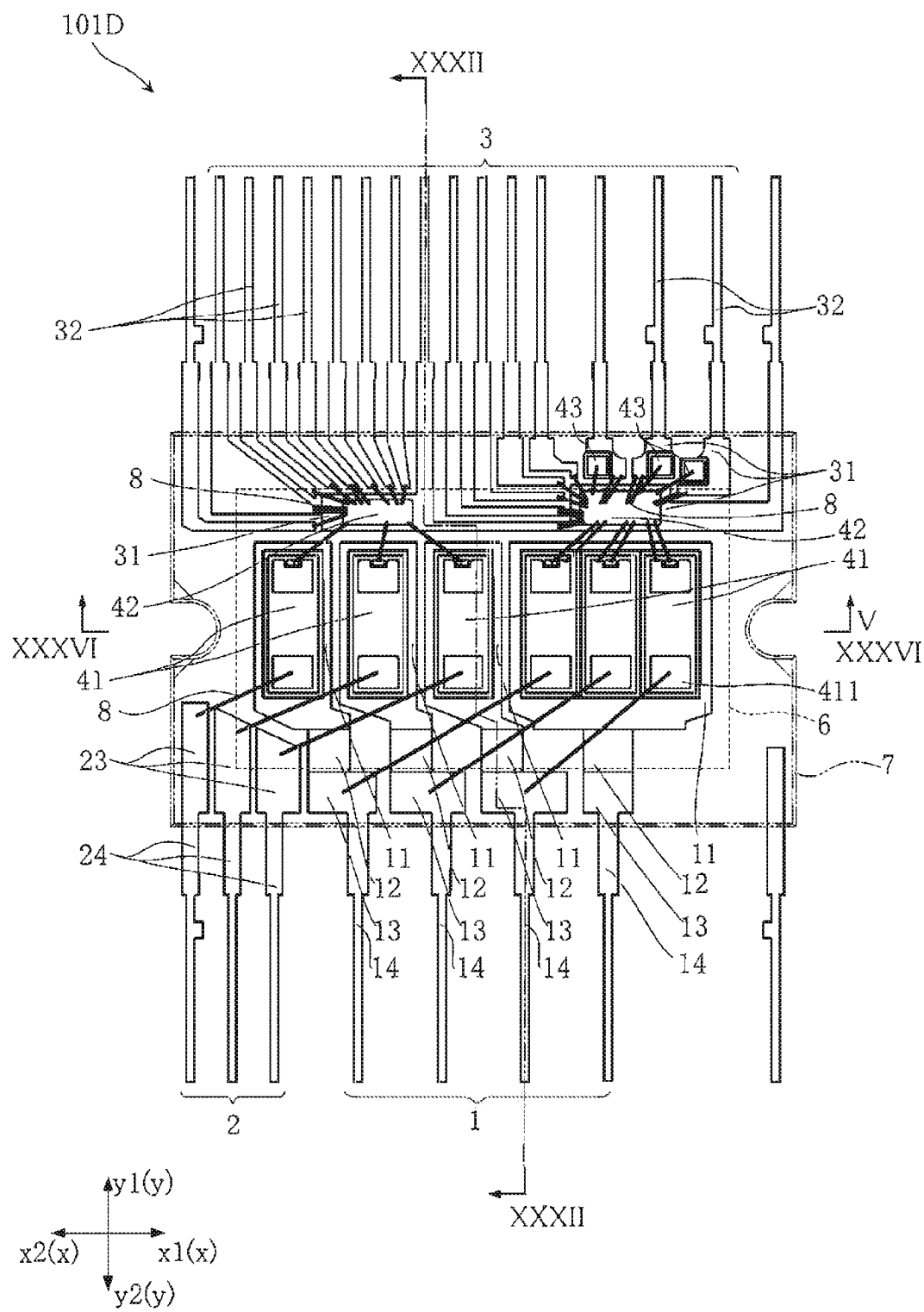
FIG. 33 is a plan view (partially unillustrated) of the semiconductor device according to Embodiment 1D of the present invention, before leads are bent.
Figure 35:
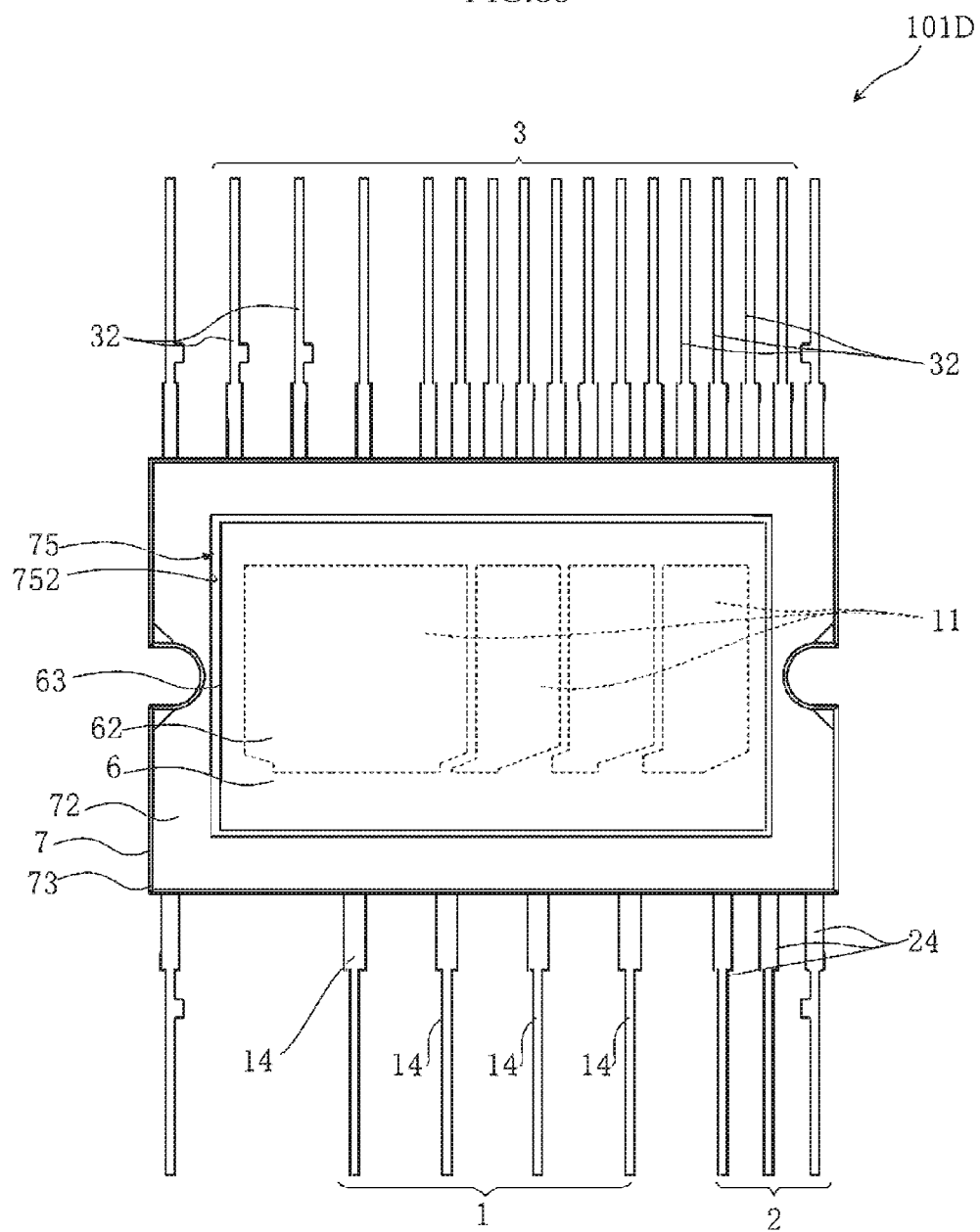
FIG. 35 is a bottom view of a semiconductor device according to Embodiment 1D of the present invention, before the leads are bent.
Figure 36:
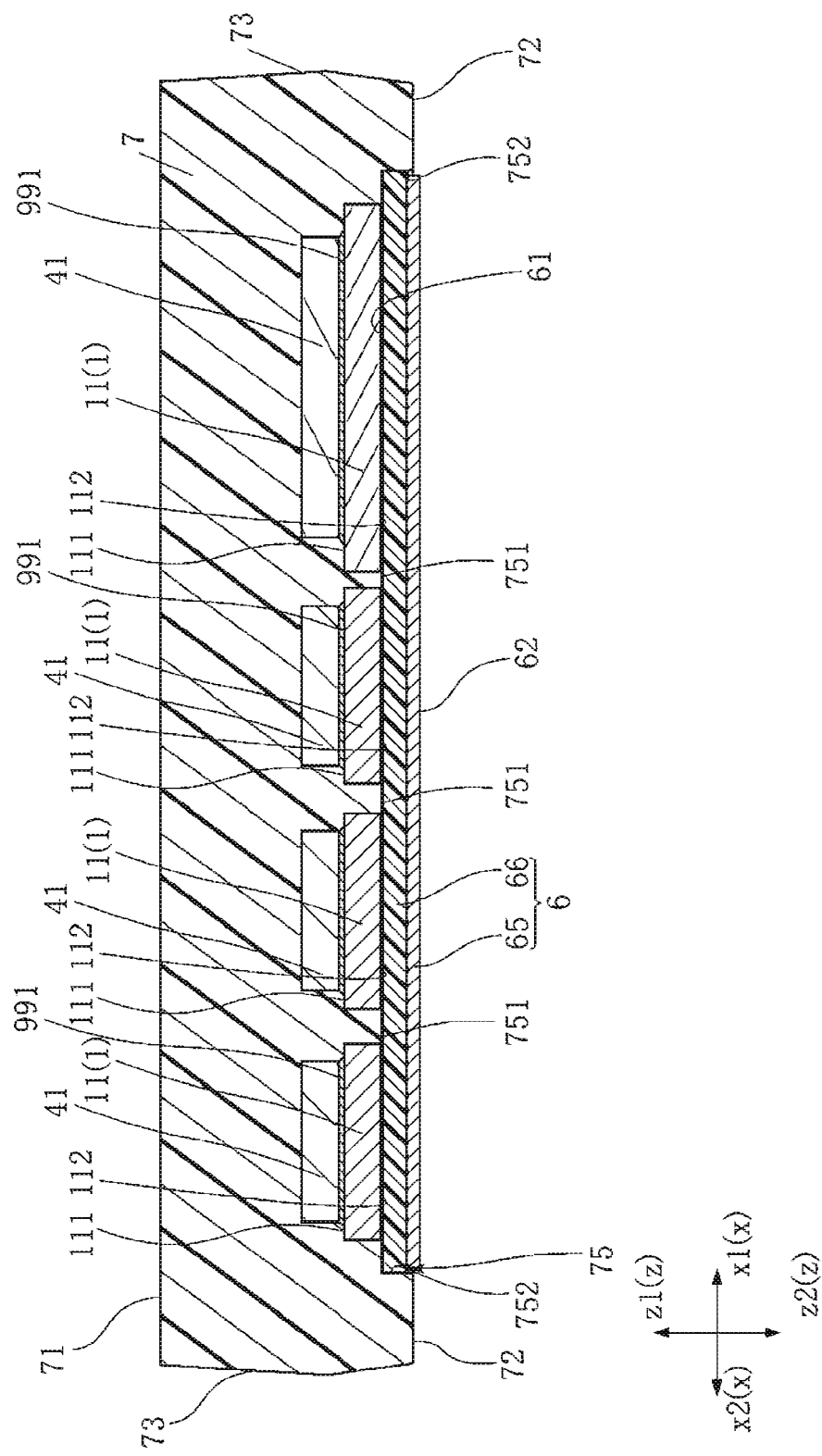
FIG. 36 is a sectional view taken in lines XXXVI-XXXVI in FIG. 33.

FIG. 33 and FIG. 34 are plan views (partially unillustrated) of the semiconductor device according to Embodiment 1D of the present invention, before leads are bent. FIG. 35 is a bottom view of the semiconductor device according to Embodiment 1D of the present invention, before the leads are bent. FIG. 36 is a sectional view taken in lines XXXVI-XXXVI in FIG. 33. FIG. 32 represents a section taken in lines XXXII-XXXII in FIG. 33. In FIG. 36, each component is illustrated schematically for easier comprehension.

The semiconductor device 101D shown in these drawings includes a plurality of first electrode portions 1, second electrode portions 2 and third electrode portions 3; a plurality of semiconductor chips 41, 42; passive component chips 43; a heat releasing layer 6; a sealing resin portion 7 and wires 8. FIG. 33 shows the heat releasing layer 6 in broken lines and the sealing resin portion 7 in imaginary lines.

The sealing resin portion 7 covers the plurality of the first electrode portions 1, the second electrode portions 2, and the third electrode portions 3; the semiconductor chips 41, 42; and the passive component chips 43. The sealing resin portion 7 is made of a black epoxy resin for example. As shown in FIG. 35 and FIG. 36, the sealing resin portion 7 has a resin main surface 71, a resin bottom surface 72 and a resin side surface 73.

The resin main surface 71 is a flat surface which faces in a direction z11 and extends along an xy plane. The resin bottom surface 72 is a flat surface which faces in a direction z2 that is opposite to the direction z1 and extends along the xy plane. The resin side surface 73 surrounds the semiconductor chips 41, 42 and the passive component chips 43 in xy-plane view. The resin side surface 73 is connected to the resin main surface 71 and the resin bottom surface 72.

As clearly shown in FIG. 36, the sealing resin portion 7 is formed with a recess 75. The recess 75 recedes from the resin bottom surface 72. The recess 75 has a recess bottom surface 751 and a recess side surface 752. The recess bottom surface 751 extends along an xy plane. The recess side surface 752 is connected to the resin bottom surface 72. The recess side surface 752 extends substantially in a direction z.

As shown in FIG. 33, the semiconductor chips 41, 42 and the passive component chips 43 are rectangular in plan view. The semiconductor chip 41 is a power chip such as an IGBT, MOS and diode, or an output transistor. The semiconductor chip 42 is an LSI chip such as a control IC, or controls the semiconductor chip 41. The passive component chips 43 are, for example, resisters, capacitors or other passive components. The semiconductor chip 41 has electrodes 411. The semiconductor chip 42 also has electrodes which are similar to the electrodes 411. The following description of the electrodes 411 also applies to these electrodes.

The first electrode portions 1, the second electrode portions 2 and the third electrode portions 3 in FIG. 33 are all made of an electrically conductive material. An example of such an electrically conductive material is copper. The electrode portion shown in a bottom right region in FIG. 33 is grounded.

Each of the plurality (four, in the present embodiment) of the first electrode portions 1 includes a die pad 11 (see FIG. 32 through FIG. 34 and FIG. 36), a connecting region 12 (see FIG. 32 through FIG. 34), a wire bonding region 13 (see FIG. 32 through FIG. 34) and a lead 14 (see FIG. 32 through FIG. 35). The first electrode portions 1 are spaced from each other in the direction x.

Each die pad 11 is a flat plate extending along and parallel to an xy plane. The semiconductor chip 41 is disposed on the die pad 11. As shown in FIG. 36, a junction layer 991 is between the die pad 11 and the semiconductor chip 41. The junction layer 991 is made of an electrically conductive material. The electrically conductive material is provided by solder or silver paste, for example. Solder has a relatively large thermal conductivity. Use of solder as the junction layer 991 enables efficient heat conduction from the semiconductor chip 41 to the die pad 11. Each of the die pads 11 is exposed from the recess bottom surface 751.

Each die pad 11 has a die pad main surface 111 and a die pad rear surface 112. The die pad main surface 111 faces in the direction z1 whereas the die pad rear surface 112 faces in the direction z2. In other words, the die pad main surface 111 and the die pad rear surface 112 are arranged to face in the mutually opposite directions. The semiconductor chip 41 is disposed on the die pad main surface 111. A junction layer 991 is between the die pad main surface 111 and the semiconductor chip 41. The die pad rear surface 112 is located at the same position as the recess bottom surface 751 in a thickness direction (the direction z) of the die pad 11. However, the die pad rear surface 112 may be closer to an opening of the recess 75 than is the recess bottom surface 751.

As shown in FIG. 33, each connecting region 12 is disposed between the die pad 11 and the wire bonding region 13, and connected to the die pad 11 and to the wire bonding region 13. As shown in FIG. 32, the connecting region 12 extends along a plane which is inclined with respect to an xy plane. The connecting region 12 is inclined with respect to an xy plane in such a manner that it goes farther in the direction z1 as it is further away from the die pad 11.

Each wire bonding region 13 shown in FIG. 32 through FIG. 34 extends along an xy plane. In the direction z, each wire bonding region 13 is on a side more toward the direction z1 than is the die pad 11. A wire 8 is bonded to one of the wire bonding regions 13 and to one of the semiconductor chips 41. Thus, electrical conductivity is established between said one of the wire bonding regions 13 and said one of the semiconductor chips 41. The leads 14 are connected to the wire bonding regions 13. Each lead 14 extends along the direction y. The lead 14 has a portion extending out of the resin side surface 73 of the sealing resin portion 7. In the present embodiment, the leads 14 are for insertion mounting. As shown in FIG. 32, when mounting the semiconductor device 101D on the substrate 807, the leads 14 are bent and inserted through the holes 809. For fixing the leads 14 in the substrate 807, the holes 809 are filled with solder layers 810. The wire 8 which is connected to the semiconductor chip 41 and the wire bonding region 13 is made of aluminum.

As shown in FIG. 34, the die pad 11 is formed with a pair of press marks 113. The press marks 113 are formed during a bonding step of the wire 8 which will be described later. The press marks 113 are slight recesses receding from the die pad main surface 111 of the die pad 11, and look like scars. In the present embodiment, the press marks 113 are spaced from each other in the direction x, sandwiching the semiconductor chip 41. The semiconductor chip 41 is formed with three electrodes 411 disposed inline in the direction x between the pair of press marks 113. Each wire 8 bonded to one of the electrodes 411 has a first bonding portion 81, which crosses a straight line connecting the press marks 113 with each other.

The wire bonding region 13 is formed with a pair of press marks 131. The press marks 131 are formed during a bonding step of the wire 8 which will be described later. The press marks 131 are slight recesses from the surface of the wire bonding region 13, and look like scars. In the present embodiment, the press marks 131 are spaced from each other in the direction x. The wire 8 bonded to the wire bonding region 13 has a second bonding portion 82, which crosses a straight line connecting the press marks 131 with each other. Press marks which are similar to the press marks 131 formed in the wire bonding region 13 are formed in a wire bonding region 23 which will be described later.

As shown in FIG. 33, each of the plurality (three, in the present embodiment) of the second electrode portions 2 includes a wire bonding region 23 and a lead 24. The second electrode portions 2 are spaced from each other in the direction x.

Each wire bonding region 23 extends along an xy plane. In the direction z, each wire bonding region 23 is on a side more toward the direction z1 than is the die pad 11. A wire 8 is bonded to one of the wire bonding regions 23 and to one of the semiconductor chips 41. Thus, electrical conductivity is established between said one of the wire bonding regions 23 and said one of the semiconductor chips 41. The leads 24 are connected to the wire bonding regions 23. Each lead 24 extends in the direction y. The lead 24 has a portion extending out of the resin side surface 73 of the sealing resin portion 7, receives the same steps as does the lead 14, and is inserted through the hole 809 in the substrate 807. The wire 8 which is connected to the semiconductor chip 41 and the wire bonding region 23 is made of aluminum.

The third electrode portions 3 shown in FIG. 32, FIG. 33 includes a plurality of control die pads 31 and a plurality of leads 32. The control die pads 31 and the leads 32 are respectively disposed at the same positions in the direction z. On each control die pad 31, the semiconductor chip 42 or the passive component chips 43 is disposed. A junction layer (not illustrated) is formed between the control die pad 31 and the semiconductor chip 42, and between the control die pads 31 and the passive component chips 43. The control die pads 31 need not have its rear surface faced to the heat releasing layer 6 or exposed.

Each lead 32 has a portion extending out of the resin side surface 73 of the sealing resin portion 7, receives the same steps as does the lead 14, and is inserted through the hole 809 in the substrate 807. A wire 8 is bonded to one of the leads 32 and to a predetermined electrode of one of the semiconductor chips 42. Thus, electrical conductivity is established between said one of the leads 32 and said one of the semiconductor chips 42. Also, a wire 8 is bonded to a predetermined electrode of one of the semiconductor chips 42 and to one of the passive component chips 43. It should be noted here that wires used for the controlling semiconductor chip 42 or the passive component chips 43 are often provided by fine wires made of aluminum or gold which are finer and softer than the wire 8.

The heat releasing layer 6 is made of ceramics, Cu or aluminum, and is disposed in the recess 75 in the sealing resin portion 7 as shown in FIG. 36. The heat releasing layer 6 is surrounded by the recess side surface 752. In the present embodiment, the heat releasing layer 6 is a flat plate extending along and parallel to an xy plane. In the present embodiment, the heat releasing layer 6 is constituted by the metal layer 65 and the junction layer 66. The metal layer 65 is on a side toward the z2 direction, and is made of Cu which has a thickness of approximately 105 μm for example. The junction layer 66 is on a side toward the z1 direction with respect to the metal layer 65 and joins the metal layer 65 to the die pad rear surfaces 112 of the die pads 11. The junction layer 66 is made of an insulating resin for example, and has a thickness of approximately 250 μm for example. The resin becomes soft when it receives pressure and vibration in a manufacturing step of the semiconductor device 101D and is in direct contact with all of the die pads 11 on which the semiconductor chips 41 are mounted. The metal layer 65 may have a region(s) slightly out of the resin bottom surface 72. The junction layer 66 is in contact with the recess side surface 752.

The heat releasing layer 6 is for quickly releasing heat which was generated in the semiconductor chip 41 to outside of the semiconductor device 101D. In order to achieve this goal, it is preferable that the heat releasing layer 6 is made of a material which has as large thermal conductivity as possible. However, if the heat releasing layer's thermal expansion coefficient differs greatly from that of the sealing resin portion 7, there can be a potential problem that the metal layer 6 will peel off. Preferably, therefore, the heat releasing layer 6 is of a material which has a larger thermal conductivity than that of a material which constitutes the sealing resin portion 7, and a similar thermal expansion coefficient to that of the material which constitutes the sealing resin portion 7. The heat releasing layer 6 is faced directly to all of the die pads 11. As shown in FIG. 35, the heat releasing layer 6 covers all of the die pads 11 entirely in xy plane view (i.e., as viewed in the thickness direction of the heat releasing layer 6).

As shown in FIG. 35 and FIG. 36, the heat releasing layer 6 has a heat releasing layer main surface 61 and a heat releasing layer rear surface 62. The heat releasing layer main surface 61 faces in the direction z1. The heat releasing layer main surface 61 covers the die pad rear surfaces 112 and the recess bottom surfaces 751 of all of the die pads 11 in xy-plane view. The heat releasing layer main surface 61 is in direct contact with the die pad rear surface 112 and the recess bottom surface 751. The heat releasing layer rear surface 62 faces in the direction z2 which is a direction opposite to the direction in which the heat releasing layer main surface 61 faces. The heat releasing layer rear surface 62 is not covered by the sealing resin portion 7 and is exposed from the sealing resin portion 7.

Next, a method of making of the semiconductor device 101D will be described. Drawings for describing the method will use the same reference symbols as those used thus far in identifying those described thus far.

Figure 37:
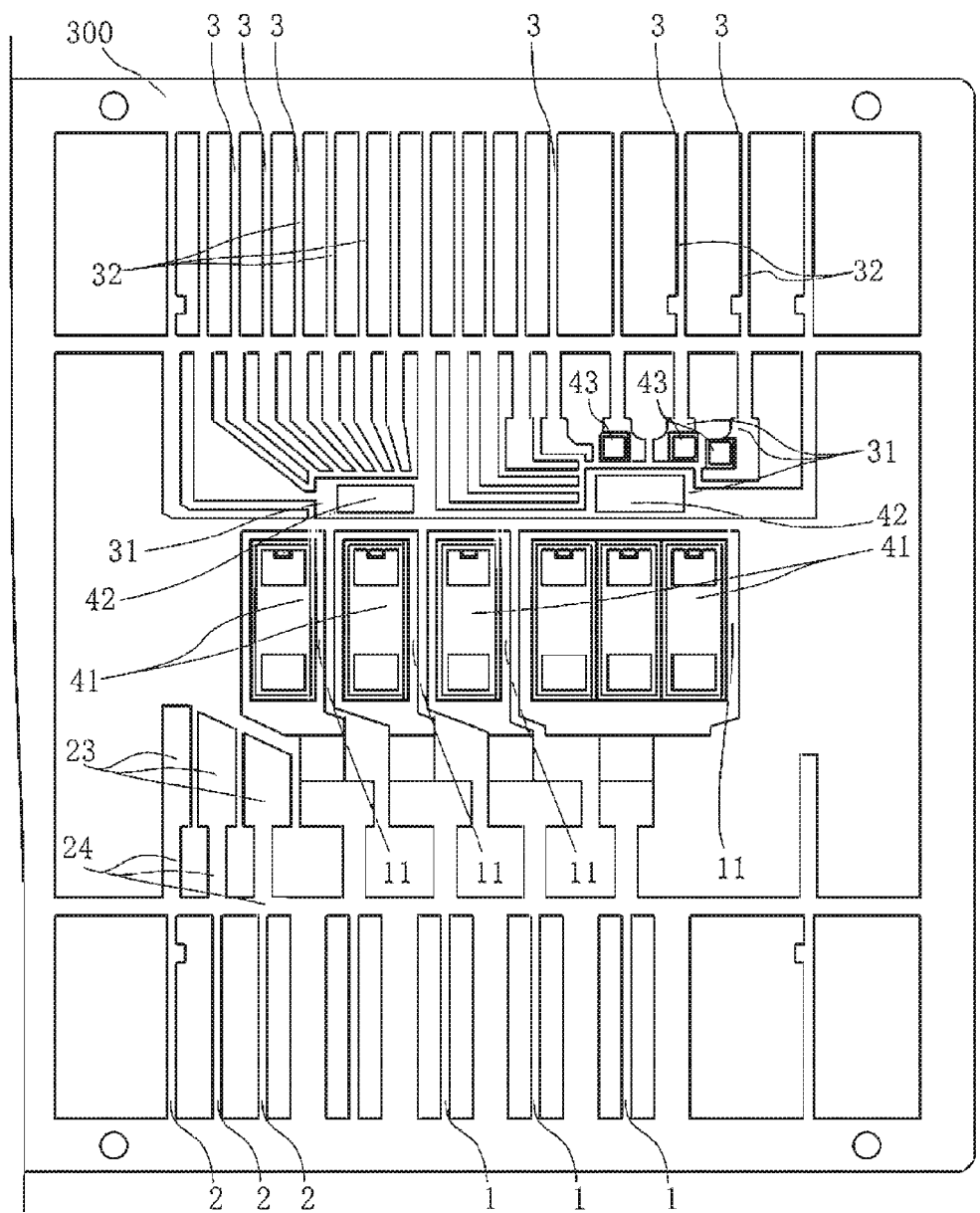
FIG. 37 is a plan view showing a manufacturing step of the semiconductor device according to Embodiment 1D of the present invention.

First, as shown in FIG. 37, a lead frame 300 which includes a plurality of die pads 11, 31; and a plurality of semiconductor chips 41, 42 and passive component chips 43 is prepared. Next, as shown in the drawing, each of the semiconductor chips 41 is disposed on one of the die pads 11 via the junction layer (not illustrated). Likewise, each of the semiconductor chip 42 and the passive component chips 43 is disposed on one of the control die pads 31 via the junction layer (not illustrated).

Figure 38:
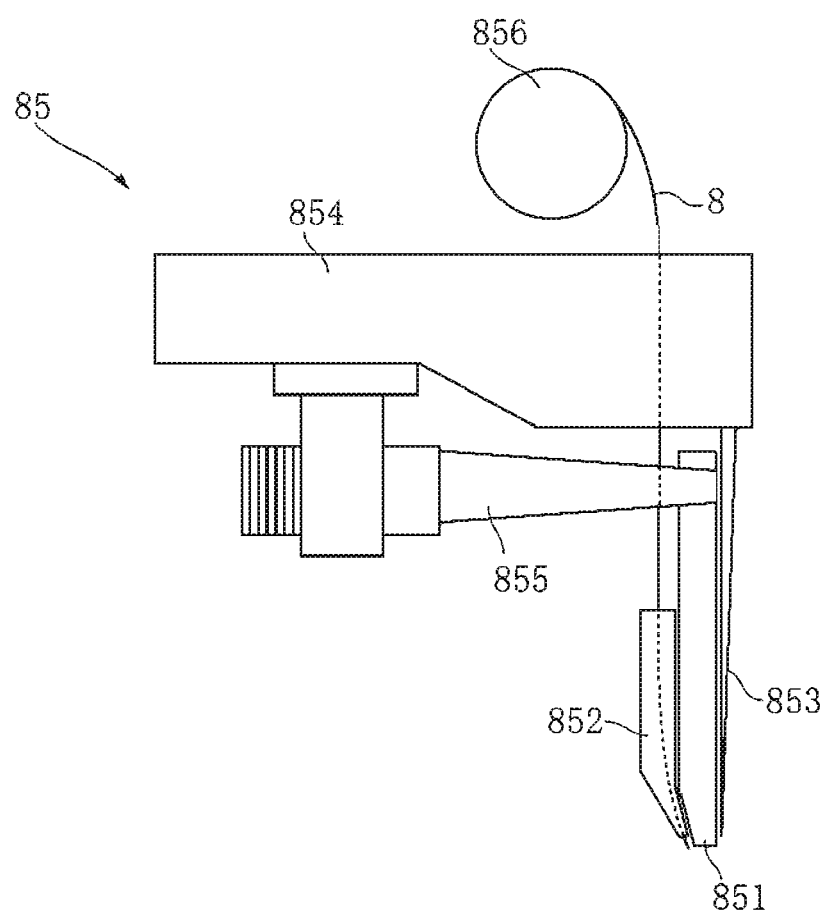
FIG. 38 is a side view of an example of bonding apparatus used in a wire bonding method according to the present invention.

Next, the bonding of wires 8 is performed. FIG. 38 shows an example of bonding apparatus for bonding aluminum wires 8. The illustrated bonding apparatus 85 includes a capillary 851, a guide 852, a cutter 853, a base 854, an arm 855, and a wire reel 856. A wire 8 is wound around the wire reel 856. The arm 855 is attached to the base 854 via a vibration generator such as an ultrasonic wave generator. The wire 8 is unwound from the wire reel 856 and fed along the guide 852 to the tip of the capillary 851. The capillary 851 presses the wire 8 to a bonding object while applying vibration ("wedge bonding"). Then, the bonded wire is cut by the cutter 853.

Figure 39:
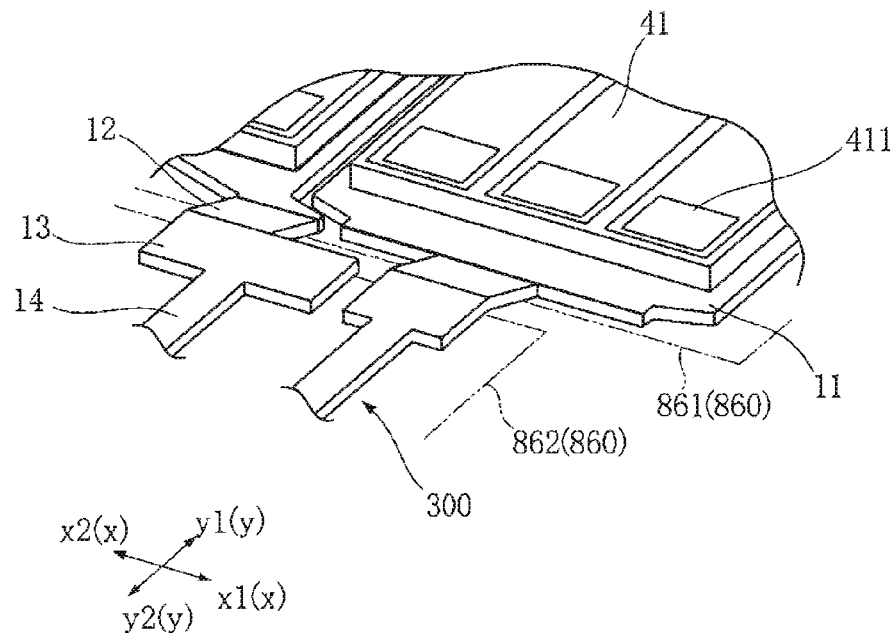
FIG. 39 is a perspective view of a primary portion, showing a manufacturing step of the semiconductor device according to Embodiment 1D of the present invention.

Hereinafter, reference will be made to FIG. 39 to describe steps of bonding a wire to a semiconductor chip 41 which is mounted on a die pad 11, with a wire bonding region 13 which is connected to an adjacent die pad 11. All the other wire bondings will be performed in the same way if the wire 8 is made of aluminum. Before the wire 8 is actually bonded, a lead frame 300 is set into a jig for example. The jig 860 is formed to follow the shape of the lead frame 300, and has support surfaces 861, 862. The support surface 861 supports the die pad 11 while the support surface 862 support the wire bonding region 13.

Figure 40:
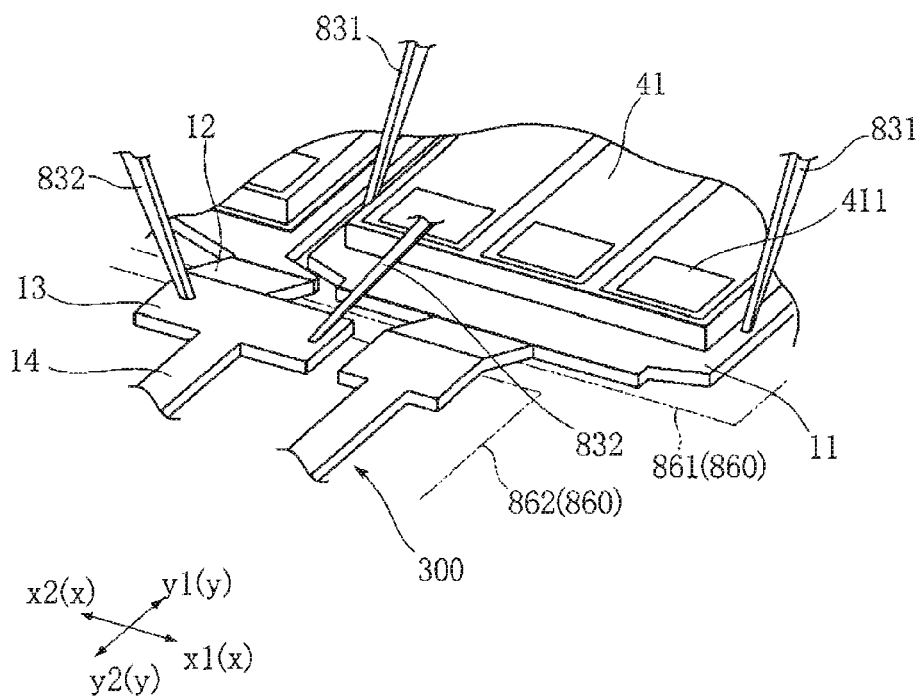
FIG. 40 is a perspective view of a primary portion, showing a step which follows the one in FIG. 39.

Next, as shown in FIG. 40, a pair of pressing pieces 831 and a pair of pressing pieces 832 are prepared. The pressing pieces 831 and the pressing pieces 832 are each provided by paired, fine, metal rods for example. The pair of pressing pieces 831 are pressed onto the die pad 11. During this process, the pair of pressing pieces 831 are separated from each other in the direction x so that the pressing pieces 831 sandwich three electrodes 411 of the semiconductor chip 41. Likewise, the pair of pressing pieces 832 are pressed onto the wire bonding region 13. The pair of pressing pieces 832 are separated in the direction x.

Figure 41:
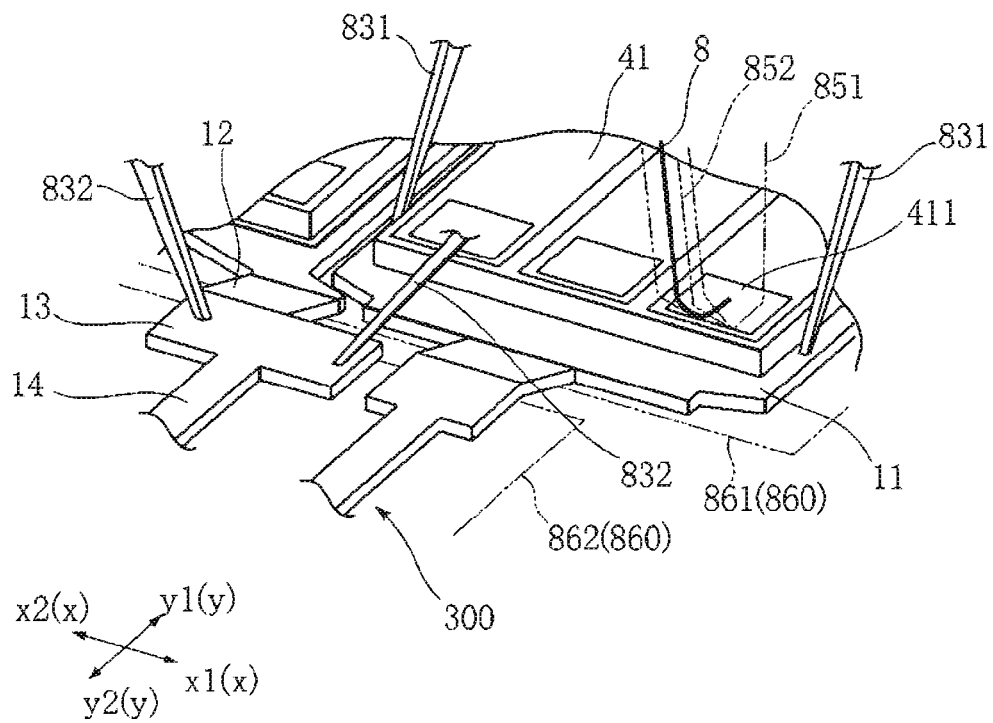
FIG. 41 is a perspective view of a primary portion, showing a step which follows the one in FIG. 40.

Next, as shown in FIG. 41, a first bonding step of a wire 8 is performed. The tip of the capillary 851 which holds a wire 8 is brought into contact with an electrode 411 of the semiconductor chip 41. Then, pressure and ultrasonic vibration are applied from the capillary 851 to the wire 8 whereby the wire 8 is bonded to the electrode 411.

Figure 42:
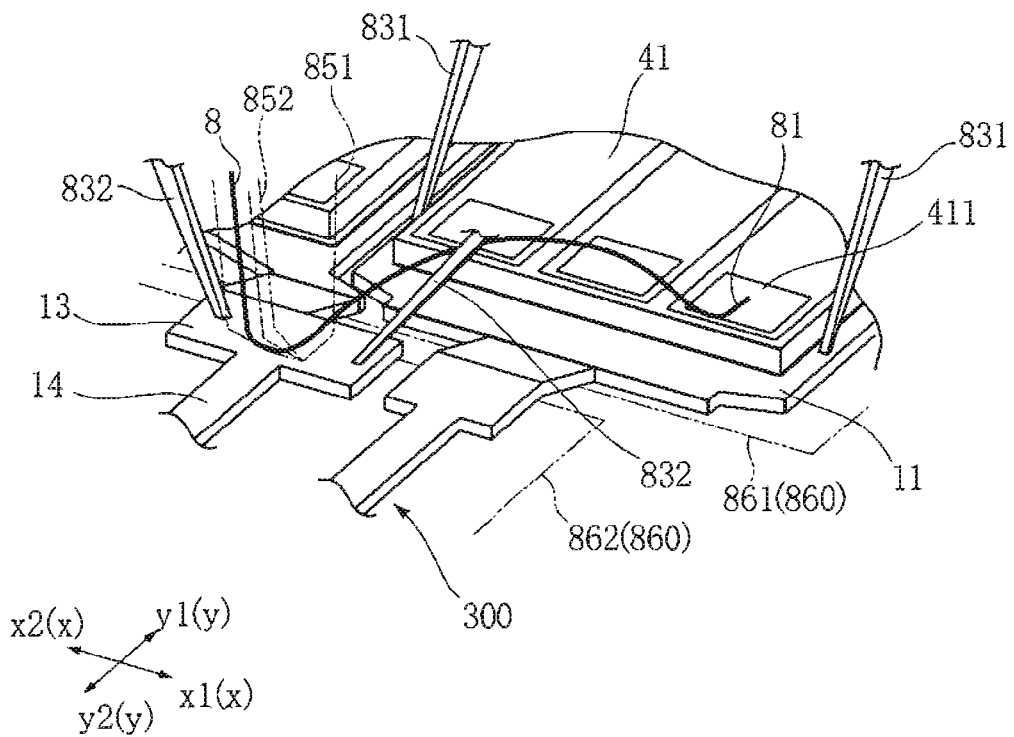
FIG. 42 is a perspective view of a primary portion, showing a step which follows the one in FIG. 41.

Next, as shown in FIG. 42, a second bonding step of a wire 8 is performed. The tip of the capillary 851 is moved from the electrode 411 of the semiconductor chip 41 to the wire bonding region 13. Then, pressure and ultrasonic vibration are applied from the capillary 851 to the wire 8 whereby the wire 8 is bonded to the wire bonding region 13. Also, after this bonding, the cutter 853 shown in FIG. 38 cuts the wire 8.

Figure 43:
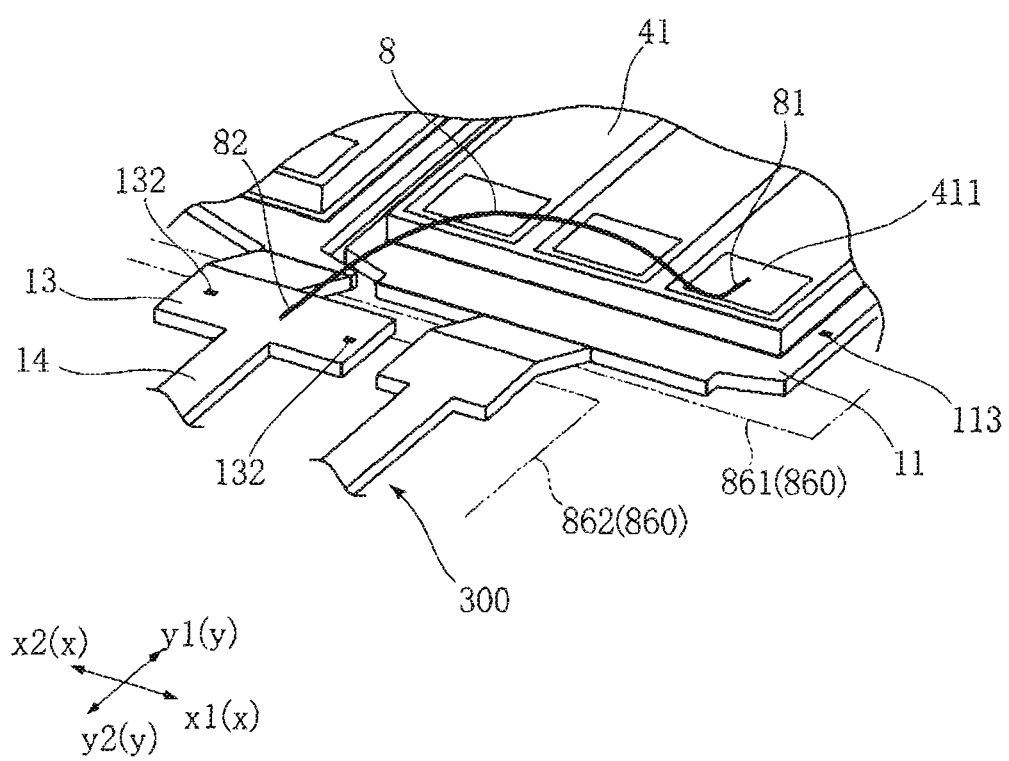
FIG. 43 is a perspective view of a primary portion, showing a step which follows the one in FIG. 42.
Figure 44:
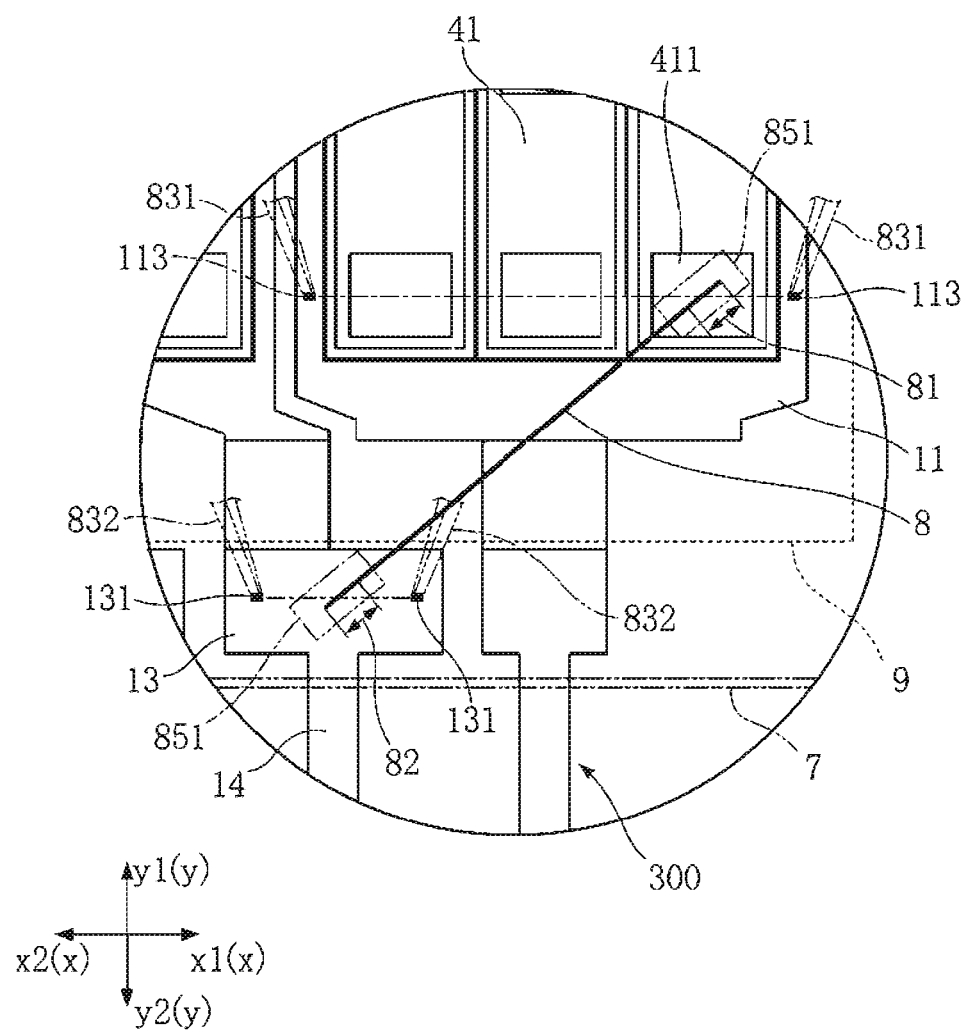
FIG. 44 is a plan view of a primary portion, showing a step which follows the one in FIG. 42.
Figure 45:
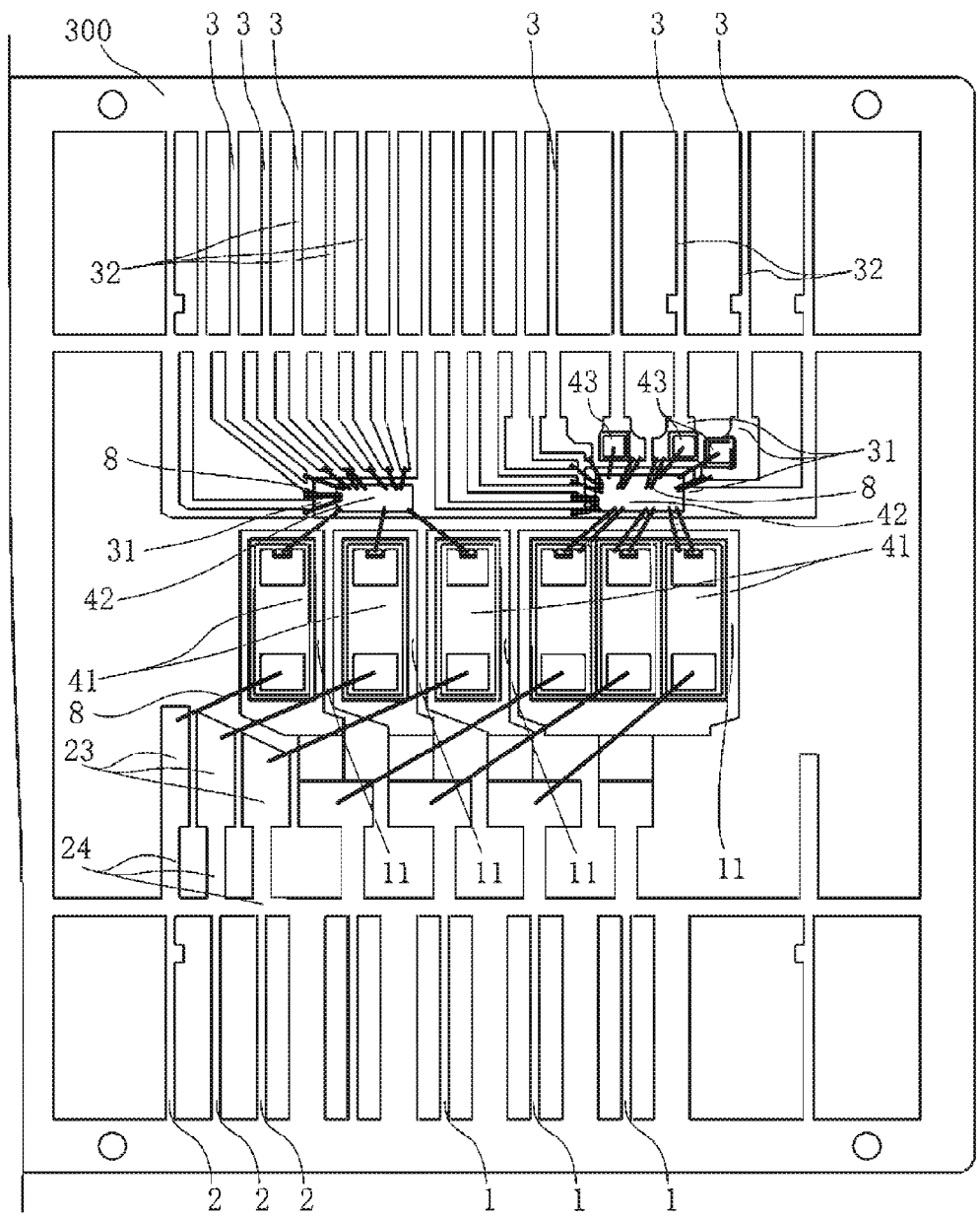
FIG. 45 is a plan view showing a step which follows the one in FIG. 42.

By performing the first bonding step and the second bonding step described above, wires 8 as shown in FIG. 43 and FIG. 44 are obtained; i.e., one wire is bonded at the first bonding portion 81 to the electrode 411 of the semiconductor chip 41 while the other wire is bonded at the second bonding portion 82 to the wire bonding region 13. As shown in FIG. 44, places in the die pad 11 where the pair of pressing pieces 831 were pressed onto are formed with a pair of press marks 113. Also, places in the wire bonding region 13 where the pair of pressing pieces 832 were pressed onto are formed with a pair of press marks 131. The first bonding portion 81 is across a straight line which connects the pair of press marks 113. Also, the second bonding portion 82 is across a straight line which connects the pair of press marks 131. By repeating these steps, a plurality of wire 8 are bonded to respective semiconductor chips 41, 42, etc. in the lead frame 300 as shown in FIG. 45. It should be noted here that the semiconductor chip 42 and the third electrode portion 3 are connected to each other by a wire 8'. Wire bonding for this connection may be made by using the pressing pieces 831; however, ball bonding may be employed instead, without using the pressing pieces 831.

Figure 46:
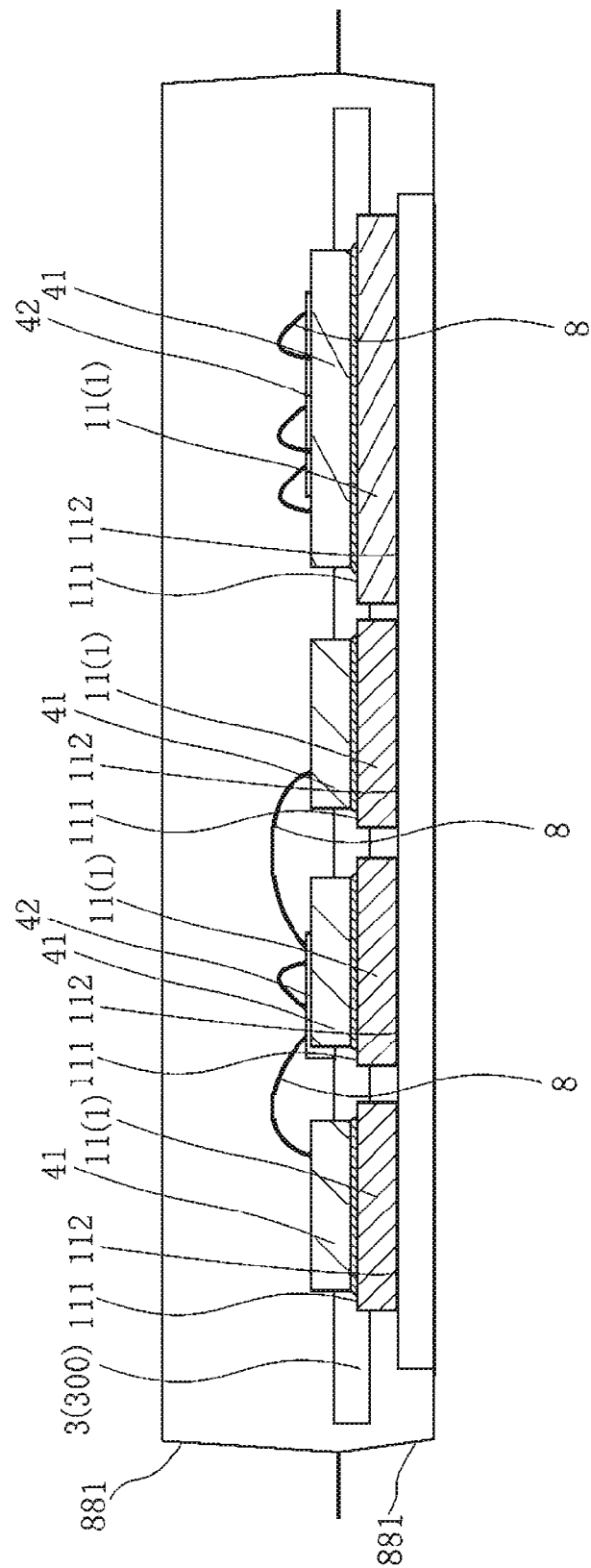
FIG. 46 is a sectional view showing a step which follows the one in FIG. 45.
Figure 47:
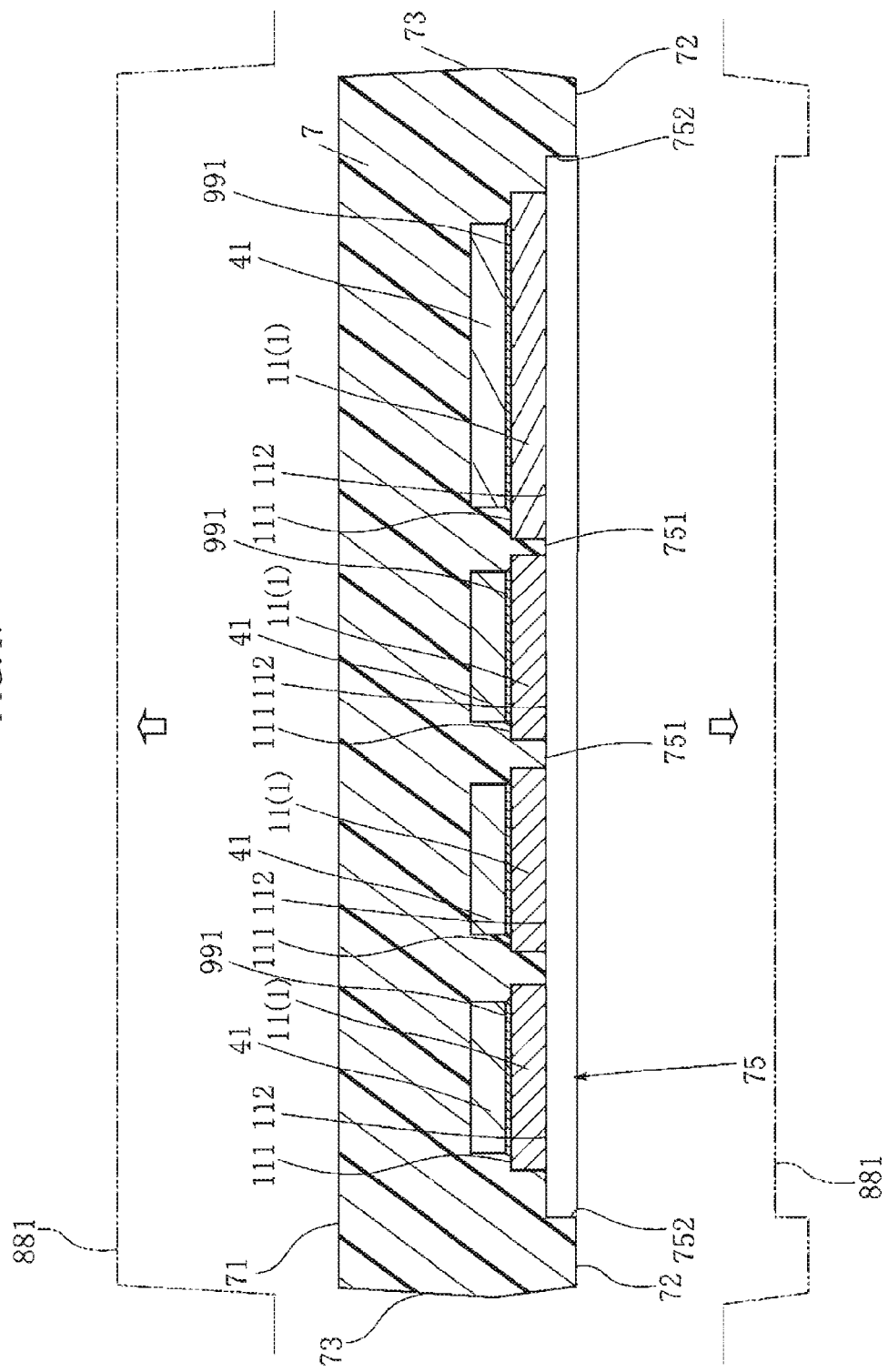
FIG. 47 is a sectional view showing a step which follows the one in FIG. 46.

Next, as shown in FIG. 46 and FIG. 47, a sealing resin portion 7 is formed. As shown in FIG. 46, the formation of the sealing resin portion 7 is performed by means of a molding method using a metal mold 881. As shown in the drawing, the die pads 11 and other components are held inside the metal mold 881. Next, a resin material is injected into the metal mold 881, and then the resin material is allowed to set. Once the resin material is set, the metal mold 881 is taken away from the die pads 11 and other components as shown in FIG. 47. Thus, the sealing resin portion 7 is formed. In the steps of forming the sealing resin portion 7, a recess 75 is formed in the sealing resin portion 7 for exposure of the die pads 11.

Figure 48:
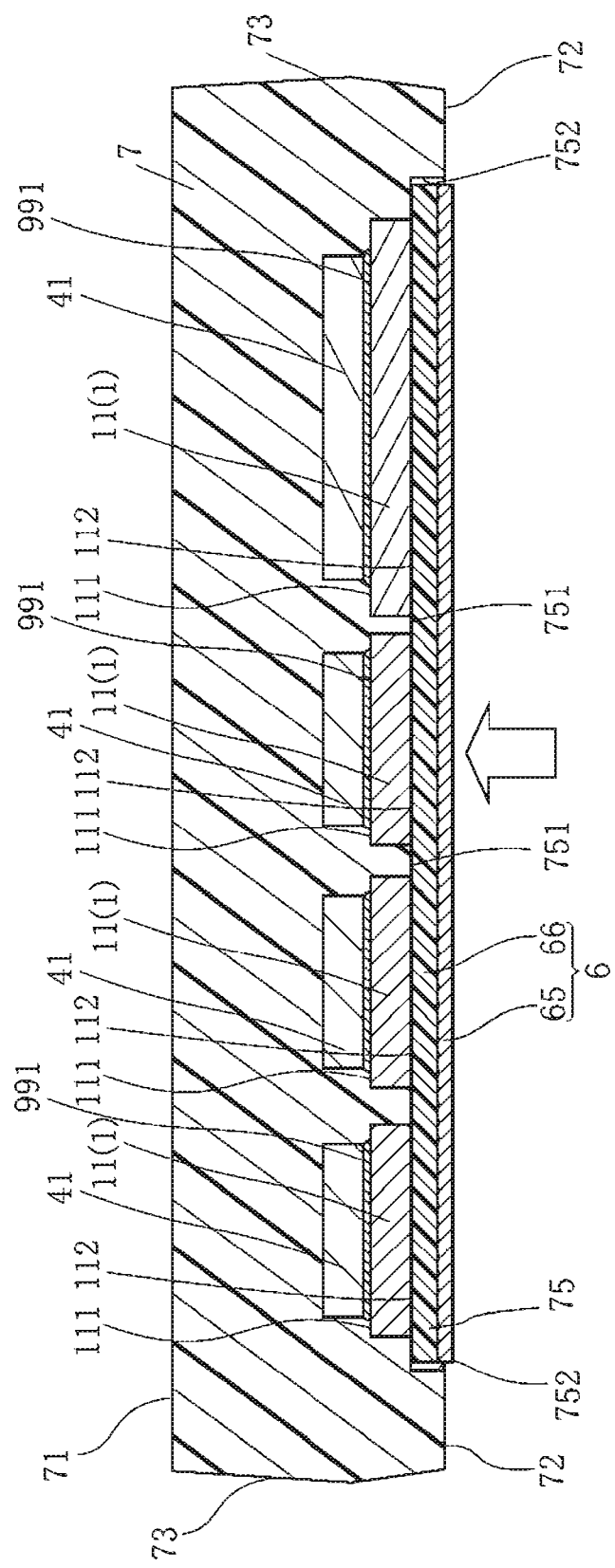
FIG. 48 is a sectional view showing a step which follows the one in FIG. 47.

Next, as shown in FIG. 48, a heat releasing layer 6 is fitted into the recess 75 of the sealing resin portion 7. Then, pressure and vibration are applied to the heat releasing layer 6. The heat releasing layer 6 may be heated, in addition. The pressure, vibration and heat soften the junction layer 66 of the heat releasing layer 6. The softened junction layer 66 fills the recess 75. Also, the junction layer 66 becomes in contact with the recess side surface 752.

Next, the lead frame 300 is appropriately cut to complete the manufacture of the semiconductor device 101D which is illustrated in FIG. 33, etc.

Next, functions of the present embodiment will be described.

Pairs of pressing pieces 831, 832 hold on the regions where wires 8 are to be bonded, i.e., at places sandwiching the electrodes 411 or the wire bonding region 13. This makes it possible to prevent the die pad 11 and the wire bonding region 13 from undue vibration and/or deformation due to the pressure and/or vibration applied when bonding the wire 8. Therefore, it becomes possible to appropriately bond the wires 8.

The first bonding portion 81 is positioned across a straight line connecting the press marks 113 (tips of the pressing pieces 831). This makes it possible to appropriately prevent the vibration and deformation of the die pad 11 which can otherwise be caused by the pressure and vibration from the capillary 851 during the first bonding step.

The second bonding portion 82 is positioned across a straight line connecting the press marks 131 (tips of the pressing pieces 832). This makes it possible to appropriately prevent the vibration and deformation of the wire bonding region 13 which can otherwise be caused by the pressure and vibration from the capillary 851 during the second bonding step.

The first bonding step to all of the electrodes 411 which are formed on the semiconductor chip 41 is performed under the state where the electrodes are sandwiched by the pressing pieces 831. This means that there is no need for moving the pair of pressing pieces 831 while the first bonding is being performed to a plurality of the electrodes 411. Therefore, the bonding steps are performed efficiently.

The present invention is not limited to the Embodiments described above. The present invention may be varied in many ways in any specific details. For example, as far as the metal layer is exposed from the sealing resin rear surface, the semiconductor device may not necessarily be of an insertion mounting type but may have terminals for surface mounting. Also, the invention is applicable not only to IPM devices mentioned earlier but also to a semiconductor device which includes only one semiconductor chip and an island, but has a metal layer exposed from a rear surface of a sealing resin.

(Appendix 1) A wire bonding method comprising a wire bonding step of bonding a wire while a pair of pressing pieces are pressed onto two places on a bonding object at a space from each other, onto a position in the bonding object between the pair of pressing pieces within a direction in which the pressing pieces are spaced from each other. (Appendix 2) The wire bonding method according to Appendix 1, wherein the wire is bonded to a place on the bonding object, across a straight line which connects the pair of pressing pieces, in the wire bonding step. (Appendix 3) The wire bonding method according to Appendix 1 or two, wherein the bonding object includes a die pad of a metal plate and a semiconductor chip mounted on the die pad and having one or more electrodes; in the wire bonding step, the pair of pressing pieces are pressed onto places in the die pad sandwiching the semiconductor chip while the wire is bonded to the electrodes. (Appendix 4) The wire bonding method according to Appendix 3, wherein the semiconductor chip has a plurality of electrodes, and in the wire bonding step, the pair of pressing pieces are pressed onto places sandwiching the plurality of electrodes while a wire is bonded individually to each of the electrodes. (Appendix 5) The wire bonding method according to Appendix 1 or 2, wherein the bonding object includes a wire bonding portion made of a metal plate, and in the wire bonding step, the pair of pressing pieces are pressed onto the wire bonding portion while a wire is bonded to the wire bonding portion. (Appendix 6) The wire bonding method according to Appendix 1 or 2, wherein the bonding object includes: a die pad made of a metal plate; a semiconductor chip mounted on the die pad and having one or more electrodes; and a wire bonding portion spaced from the die pad; and in the wire bonding step, the pair of pressing pieces are pressed onto places in the die pad sandwiching the semiconductor chip while a wire is bonded to the electrodes, and after this wire bonding step, an additional pair of pressing pieces are pressed onto the wire bonding portion and an additional wire bonding step is performed to the wire bonding portion. (Appendix 7) The wire bonding method according to Appendix 6, wherein the semiconductor chip has a plurality of electrodes, and in the wire bonding step, the pair of pressing pieces are pressed onto places sandwiching the plurality of electrodes while a wire is bonded individually to each of the electrodes. (Appendix 8) The wire bonding method according to one of Appendices 1 through 7, wherein the wire is made of aluminum. (Appendix 9) The wire bonding method according to Appendix 8, wherein pressure and vibration are applied to the wire in the wire bonding step. (Appendix 10) A semiconductor device comprising: a die pad having a main surface and a rear surface facing in opposite directions; a semiconductor chip mounted on the main surface of the die pad and having one or more electrodes; and a sealing resin portion covering the die pad and the semiconductor chip; wherein the die pad is formed with a pair of press marks spaced from each other, and a wire has an end bonded to a place on the electrode between the pair of press marks within a direction in which the pair of press marks are spaced from each other. (Appendix 11) The semiconductor device according to Appendix 10, wherein the end of the wire is bonded to cross a straight line which connects the pair of pressing pieces with each other, on the electrode. (Appendix 12) The semiconductor device according to Appendix 10 or 11, further comprising a wire bonding portion spaced from the die pad, wherein the wire bonding portion is formed with an additional pair of press marks which are spaced from each other, the wire has another end bonded to a place on the wire bonding portion between the additional pair of press marks within a direction in which the additional pair of press marks are spaced from each other. (Appendix 13) The semiconductor device according to Appendix 12, wherein said another end of the wire is bonded across a straight line which connects the additional pair of press marks with each other on the wire bonding portion. (Appendix 14) A semiconductor device comprising: a die pad including a main surface and a rear surface facing in opposite directions; a semiconductor chip mounted on the main surface of the die pad and including one or more electrodes; leads each electrically connected to the semiconductor chip via a wire; and a sealing resin portion covering the die pad, the semiconductor chip and part of the leads; wherein the lead is formed with a pair of press marks on its surface to sandwich a bonding place where the wire has its end bonded. (Appendix 15) The semiconductor device according to Appendix 11, wherein the leads formed with the press marks have a wider region than the leads not formed with press marks. (Appendix 16) The semiconductor device according to Appendix 11 or 12, wherein the wire includes those of different thicknesses, and the press marks are formed only near the bonding places of the wires of a greater thickness. (Appendix 17) The semiconductor device according to Appendix 13, comprising a plurality of the semiconductor chips, wherein the thick wire is used only for electrical connection between some of the semiconductor chips and the leads. (Appendix 18) The semiconductor device according to one of Appendices 11 through 14, wherein the die pad surface sandwiching the semiconductor chip is formed with a pair of press marks spaced from each other so as to sandwich the semiconductor chip. (Appendix 19) The semiconductor device according to one of Appendices 11 through 15, comprising a plurality of the semiconductor chips including an output transistor and a controlling semiconductor chip therefor, wherein the press marks spaced from each other on the lead are formed to sandwich a place where the lead is bonded to the output transistor.

FIG. 49 is a sectional view showing a packaging structure when use is made of a semiconductor device according to Embodiment 1E of the present invention.

A semiconductor device packaging structure 801 shown in FIG. 49 includes a semiconductor device 101E, a substrate 807 and a heat releasing member 808.

The substrate 807 is capable of having a plurality of electric components mounted thereon. The substrate 807 is made of an insulating material. The substrate 807 is formed with an unillustrated wiring pattern. The substrate 807 is formed with a plurality of holes 809. The heat releasing member 808 is made of a material which has a relatively high heat conductivity like a metal such as aluminum. The heat releasing member 808 is fixed to the substrate 807 by an unillustrated supporting member. The semiconductor device 101E is mounted on the substrate 807. In the present embodiment, the semiconductor device 101E is a so called IPM (Intelligent Power Module) product. The semiconductor device 101E is used for such an application as electric power source control in an air conditioner, a motor controller, etc.

Figure 50:
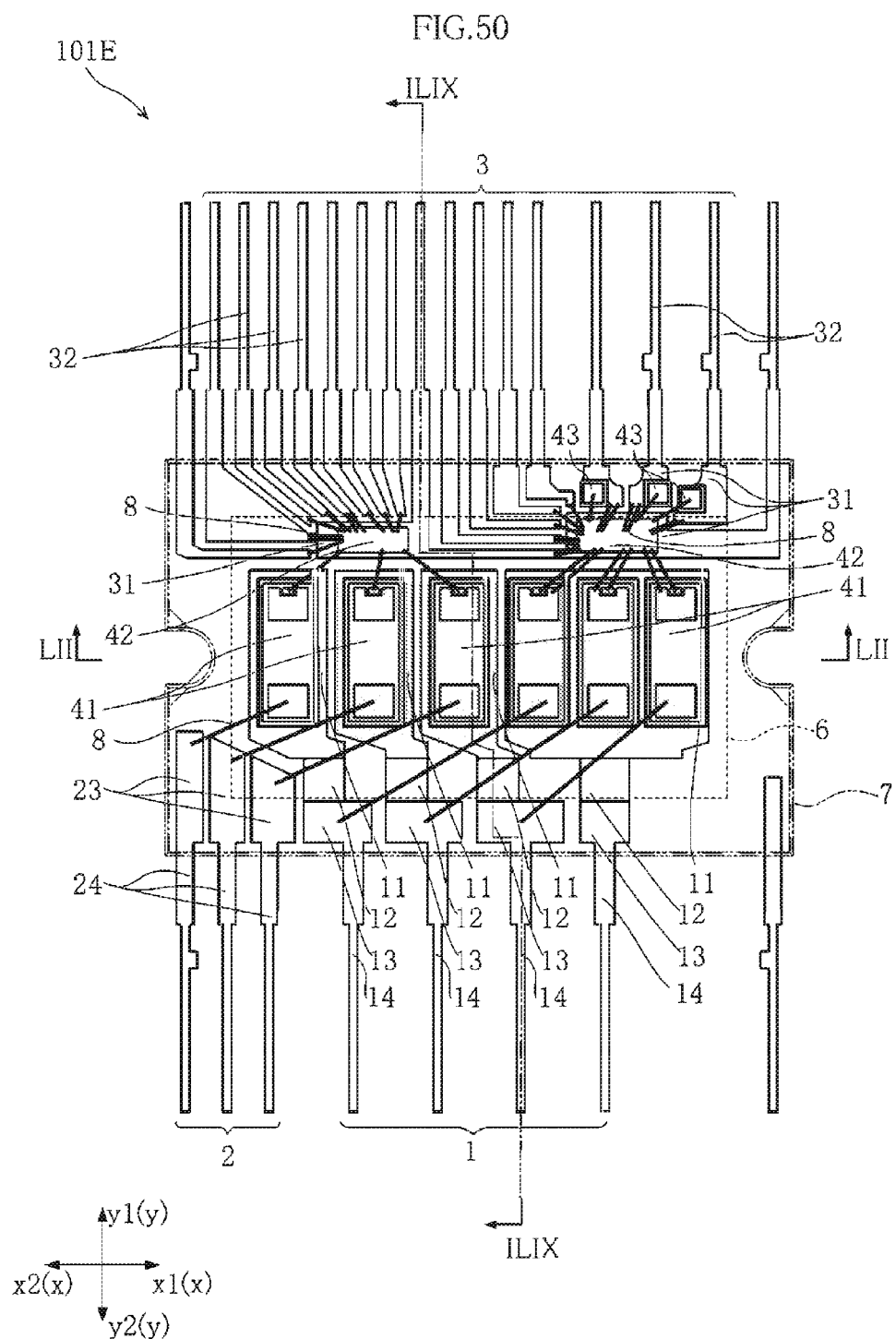
FIG. 50 is a plan view (partially unillustrated) of the semiconductor device according to Embodiment 1E of the present invention, before leads are bent.
Figure 51:
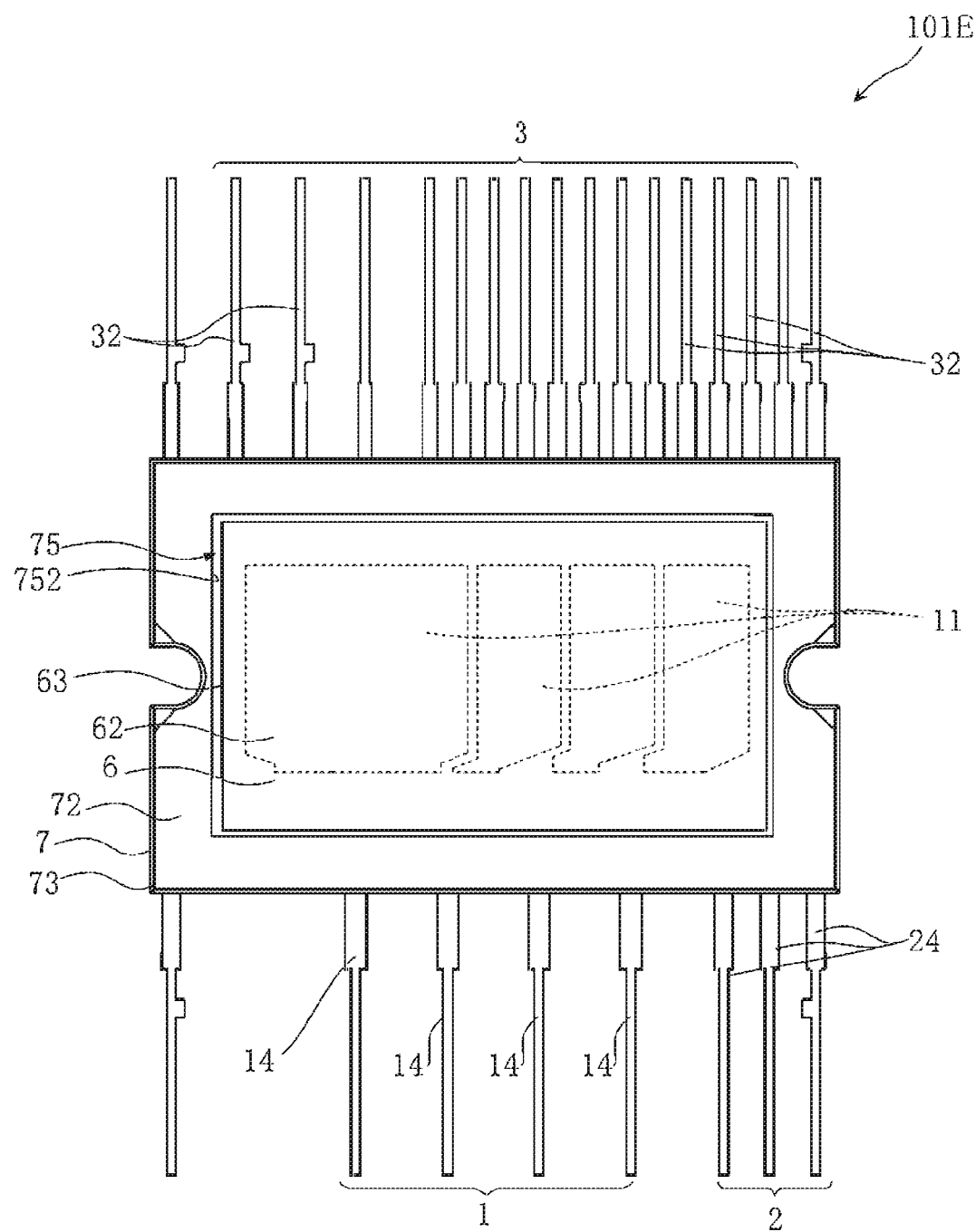
FIG. 51 is a bottom view of a semiconductor device according to Embodiment 1E of the present invention, before the leads are bent.
Figure 52:
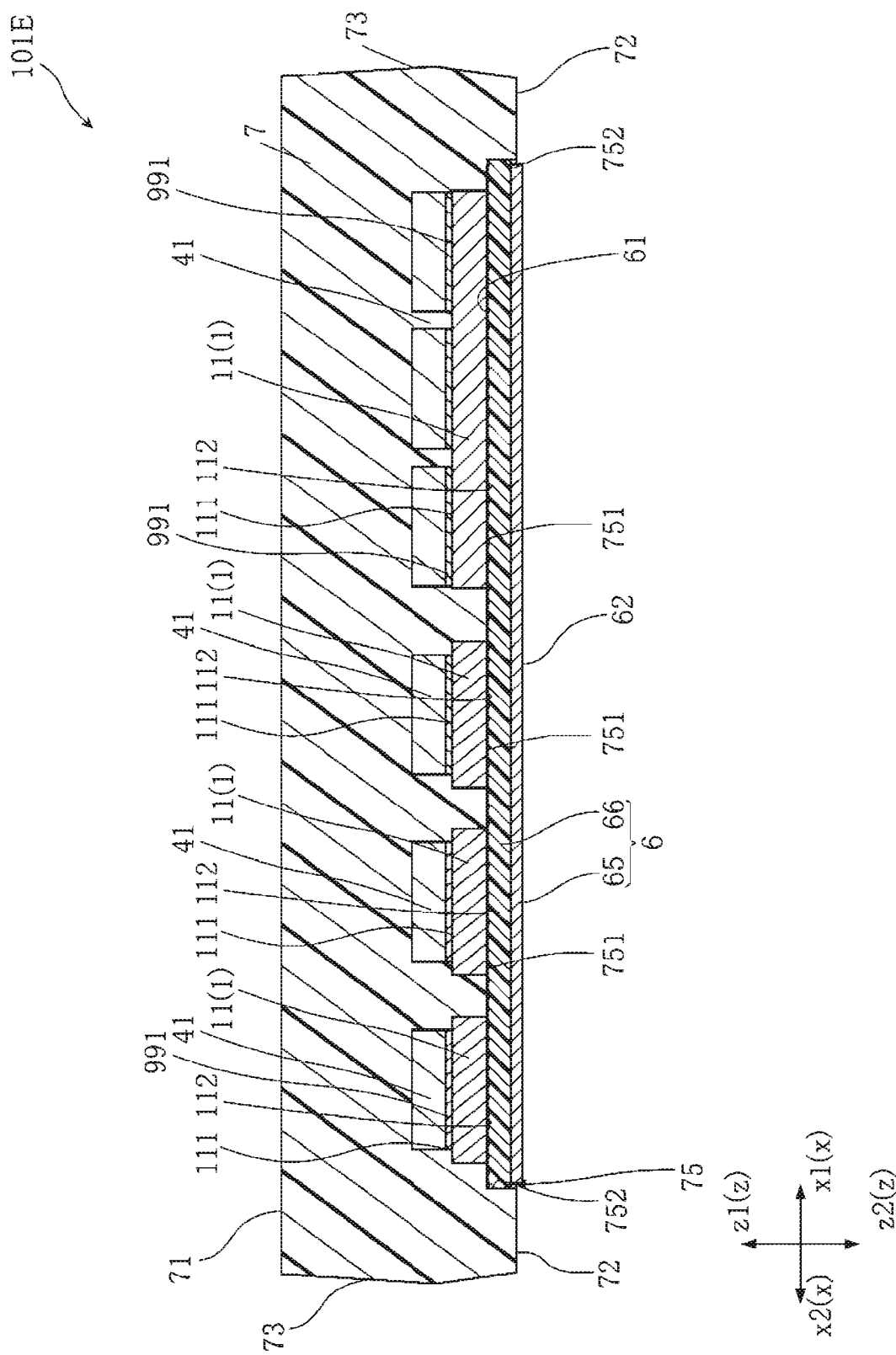
FIG. 52 is a sectional view taken in lines LII-LII in FIG. 50.
Figure 53:
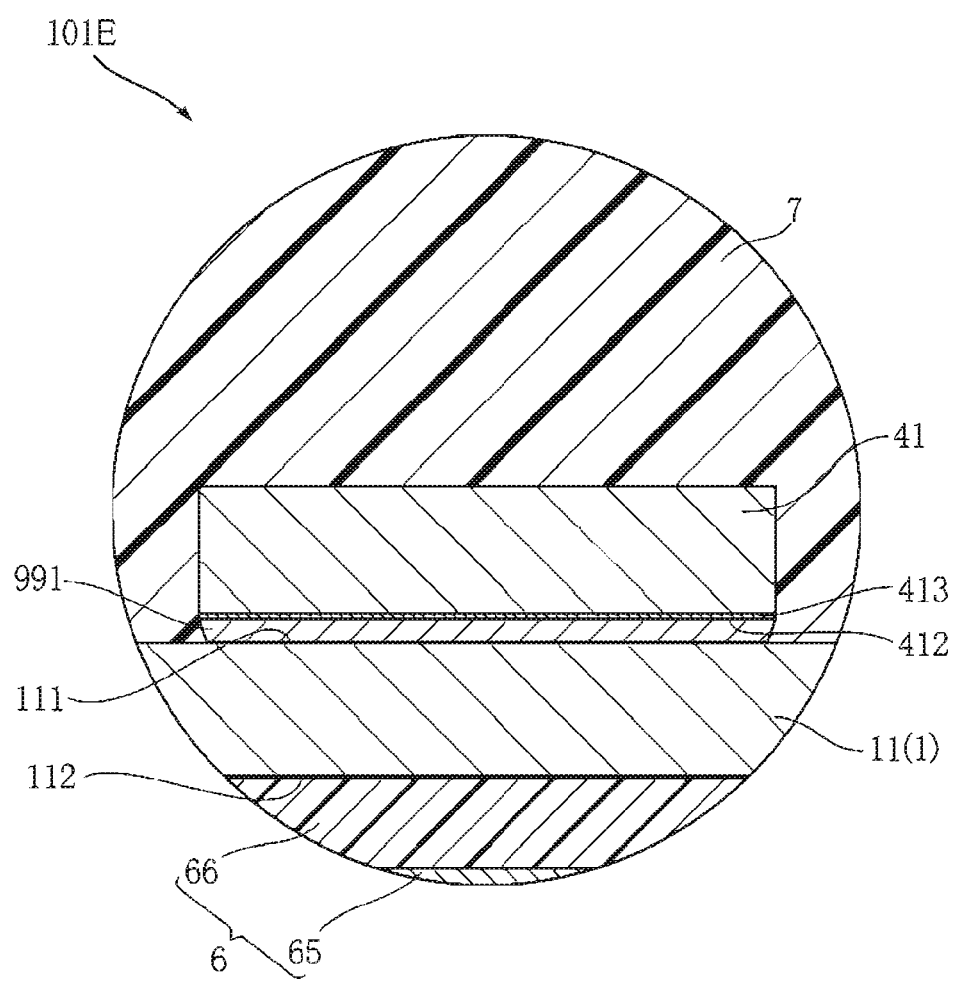
FIG. 53 is an enlarged sectional view of a primary portion taken from FIG. 52.

FIG. 50 is a plan view (partially unillustrated) of the semiconductor device according to Embodiment 1E of the present invention, before leads are bent. FIG. 51 is a bottom view of the semiconductor device according to Embodiment 1E of the present invention, before the leads are bent. FIG. 52 is a sectional view taken in lines LII-LII in FIG. 50. FIG. 53 is an enlarged sectional view of a primary portion taken from FIG. 52. FIG. 49 represents a section taken in lines ILIX-ILIX in FIG. 50. In FIG. 52, each component is illustrated schematically for easier comprehension.

The semiconductor device 101E shown in these drawings includes a plurality of first electrode portions 1, second electrode portions 2 and third electrode portions 3; a plurality of semiconductor chips 41, 42; passive component chips 43; a heat releasing layer 6; a sealing resin portion 7 and wires 8. FIG. 50 shows the heat releasing layer 6 in broken lines and the sealing resin portion 7 in imaginary lines.

The sealing resin portion 7 covers the plurality of the first electrode portions 1, the second electrode portions 2, and the third electrode portions 3; the semiconductor chips 41, 42; and the passive component chips 43. The sealing resin portion 7 is made of a black epoxy resin for example. As shown in FIG. 51 and FIG. 52, the sealing resin portion 7 has a resin main surface 71, a resin bottom surface 72 and a resin side surface 73.

The resin main surface 71 is a flat surface which faces in a direction z11 and extends along an xy plane. The resin bottom surface 72 is a flat surface which faces in a direction z2 that is opposite to the direction z1 and extends along an xy plane. The resin side surface 73 surrounds the semiconductor chips 41, 42 and the passive component chips 43 in xy-plane view. The resin side surface 73 is connected to the resin main surface 71 and the resin bottom surface 72.

As clearly shown in FIG. 52, the sealing resin portion 7 is formed with a recess 75. The recess 75 recedes from the resin bottom surface 72. The recess 75 has a recess bottom surface 751 and a recess side surface 752. The recess bottom surface 751 extends along an xy plane. The recess side surface 752 is connected to the resin bottom surface 72. The recess side surface 752 extends substantially in a direction z.

As shown in FIG. 50, the semiconductor chips 41, 42 and the passive component chips 43 are rectangular in plan view. The semiconductor chip 41 is a power chip such as an IGBT, MOS and diode, or an output transistor. The semiconductor chip 42 is an LSI chip such as a control IC, or controls the semiconductor chip 41. The passive component chips 43 are, for example, resisters, capacitors or other passive components.

The first electrode portions 1, the second electrode portions 2 and the third electrode portions 3 in FIG. 50 are all made of an electrically conductive material. An example of such an electrically conductive material is copper. The electrode portion shown in a bottom right region in FIG. 50 is grounded.

Each of the plurality (four, in the present embodiment) of the first electrode portions 1 includes a die pad 11 (see FIG. 49, FIG. 50 and FIG. 52), a connecting region 12 (see FIG. 49 and FIG. 50), a wire bonding region 13 (see FIG. 49 and FIG. 50) and a lead 14 (see FIG. 49 through FIG. 51). The first electrode portions 1 are spaced from each other in the direction x.

Each die pad 11 is a flat plate extending along and parallel to an xy plane. The semiconductor chip 41 is disposed on the die pad 11. As shown in FIG. 52, a solder 991 is between the die pad 11 and the semiconductor chip 41. The solder 991 is an example of the electrically conductive joining material according to the present invention. The solder 991 may be replaced with an Ag paste. Solder has a relatively large thermal conductivity. The solder 991 can conduct heat efficiently from the semiconductor chip 41 to the die pad 11. Each of the die pads 11 is exposed from the recess bottom surface 751.

As shown in FIG. 53, the semiconductor chip 41 is formed with rear surface electrode 221. The rear surface electrode 413 is made of a material which has a relatively high solder wettability such as Ag, Au, Ni or an alloy containing any of these metals. In the present embodiment, the semiconductor chip 41 has a rear surface 412 provided by the rear surface electrode 413.

Each die pad 11 has a die pad main surface 111 and a die pad rear surface 112. The die pad main surface 111 faces in the direction z1 whereas the die pad rear surface 112 faces in the direction z2. In other words, the die pad main surface 111 and the die pad rear surface 112 are arranged to face in the mutually opposite directions. The semiconductor chip 41 is disposed on the die pad main surface 111. The solder 991 is between the die pad main surface 111 and the semiconductor chip 41. The die pad rear surface 112 is located at the same position as the recess bottom surface 751 in a thickness direction (the direction z) of the die pad 11. However, the die pad rear surface 112 may be closer to an opening of the recess 75 than is the recess bottom surface 751.

The die pad 11 is made of Cu, an Fe—Ni alloy or Fe for example, so the die pad main surface 111 has a relatively low solder wettability. In the present embodiment, an area of the join between the solder 991 and the rear surface 412 of the semiconductor chip 41 is greater than an area of the join between the solder 991 and the die pad main surface 111.

As shown in FIG. 50, each connecting region 12 is disposed between the die pad 11 and the wire bonding region 13, and connected to the die pad 11 and to the wire bonding region 13. As shown in FIG. 49, the connecting region 12 extends along a plane which is inclined with respect to an xy plane. The connecting region 12 is inclined with respect to an xy plane in such a manner that it goes farther in the direction z1 as it is further away from the die pad 11.

Each wire bonding region 13 shown in FIG. 49 and FIG. 50 extends along an xy plane. In the direction z, each wire bonding region 13 is on a side more toward the direction z1 than is the die pad 11. A wire 8 is bonded to one of the wire bonding regions 13 and to one of the semiconductor chips 41. Thus, electrical conductivity is established between said one of the wire bonding regions 13 and said one of the semiconductor chips 41. The leads 14 are connected to the wire bonding regions 13. Each lead 14 extends along the direction y. The lead 14 has a portion extending out of the resin side surface 73 of the sealing resin portion 7. In the present embodiment, the leads 14 are for insertion mounting. As shown in FIG. 49, when mounting the semiconductor device 101E on the substrate 807, the leads 14 are bent and inserted through the holes 809. For fixing the leads 14 in the substrate 807, the holes 809 are filled with solder layers 810.

As shown in FIG. 50, each of the plurality (three, in the present embodiment) of the second electrode portions 2 includes a wire bonding region 23 and a lead 24. The second electrode portions 2 are spaced from each other in the direction x.

Each wire bonding region 23 extends along an xy plane. In the direction 2, each wire bonding region 23 is on a side more toward the direction z1 than is the die pad 11. A wire 8 is bonded to one of the wire bonding regions 23 and to one of the semiconductor chips 41. Thus, electrical conductivity is established between said one of the wire bonding regions 23 and said one of the semiconductor chips 41. The leads 24 are connected to the wire bonding regions 23. Each lead 24 extends in the direction y. The lead 24 has a portion extending out of the resin side surface 73 of the sealing resin portion 7. In the present embodiment, the leads 24 are for insertion mounting. Though not illustrated, when mounting the semiconductor device 101E on the substrate 807, the leads 24 are bent and inserted through the holes 809 like the leads 14.

The third electrode portions 3 shown in FIG. 49, FIG. 50 includes a plurality of control die pads 31 and a plurality of leads 32. The control die pads 31 and the leads 32 are respectively disposed at the same positions in the direction z. On each control die pad 31, the semiconductor chip 42 or the passive component chips 43 is disposed. A junction layer (not illustrated) is formed between the control die pad 31 and the semiconductor chip 42, and between the control die pads 31 and the passive component chips 43. The control die pads 31 need not have its rear surface faced to the heat releasing layer 6 or exposed.

Each lead 32 has a portion extending out of the resin side surface 73 of the sealing resin portion 7. In the present embodiment, the leads 32 are for insertion mounting. As shown in FIG. 49, when mounting the semiconductor device 101E on the substrate 807, the leads 32 are bent and inserted through the holes 809. As has been described in relation with the leads 14, the holes 809 are filled with solder layers 810 for fixing the leads 32 in the substrate 809. A wire 8 is bonded to one of the leads 32 and to one of the semiconductor chips 42. Thus, electrical conductivity is established between said one of the leads 32 and said one of the semiconductor chips 42. Also, a wire 8 is bonded to one of the semiconductor chip 42 and to one of the passive component chips 43.

As shown in FIG. 52, the heat releasing layer 6 is in the recess 75 in the sealing resin portion 7. The heat releasing layer 6 is surrounded by the recess side surface 752. In the present embodiment, the heat releasing layer 6 is a flat plate extending along and parallel to an xy plane. In the present embodiment, the heat releasing layer 6 is constituted by the metal layer 65 and the junction layer 66. The metal layer 65 is on a side toward the z2 direction, and is made of Cu, aluminum or ceramics, for example, having a thickness of approximately 105 μm. The junction layer 66 is on a side toward the z1 direction with respect to the metal layer 65 and joins the metal layer 65 to the die pad rear surfaces 112 of the die pads 11. The junction layer 66 is made of an insulating resin for example, and has a thickness of approximately 250 μm for example. The resin becomes soft when it receives pressure and vibration in a manufacturing step of the semiconductor device 101E, and is in direct contact with all of the die pads 11 on which the semiconductor chips 41 are mounted. The metal layer 65 may have a region(s) slightly out of the resin bottom surface 72. The junction layer 66 is in contact with the recess side surface 752.

The heat releasing layer 6 is for quickly releasing heat which was generated in the semiconductor chip 41 to outside of the semiconductor device 101E. In order to quickly release the heat generated by the semiconductor chip 41 to outside of the semiconductor device 101E, the heat releasing layer 6 should be made of a material of a large thermal conductivity. While a larger thermal conductivity is preferred, there can be a potential problem that the metal layer 65 will peel off, if the heat releasing layer's thermal expansion coefficient differs greatly from that of the sealing resin portion 7. Preferably, therefore, the heat releasing layer 6 is of a material which has a larger thermal conductivity than that of a material which constitutes the sealing resin portion 7, and a similar thermal expansion coefficient to that of the material which constitutes the sealing resin portion 7. The heat releasing layer 6 is faced directly to all of the die pads 11. As shown in FIG. 51, the heat releasing layer 6 covers all of the die pads 11 entirely in xy plane view (i.e., as viewed in the thickness direction of the heat releasing layer 6).

As shown in FIG. 51 and FIG. 52, the heat releasing layer 6 has a heat releasing layer main surface 61 and a heat releasing layer rear surface 62. The heat releasing layer main surface 61 faces in the direction z1. The heat releasing layer main surface 61 covers the die pad rear surfaces 112 and the recess bottom surfaces 751 of all of the die pads 11 in xy-plane view. The heat releasing layer main surface 61 is in direct contact with the die pad rear surface 112 and the recess bottom surface 751. The heat releasing layer rear surface 62 faces in the direction z2 which is a direction opposite to the direction in which the heat releasing layer main surface 61 faces. The heat releasing layer rear surface 62 is not covered by the sealing resin portion 7 and is exposed from the sealing resin portion 7.

Next, a method of making the semiconductor device 101E will be described. Drawings for describing the method will use the same reference symbols as those used thus far in identifying those described thus far.

Figure 54:
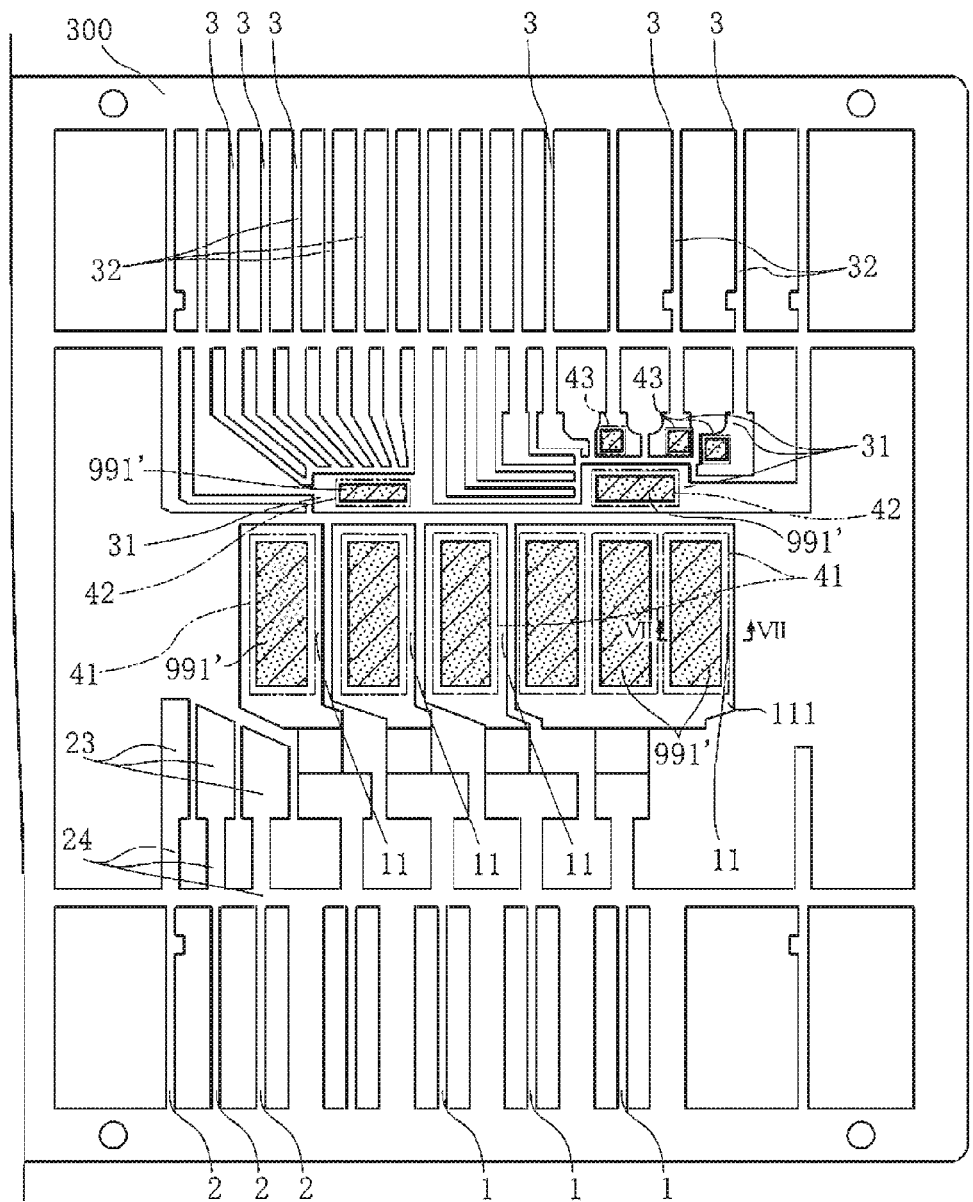
FIG. 54 is a plan view showing a manufacturing step of the semiconductor device according to Embodiment 1E of the present invention.

First, as shown in FIG. 54, a lead frame 300 which includes a plurality of die pads 11, 31 is prepared. Then, the following steps are performed to apply solder paste 991'. The solder paste 991' is an example of the electrically conductive joining paste according to the present invention. The solder paste 991' may be replaced with an Ag paste or other paste containing a metal and an organic solvent. As shown in the drawing, areas to which the solder paste 991' is applied are smaller than and included within corresponding areas of the semiconductor chips 41, 42 or of the passive component chips 43 in plan view. Hereinafter, FIG. 55 through FIG. 59 will be referenced in describing, as an example, how the solder paste 991' is applied to the die pad 11 and then the semiconductor chip 41 is joined thereto. It should be noted here that for the sake of better heat release, the following method may be used only in those areas on a die pad 11 where a plurality of semiconductor chips 41 are to be mounted, with the remaining area of the electrically conductive joining paste treated in a conventional method.

Figure 55:
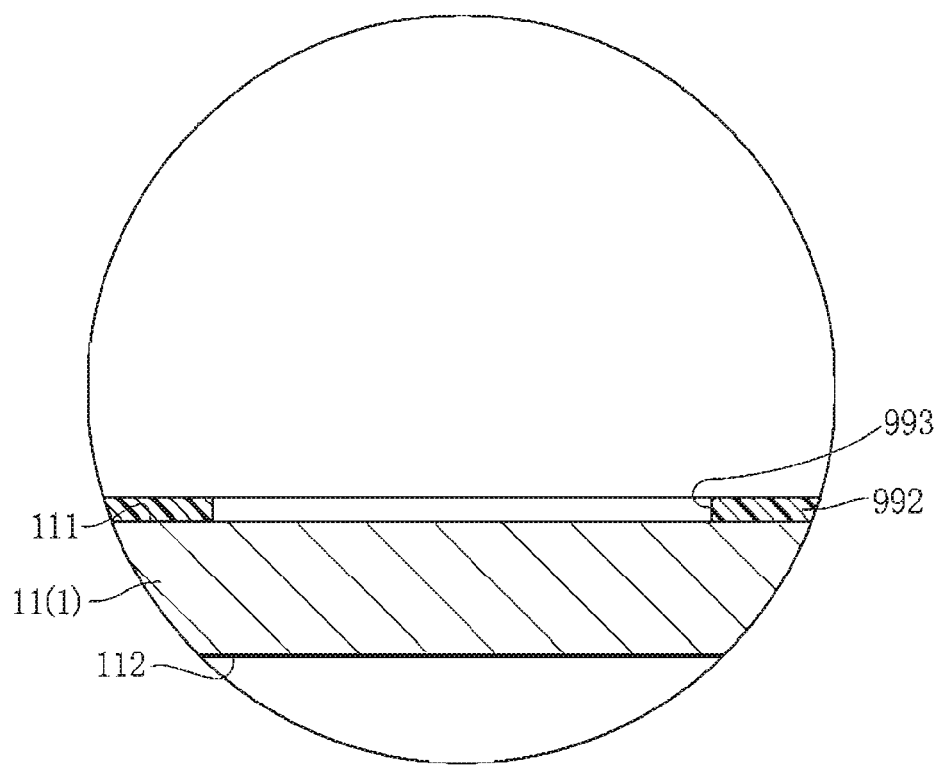
FIG. 55 is an enlarged sectional view of a primary portion, showing a step which follows the one in FIG. 54.

First, as shown in FIG. 55, a mask layer 992 is prepared. The mask 992 is formed with a plurality of openings 993. These openings 993 correspond to the application areas of the solder paste 991' shown in FIG. 54. Using the mask 992, the lead frame 300 is covered.

Figure 56:
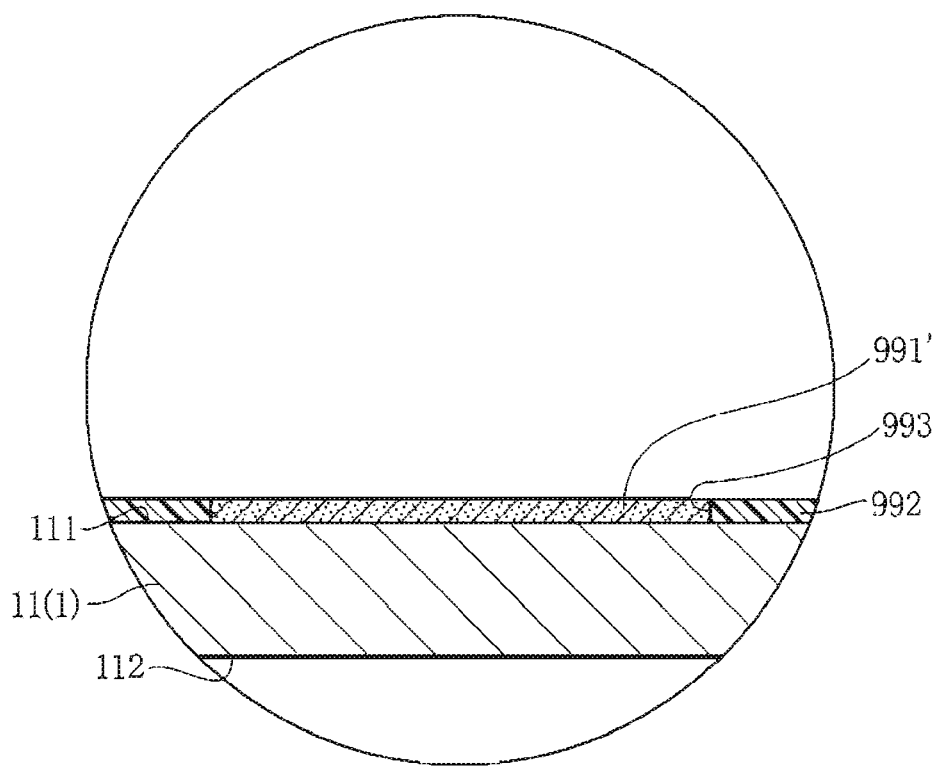
FIG. 56 is an enlarged sectional view of a primary portion, showing a step which follows the one in FIG. 55.
Figure 57:
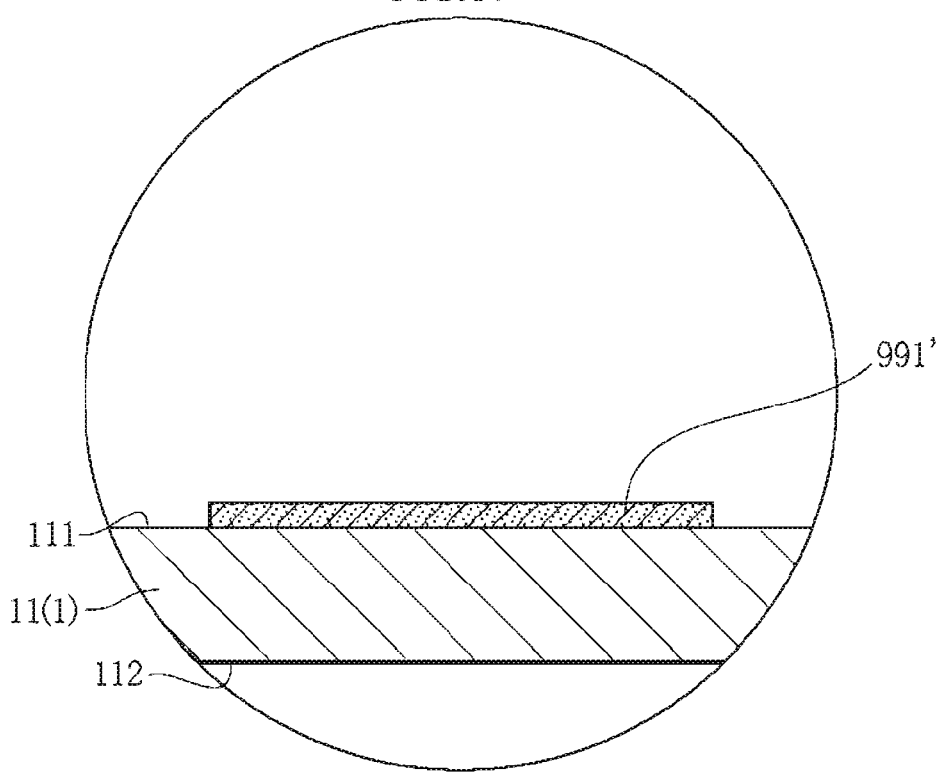
FIG. 57 is an enlarged sectional view of a primary portion, showing a step which follows the one in FIG. 56.
Figure 58:
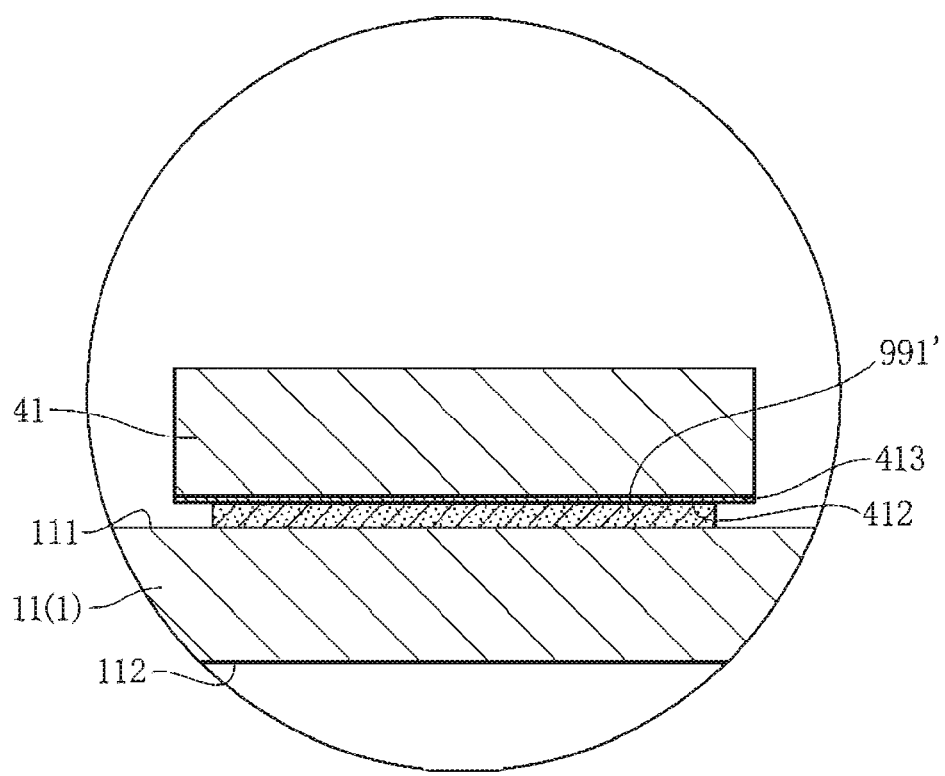
FIG. 58 is an enlarged sectional view of a primary portion, showing a step which follows the one in FIG. 57.

Next, as shown in FIG. 56, solder paste 991' is applied. The application is performed by filling the openings 993 in the mask 992 with the solder paste 991'. Next, as shown in FIG. 57, the mask 992 is removed, which leaves the solder paste 991' applied in the desired areas.

Next, the semiconductor chips 41 are placed on the areas of the solder paste 991'. The areas to which the solder paste 991' is applied are smaller than the areas of the semiconductor chips 41 in plan view. The semiconductor chips 41 are placed so as to entirely conceal and further overhang these areas of the solder paste 991'. In this process, placement is also made for semiconductor chips 42 and passive component chips 43 which are described earlier.

Figure 59:
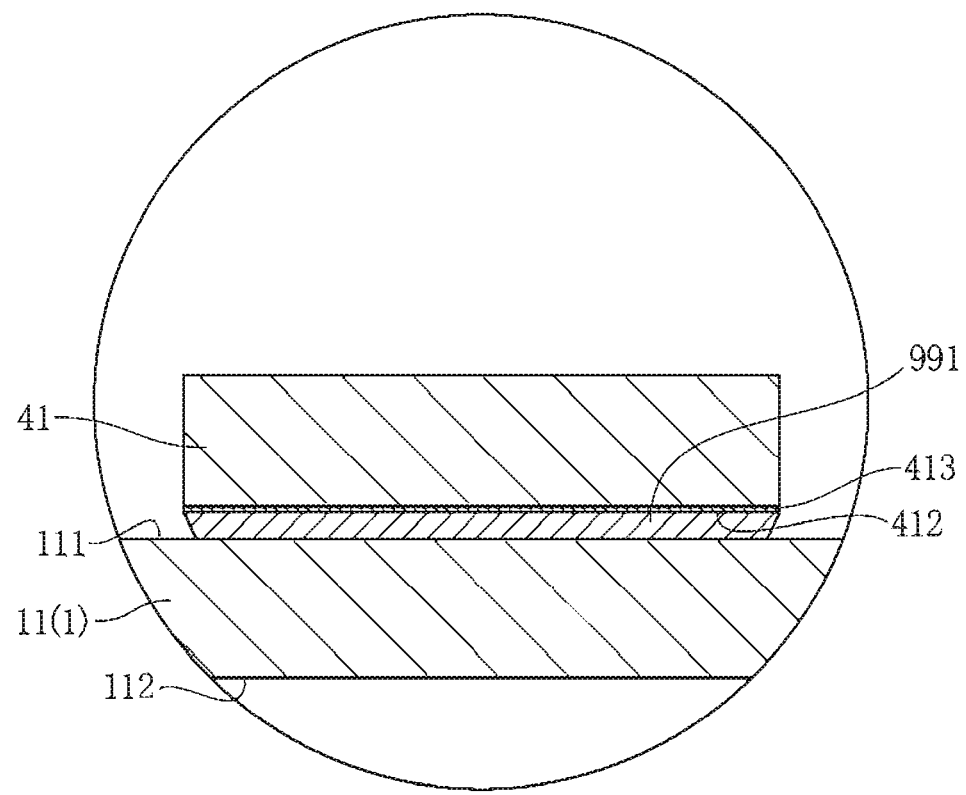
FIG. 59 is an enlarged sectional view of a primary portion, showing a step which follows the one in FIG. 58.
Figure 60:
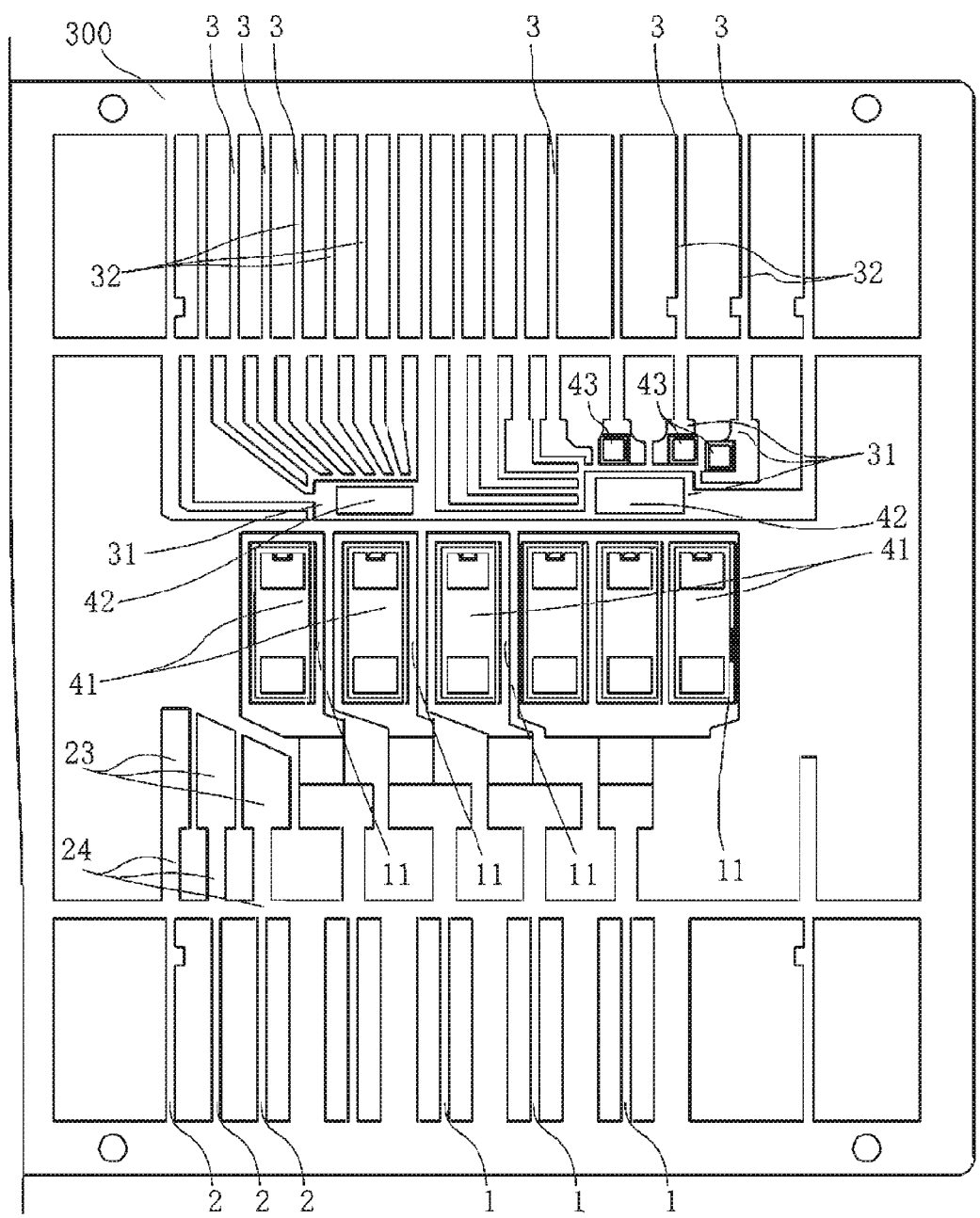
FIG. 60 is a plan view showing a step which follows the one in FIG. 59.

Next, the lead frame 300 is placed and heated in a reflow furnace for example, to melt the solder paste 991'. Since the semiconductor chip 41 has a rear surface 412 (the rear surface electrode 413) made of, e.g., Ag or Au which has a relatively high solder wettability, the molten solder paste 991' spread over the entire surface. On the other hand, the main surface 111 of the die pad 11 is made of Cu, an Fe—Ni alloy or Fe which has a relatively low solder wettability, and therefore, the molten solder paste 991' does not tend to spread. Consequently, the solder 991 as shown in FIG. 59 is obtained from the heating in the reflow furnace. In the solder 991, an area shared with to the rear surface 412 of the semiconductor chip 41 is greater than an area of shared with the main surface 11 of the die pad 11. FIG. 60 shows a lead frame 300 which was taken out of the reflow furnace.

Figure 61:
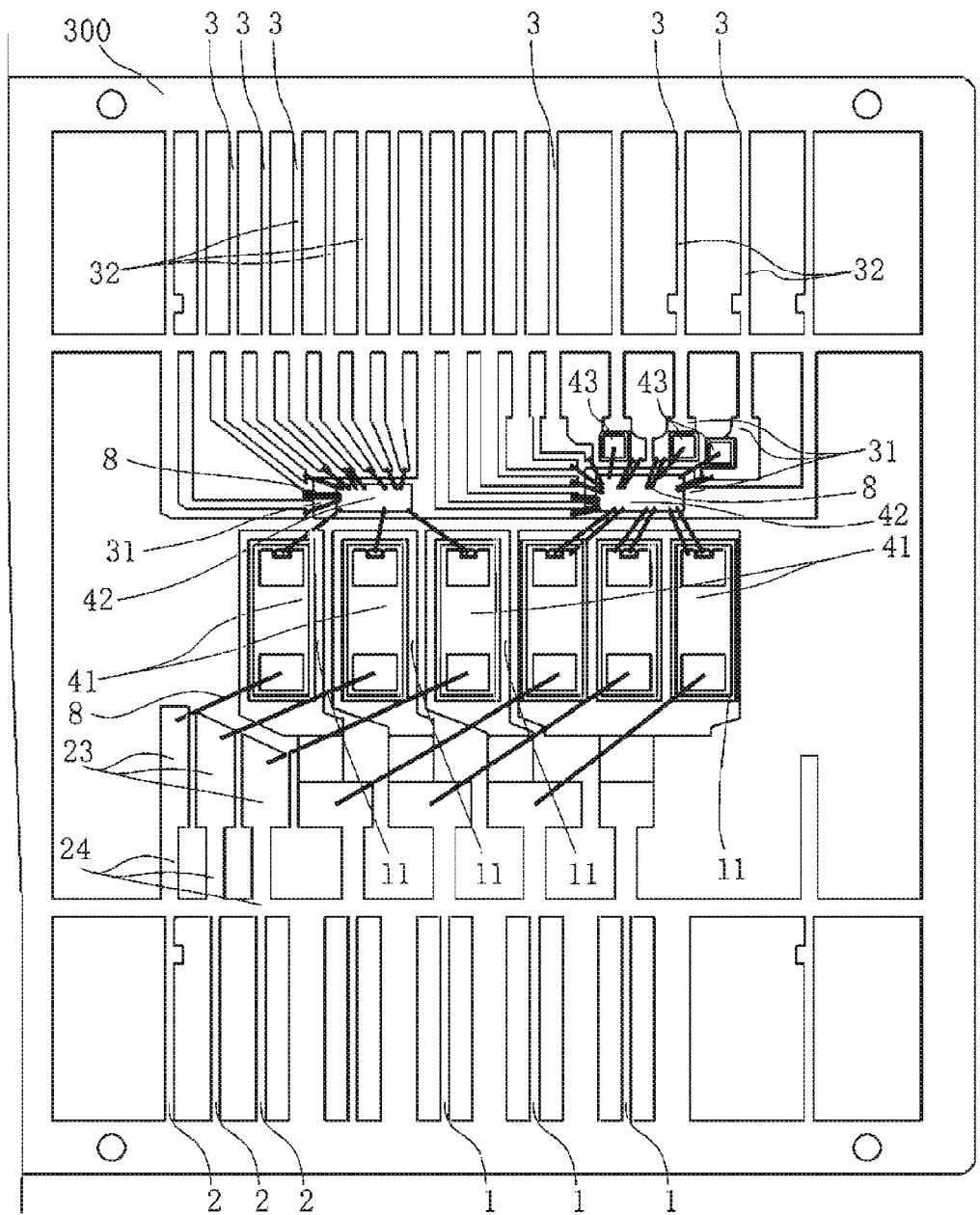
FIG. 61 is a plan view showing a step which follows the one in FIG. 60.

Next, as shown in FIG. 61, a wire 8 is bonded to each of the semiconductor chips 41, 42, etc., and to their corresponding leads.

Figure 62:
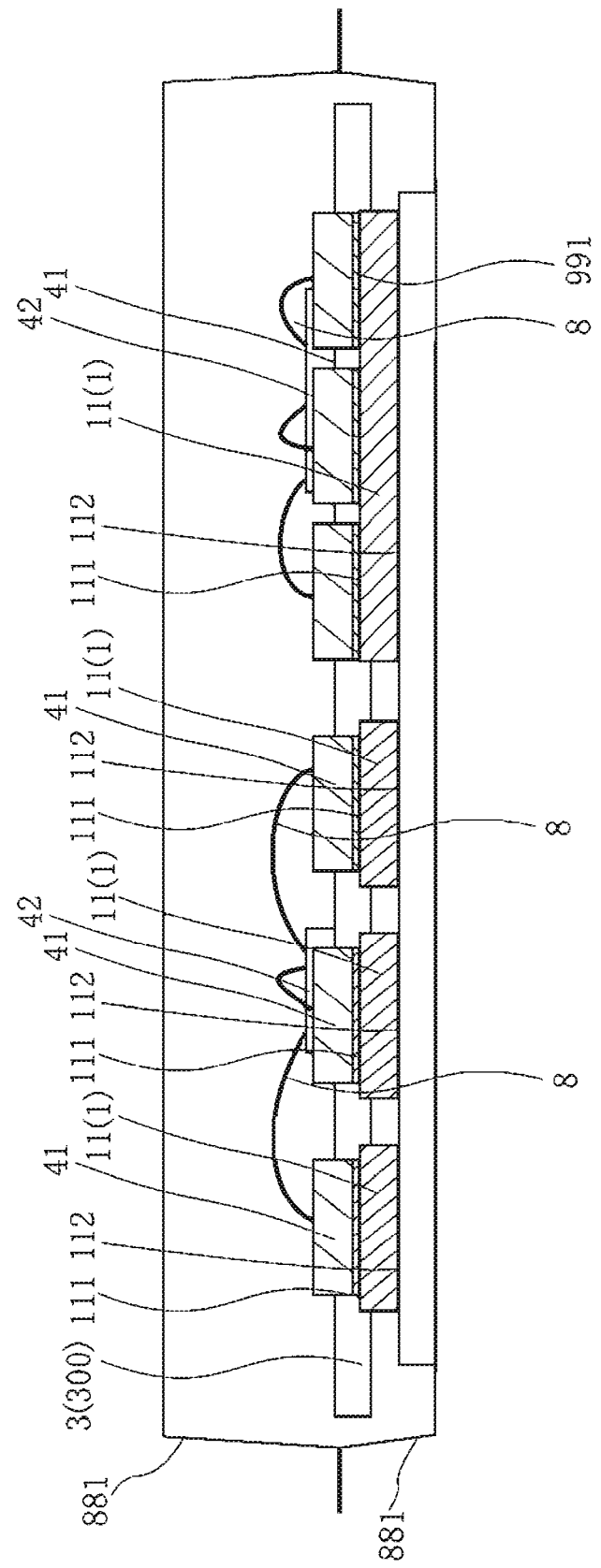
FIG. 62 is a sectional view showing a step which follows the one in FIG. 61.
Figure 63:
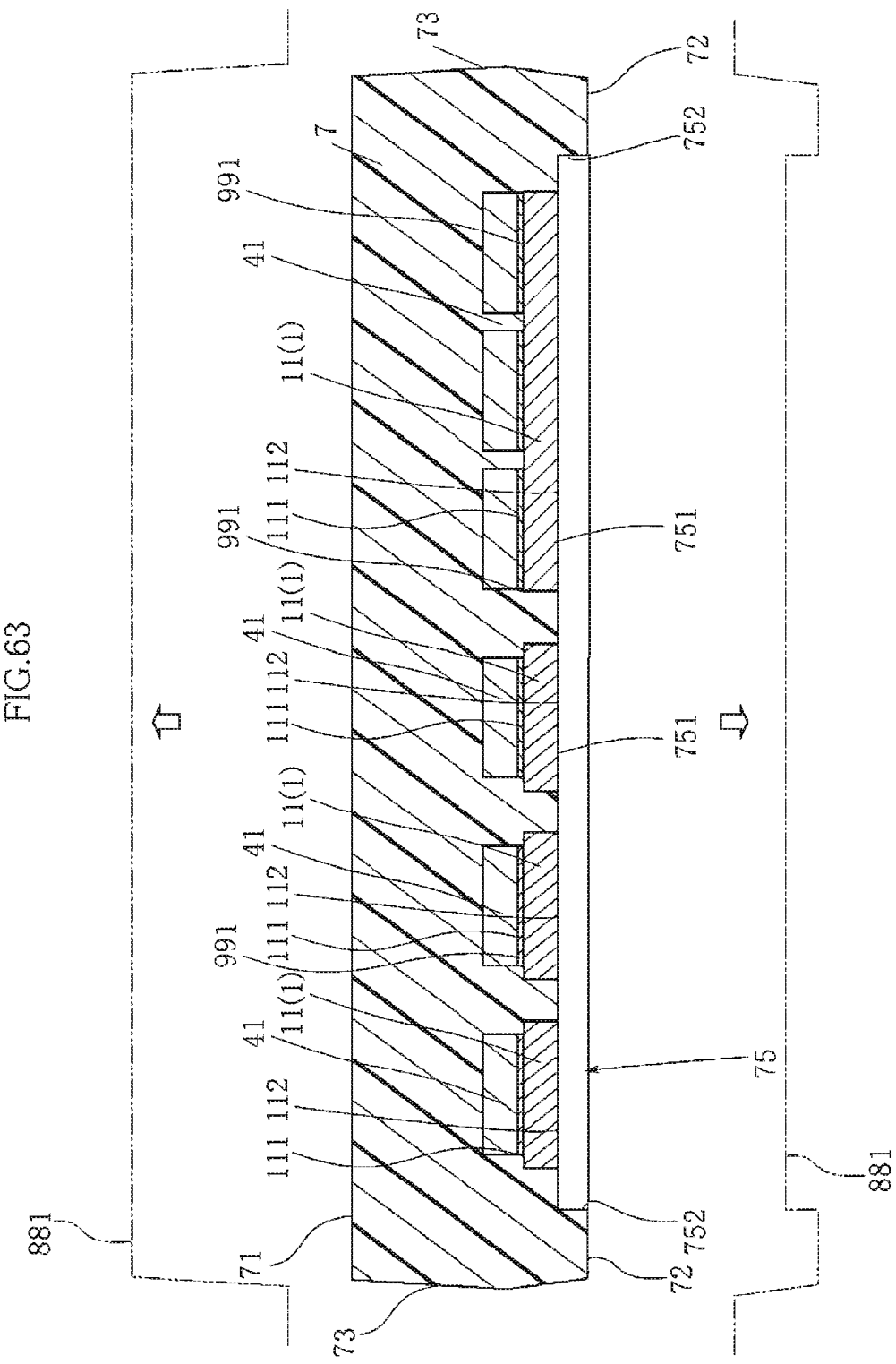
FIG. 63 is a sectional view showing a step which follows the one in FIG. 62.

Next, as shown in FIG. 62 and FIG. 63, a sealing resin portion 7 is formed. As shown in FIG. 62, the formation of the sealing resin portion 7 is performed by means of a molding method using a metal mold 881. As shown in the drawing, the die pads 11 and other components are held inside the metal mold 881. Next, a resin material is injected into the metal mold 881, and then the resin material is allowed to set. Once the resin material is set, the metal mold 881 is taken away from the die pads 11 and other components as shown in FIG. 63. Thus, the sealing resin portion 7 is formed. In the steps of forming the sealing resin portion 7, a recess 75 is formed in the sealing resin portion 7 for exposure of the die pads 11.

Figure 64:
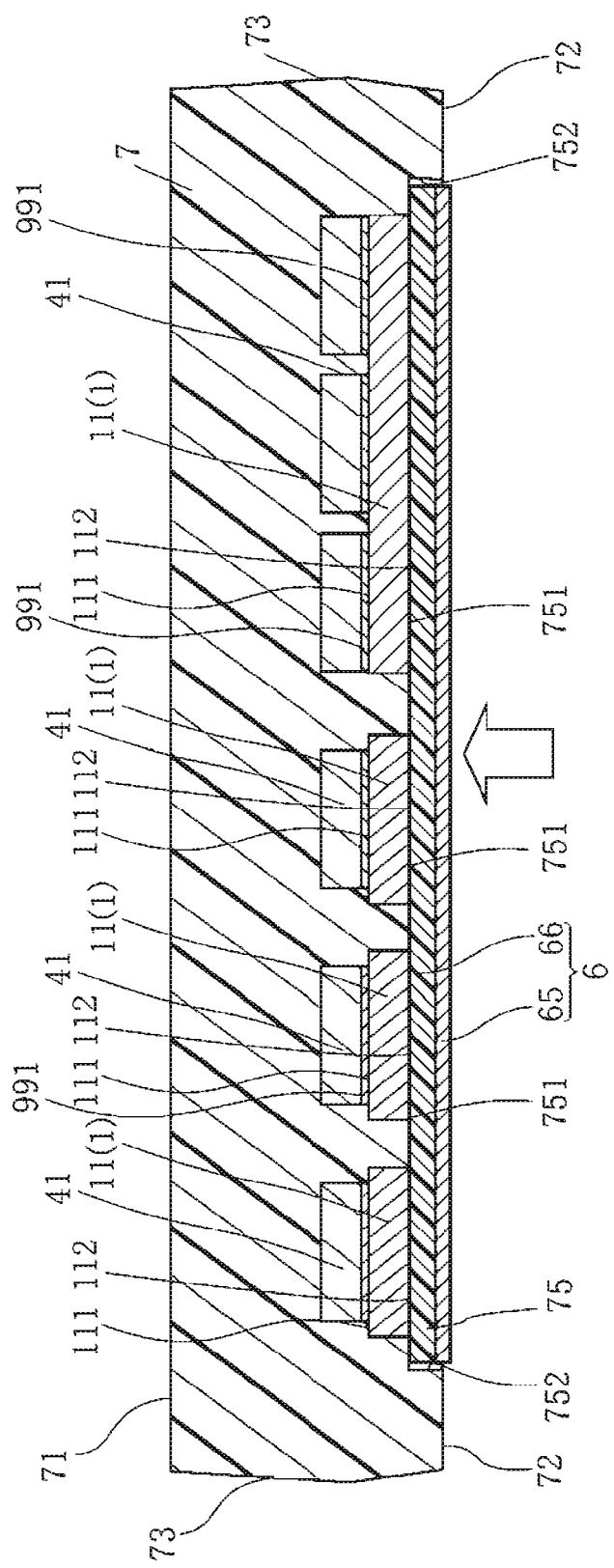
FIG. 64 is a sectional view showing a step which follows the one in FIG. 63.

Next, as shown in FIG. 64, a heat releasing layer 6 is fitted into the recess 75 of the sealing resin portion 7. Then, pressure and vibration are applied to the heat releasing layer 6. The heat releasing layer 6 may be heated, in addition. The pressure, vibration and heat soften the junction layer 66 of the heat releasing layer 6. The softened junction layer 66 fills the recess 75. Also, the junction layer 66 becomes in contact with the recess side surface 752.

Next, the lead frame 300 is appropriately cut to complete the manufacture of the semiconductor device 101E which is illustrated in FIG. 50, etc.

Next, functions of the present embodiment will be described.

According to the present embodiment, solder paste 991' is applied to an area which is smaller than a plan-view area of the semiconductor chip 41, and the semiconductor chip 41 is placed to entirely conceal and further overhang the pasted area. If the solder paste 991' is heated under this state, the solder 991 tends to remain within the semiconductor chip 41 in plan view. Therefore, it becomes possible to prevent such a situation that mutually adjacent two pieces of solder 991 which are formed for joining two semiconductor chips 41 to respective die pad main surface 111 make an undue contact with each other, or a situation that only part of the solder paste reaches an end of the die pad. Thus, the arrangement makes it possible to eliminate solder erosion, or a problem that surface tension, for example, in the solder paste will move the semiconductor chips off their predetermined positions. Hence it becomes possible to dispose the semiconductor chips onto their predetermined places for easier wiring operations. This also makes it possible to decrease a distance between mutually adjacent chips, making it possible to further decrease the outer size of the semiconductor device.

The rear surface 412 of the semiconductor chip 41 is made to have a relatively high solder wettability while the main surface 111 of the die pad 11 is made to have a relatively low solder wettability. This makes it possible to appropriately prevent the solder 991 from spreading unduly.

The mask 992 is used when applying the solder paste 991'. This is suitable for applying the solder paste 991' more accurately in intended regions. It should be noted here that the solder paste 991' may be applied in other methods than using the mask 992. For example, application may be made by dropping solder paste 991' from a syringe.

The present invention is not limited to the Embodiments described above. The present invention may be varied in many ways in any specific details. For example, the invention is applicable not only to IPM semiconductor devices described thus far but also to other semiconductor devices such as a power transistor which includes only one semiconductor chip and an island, as far as the semiconductor device make use of a thick and hard wire made of, e.g., aluminum. Further, the invention is also applicable not only to those devices of an insertion mounting type but also to those which have terminals for surface mounting.

(Appendix 1) A method for making a semiconductor device comprising: an application step of applying an electrically conductive joining paste on a main surface of a die pad; a placement step of placing a semiconductor chip, which is larger than an area covered by the electrically conductive joining paste as viewed in a direction in which the main surface faces, by making a rear surface of the semiconductor chip contact with the electrically conductive joining paste so that the area covered by the electrically conductive joining paste is contained by the rear surface as viewed in the direction in which the main surface faces; and a joining step of softening and then hardening the electrically conductive joining paste thereby forming an electrically conductive joining material. (Appendix 2) The method for making a semiconductor device according to Appendix 1, wherein the electrically conductive joining paste is provided by a solder paste. (Appendix 3) The method for making a semiconductor device according to Appendix 2, wherein the main surface is covered by a mask which has openings, and the openings are filled with the electrically conductive joining paste, in the application step. (Appendix 4) The method for making a semiconductor device according to one of Appendices 1 through 3, wherein the rear surface of the semiconductor chip has a higher wettability to the electrically conductive joining paste than the main surface of the die pad. (Appendix 5) The method for making a semiconductor device according to Appendix 4, wherein the rear surface of the semiconductor chip is made of Ag, Au, Ni or an alloy containing one of these metals whereas the main surface of the die pad is made of Cu, an FeNi alloy or Fe. (Appendix 6) A semiconductor device comprising: a die pad having a main surface; a semiconductor chip having a rear surface; and an electrically conductive joining material between the main surface of the die pad and the rear surface of the semiconductor chip, providing a junction between the die pad and the semiconductor chip; wherein the rear surface of the semiconductor chip and the electrically conductive joining material share a larger junction area between the two than do the main surface of the die pad and the electrically conductive joining material. (Appendix 7) The semiconductor device according to Appendix 6, wherein the electrically conductive joining material is provided by a solder. (Appendix 8) The semiconductor device according to Appendix 6, wherein the rear surface of the semiconductor chip has a higher wettability to the electrically conductive joining paste than the main surface of the die pad. (Appendix 9) The semiconductor device according to Appendix 8, wherein the rear surface of the semiconductor chip is made of Ag, Au, Ni or an alloy containing one of these metals whereas the main surface of the die pad is made of Cu, an FeNi alloy or Fe. (Appendix 10) A semiconductor device comprising: die pads each having a main surface and a rear surface facing in opposite directions; a plurality of semiconductor chips mounted on the main surface of one of the die pads; and an electrically conductive joining material between the main surface of the die pad and a rear surface of each semiconductor chip, providing a junction between the die pad and each of the semiconductor chips; wherein the rear surface of each semiconductor chip shares with its corresponding electrically conductive joining material a larger junction area between the two than does the main surface of said die pad share with said electrically conductive joining material formed for said semiconductor chip. (Appendix 11) The semiconductor device according to Appendix 9, wherein the semiconductor chip includes a plurality of output transistors and a controlling semiconductor chip therefor, the above-described relationship between two junction areas being true in the plurality of output transistors. (Appendix 12) The semiconductor device according to Appendix 10, further comprising: a plurality of leads each for an output from one of the output transistors; and a plurality of wires each connecting one of the output transistors with a corresponding one of the leads; the wire being made of aluminum.

LEGEND

101A-101E, 102A-102C semiconductor device; 1 first electrode portion; 11 die pad; 111 main surface; 111 die pad main surface; 112 die pad rear surface; 113 press mark; 12 bonding region; 13 wire bonding region; 131 (additional) press mark; 14 lead; 2 second electrode portion; 23 wire bonding portion; 24 lead; 3 third electrode portion; 31 control die pad; 32 lead; 300 lead frame; 41 semiconductor chip; 411 electrode; 412 rear surface; 413 rear surface electrode; 42 semiconductor chip; 43 passive component chip; 6 heat releasing layer; 61 heat releasing layer main surface; 611 groove; 62 heat releasing layer rear surface; 631 first side surface; 632 intermediate surface; 633 second side surface; 634 first angled region; 645 second angled region; 65 metal layer; 66 junction layer; 69 junction layer; 7 sealing resin portion; 71 resin main surface; 72 resin bottom surface; 73 resin side surface; 75 recess; 751 recess bottom surface; 752 recess side surface; 753 recess groove; 754 recess first side surface; 755 recess second side surface; 756 recess support surface; 8 wire; 81 first bonding portion; 82 second bonding portion; 85 bonding apparatus; 801 packaging structure; 807 substrate; 808 heat releasing member; 809 hole; 810 solder layer; 810 solder layer; 831 pressing piece; 832 (additional) pressing pieces; 851 capillary; 852 guide; 853 cutter; 854 base; 855 arm; 856 wire reel; 860 jig; 861 support surface; 862 support surface; 881 metal mold; 991 solder (electrically conductive joining material); 991 junction layer; 991' solder paste (electrically conductive joining paste); 992 mask; 993 opening

The invention claimed is:

1. A method for making a semiconductor device, the method comprising:
   an application step of applying an electrically conductive joining paste on a main surface of a die pad;
   a placement step of bringing a rear surface of a semiconductor chip into contact with the applied joining paste in a manner such that the entirety of the joining paste is contained in an outline of the rear surface of the semiconductor chip as viewed in a direction in which the main surface faces; and
   a joining step of softening and then hardening the joining paste to form an electrically conductive joining member, wherein in the application step, the main surface of the die pad is covered by a mask formed with an opening, and then the opening is filled with the joining paste.

2. The method according to claim 1, wherein the joining paste is a solder paste.

3. The method according to claim 1, wherein the rear surface of the semiconductor chip has a higher wettability to the joining paste than the main surface of the die pad.

4. A method for making a semiconductor device, the method comprising:
- an application step of applying an electrically conductive joining paste on a main surface of a die pad;
- a placement step of bringing a rear surface of a semiconductor chip into contact with the applied joining paste in a manner such that the entirety of the joining paste is contained in an outline of the rear surface of the semiconductor chip as viewed in a direction in which the main surface faces; and
- a joining step of softening and then hardening the joining paste to form an electrically conductive joining member,
- wherein the rear surface of the semiconductor chip is made of one of Ag, Au, Ni and an alloy that contains one of Ag, Au and Ni, and the main surface of the die pad is made of one of Cu, an Fe-Ni alloy and Fe.

5. A semiconductor device comprising:
- a die pad having a main surface;
- a semiconductor chip having a rear surface; and
- an electrically conductive joining member disposed between the main surface of the die pad and the rear surface of the semiconductor chip for bonding the die pad and the semiconductor chip to each other,
- wherein a junction area between the rear surface of the semiconductor chip and the joining member is greater than a junction area between the main surface of the die pad and the joining member,
- wherein the rear surface of the semiconductor chip is made of one of Ag, Au, Ni and an alloy that contains one of Ag, Au and Ni, and the main surface of the die pad is made of one of Cu, an Fe-Ni alloy and Fe.

6. The semiconductor device according to claim 5, wherein the joining member is made of solder.

7. The semiconductor device according to claim 5, wherein the rear surface of the semiconductor chip has a higher wettability to the joining member when in a molten state than the main surface of the die pad.

* * * * *